United States Patent
Kim et al.

(10) Patent No.: US 9,786,598 B2
(45) Date of Patent: Oct. 10, 2017

(54) SEMICONDUCTOR DEVICE WITH AIR GAPS AND METHOD FOR FABRICATING THE SAME

(71) Applicant: SK hynix Inc., Gyeonggi-do (KR)

(72) Inventors: Eun-Jeong Kim, Gyeonggi-do (KR); Jin-Yul Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/567,756

(22) Filed: Dec. 11, 2014

(65) Prior Publication Data
US 2016/0027727 A1    Jan. 28, 2016

(30) Foreign Application Priority Data
Jul. 25, 2014   (KR) .................. 10-2014-0095041

(51) Int. Cl.
| | | |
|---|---|---|
| *H01L 27/108* | (2006.01) | |
| *H01L 23/528* | (2006.01) | |
| *H01L 21/764* | (2006.01) | |
| *H01L 23/532* | (2006.01) | |
| *H01L 23/535* | (2006.01) | |
| *H01L 23/522* | (2006.01) | |

(52) U.S. Cl.
CPC .......... *H01L 23/528* (2013.01); *H01L 21/764* (2013.01); *H01L 23/5222* (2013.01); *H01L 23/535* (2013.01); *H01L 23/5329* (2013.01); *H01L 27/10814* (2013.01); *H01L 27/10823* (2013.01); *H01L 27/10852* (2013.01); *H01L 27/10876* (2013.01); *H01L 2924/0002* (2013.01)

(58) Field of Classification Search
CPC ................... H01L 27/10814; H01L 21/764
See application file for complete search history.

(56) References Cited

U.S. PATENT DOCUMENTS

| | | | |
|---|---|---|---|
| 8,198,189 B2* | 6/2012 | Kim | H01L 21/7682 |
| | | | 438/619 |
| 2013/0015518 A1* | 1/2013 | Sato | H01L 21/28273 |
| | | | 257/321 |
| 2013/0292847 A1* | 11/2013 | Choi | H01L 23/498 |
| | | | 257/774 |
| 2015/0214291 A1* | 7/2015 | Park | H01L 24/02 |
| | | | 257/503 |

FOREIGN PATENT DOCUMENTS

KR        1020150053020        5/2015

* cited by examiner

*Primary Examiner* — Stephen Bradley
(74) *Attorney, Agent, or Firm* — I P & T Group LLP

(57) ABSTRACT

A semiconductor device includes: a first plug; a bit line which is in contact with the first plug and over the first plug and extended in one direction; a second plug including a first part adjacent to the bit line and a second part adjacent to the first plug; a double air gap which is disposed between the first part of the second plug and the bit line and includes a first air gap surrounding the first part of the second plug and a second air gap parallel to sidewalls of the bit line; and a capping layer suitable for capping the first and second air gaps.

17 Claims, 42 Drawing Sheets

SEMICONDUCTOR DEVICE WITH AIR GAPS AND METHOD FOR FABRICATING THE SAME

CROSS-REFERENCE TO RELATED APPLICATIONS

The present application claims priority of Korean Patent Application No. 10-2014-0095041, filed on Jul. 25, 2014, which is herein incorporated by reference in its entirety.

BACKGROUND

1. Field

Exemplary embodiments relate to a semiconductor device, and more particularly, to a semiconductor device with air gaps and a method for fabricating the semiconductor device.

2. Description of the Related Art

Semiconductor devices generally include dielectric materials formed between neighboring conductive structures. As the degree of integration of semiconductor devices is increased, the distance between conductive structures becomes shorter, increasing parasitic capacitance. The increase in parasitic capacitance may deteriorate performance of the semiconductor devices.

In order to reduce parasitic capacitance, a method for lowering a dielectric constant of dielectric materials may be used. However, the method also has limitations in reducing parasitic capacitance because the dielectric materials have high dielectric constant values.

SUMMARY

Various embodiments are directed to a semiconductor device capable of reducing parasitic capacitance between neighboring conductive structures and a method for fabricating the semiconductor device.

In accordance with an embodiment, a semiconductor device includes: a first plug, a bit line coupled to the first plug, provided over the first plug, and extending in one direction; a second plug including a first part adjacent to the bit line and a second part adjacent to the first plug; a double air gap disposed between the first part of the second plug and the bit line and including a first air gap and a second air gap, wherein the first air gap surrounds the first part of the second plug and the second air gap extends in parallel to the bit line; and a capping layer capping the first air gap and second air gap. The semiconductor device further includes: a third air gap and a fourth air gap which are disposed between the second part of the second plug and the first plug, wherein the third air gap is vertically coupled with the second air gap, and the fourth air gap is vertically coupled with the first air gap. The semiconductor device further includes: a third air gap which is disposed between the second part of the second plug and the first plug, wherein the third air gap is vertically coupled with the second air gap. The second air gap is included in a dielectric spacer, and wherein the dielectric spacer extends in parallel to the bit line. The dielectric spacer includes a first spacer and a second spacer, and wherein the second air gap is disposed between the first spacer and the second spacer. Each of the first and the second spacers includes silicon nitride.

In accordance with another embodiment, a semiconductor device includes: a substrate including a first region and a second region; a first plug which is coupled to the first region; a bit line provided over the first plug and coupled to the first plug; a second plug including a first part adjacent to the bit line and a second part adjacent to the first plug, wherein the second plug is coupled with the second region; a first air gap and a second air gap which are disposed between the first part of the second plug and the bit line; a third air gap which is disposed between the second part of the second plug and the first plug; a capping layer capping upper portions of the first and second air gaps; a third plug provided over the second plug; and a memory element provided over the third plug. The first air gap is in a ring shape and surrounds the first part of the second plug, and the second air gap is in a line shape and extends in parallel to the bit line. The third air gap extends from the second air gap to form a continuum. The semiconductor device further includes: a fourth air gap which is disposed between the second part of the second plug and the third air gap, wherein the third air gap is vertically coupled with the second air gap, and the fourth air gap is vertically coupled with the first air gap. The semiconductor device further includes: a dielectric spacer which is in parallel to the bit line and extends from over a sidewall of the bit line to over a sidewall of the first plug, wherein the second air gap and the third air gap are included in the dielectric spacer. The dielectric spacer includes a first spacer and a second spacer, and the second air gap and the third air gap are disposed between the first spacer and the second spacer. Each of the first and the second spacers includes silicon nitride. The semiconductor further include: an inter-layer dielectric layer having a first opening exposing the first region of the substrate, the first plug is disposed in the first opening and spaced apart from a sidewall of the first opening by a gap. The semiconductor device further includes: a lining layer covering the sidewall and a bottom surface of the gap; a pillar spaced apart from the lining layer and extending from between the first and the second air gaps to the center of the gap; a first spacer extending in parallel to the bit line and coupled with the lining layer; and a second spacer extending in parallel to the first spacer and coupled with the pillar, wherein the second air gap is located between the first and the second spacers. Each of the lining layer, the pillar, the first spacer, and the second spacer includes silicon nitride. The semiconductor device further includes: a plug isolation layer provided over the inter-layer dielectric layer, and a second opening passing through the plug isolation layer and the inter-layer dielectric layer and having a second opening, wherein the second opening exposes the second region, and wherein the second plug is disposed in the second opening. The semiconductor device further includes: a buried word line buried in the substrate and extending in a direction crossing the bit line; and a first impurity region and a second impurity region formed in the substrate and adjacent to first and second sides of the buried word line, respectively, wherein the first impurity region is formed in the first region, and the second impurity region is formed in the second region. The capping layer includes silicon oxide. Each of the first region and the second region has a recessed surface.

In accordance with another embodiment, a method for fabricating a semiconductor device includes: preparing a substrate including a first region and a second region; forming a first plug coupled to the first region and forming a bit line over the first plug; forming a second plug including a first part and a second part, wherein the first part is adjacent to the bit line, wherein the second part is coupled to the second surface and is disposed adjacent to the first plug; forming a dielectric spacer including a first sacrificial spacer and a second sacrificial spacer which are disposed between the bit line and the second plug, wherein the dielectric spacer is formed prior to the forming of the second plug; and forming a first air gap and a second air gap between the bit line and the second plug by removing the second sacrificial spacer and the first sacrificial spacer. The method may further include: forming a capping layer capping the first and second air gaps after the forming of the first and second air gaps; and forming a third plug over the second plug. The forming of the first and second air gaps includes: forming the first air gap surrounding the first part of the second plug by removing the second sacrificial spacer; forming a first capping layer capping the first air gap; forming a third plug over the second plug; forming the second air gap extending in parallel to the bit line by removing the first sacrificial spacer; and forming a second capping layer capping the second air gap. The forming of the first and second air gaps, the first air gap surrounds the first part of the second plug, and the second air gap is formed linearly and extends in parallel to the bit line. The first sacrificial spacer includes silicon oxide, and wherein the second sacrificial spacer includes titanium nitride. The dielectric spacer includes: a first spacer extending from over a sidewall of the first plug to over a sidewall of the bit line, the first sacrificial spacer formed over the first spacer, a second spacer formed over the first sacrificial spacer, and the second sacrificial spacer formed over the second spacer and surrounding the first part of the second plug. Each of the first spacer, the first sacrificial spacer, and the second spacer extends in parallel to the bit line and is disposed between the first plug and the second plug, and wherein the second sacrificial spacer is disposed between the second spacer and the second plug and formed in a ring shape surrounding the first part of the second plug. The first spacer includes a first extension part disposed over a sidewall of the first plug and a second extension part disposed over a sidewall of the second part of the second plug. The method may further include: forming a third air gap and a fourth air gap which are disposed between the second part of the second plug and the first plug by removing the first sacrificial spacer. The third air gap extends from the second air gap, wherein the fourth air gap extends from the third air gap, and wherein the fourth air gap is coupled with the first air gap. The first spacer includes a first extension part disposed over a sidewall of the first plug and a second extension part disposed over a sidewall of the second part of the second plug, and wherein the first sacrificial spacer extends over the first extension part of the first spacer. The method may further include: forming a third air gap disposed between the second part of the second plug and the first plug by removing the first sacrificial spacer. The third air gap extends from the second air gap, and wherein the first and the third air gaps are separated by the second spacer. The forming of the first plug and the bit line includes: forming an inter-layer dielectric layer over the substrate; forming a first opening exposing the first region by etching the inter-layer dielectric layer; recessing the exposed first region; forming a preliminary first plug filling the first opening; forming the bit line over the preliminary first plug; and forming the first plug and a gap on both sides of the first plug by etching the preliminary first plug with the same line width as the bit line. The forming of the dielectric spacer includes: forming a first spacer layer over a sidewall of the first plug and a sidewall of the bit line; forming a first sacrificial spacer layer over the first spacer layer; forming a second spacer layer filling the gap over the first sacrificial spacer layer; forming a second spacer, the first sacrificial spacer, and a first spacer by trimming the second spacer layer, the first sacrificial spacer layer, and the first spacer layer, respectively; forming a sacrificial-layer pattern, having a preliminary isolation part, over a sidewall of the second spacer; filling a plug isolation layer in the preliminary isolation part; forming a second opening by eliminating the sacrificial-layer pattern; forming a second sacrificial spacer layer over the structure including the second opening; and forming the second sacrificial spacer over a sidewall of the second opening by etching the second sacrificial spacer layer. The forming of the second plug includes: extending the second opening to expose the second region; forming a conductive layer filling the second opening; and forming the second plug partially filling the second opening by recessing the conductive layer. The method may further include: before the forming of the inter-layer dielectric layer, forming a gate trench by etching the substrate; forming a buried word line which is buried in the gate trench and extends in a direction crossing the bit line; forming a sealing layer, which fills the gate trench, over the buried word line; and forming a first impurity region and a second impurity region in the substrate of both sides of the buried word line, wherein the first region includes the first impurity region, and the second region includes the second impurity region. The method may further include forming a memory element over the third plug. The second plug includes silicon-containing material, and the third plug includes metal-containing material.

In accordance with another embodiment, a semiconductor device includes: a bit line provided at a first level; a second plug provided at the first level; and a first double air gap provided between the bit line and the second plug; wherein the first double air gap includes a first air gap, a second air gap, and a spacer, and wherein the first air gap and the second air gap are partitioned by the spacer. Each of the first air gap, the second air gap, and the spacer extends in parallel to the bit line. The second plug is a storage node contact plug. The semiconductor device further include: a first plug provided at a second level lower than the first level and coupled to the bit line, and a second double air gap extending vertically from the first double air gap down to the second level, wherein the second plug extends down to the second level, and wherein the second double air gap extends between the first plug and the second plug at the second level. The second plug at the second level extends laterally between the first double air gap and an active region of a substrate, wherein the second double air gap extends vertically to an isolation region of the substrate without an interruption by the second plug. The first plug is coupled to a first impurity region in the active region, and wherein the second plug is coupled to a second impurity region in the active region.

DETAILED DESCRIPTION

Figure 1:
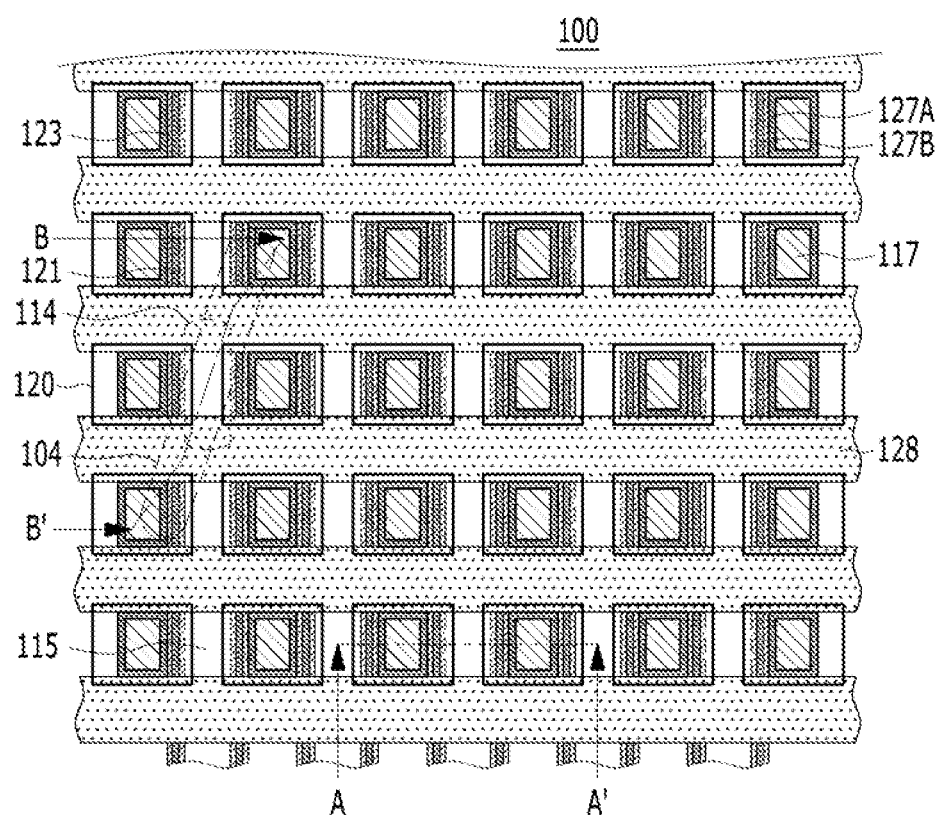
FIG. 1 is a plan view illustrating a semiconductor device in accordance with a first embodiment.

Various examples and implementations are described below in detail with reference to the accompanying drawings.

The drawings may not necessarily be to scale. Thus, in some instances, proportions of structures in the drawings may have been exaggerated to clearly illustrate certain features of the described examples or implementations. In presenting two or more layers in a multi-layer structure, embodiments are not limited to the relative positioning relationship of such layers or the sequence of arranging the layers which are shown in a particular drawing or description. Accordingly, a different relative positioning relationship or sequence of arranging the layers may be possible. Throughout the disclosure, like reference numerals refer to like parts in the various figures and embodiments. In addition, a described or illustrated example of a multi-layer structure may not reflect all layers present in that particular multilayer structure (e.g., one or more additional layers may be present between the illustrated layers). As a specific example, when a first layer is referred to as being "on" or "over" a second layer or "on" or "over" a substrate, the first layer may be either directly formed on the second layer or the substrate or indirectly formed over the second layer or the substrate in such a manner that one or more other intermediate layers may exist between the first layer and the second layer or the substrate.

Furthermore, 'connected/coupled' represents that components are directly coupled with each other or indirectly coupled through another component. In this specification, a singular form may include a plural form as long as it is not specifically mentioned otherwise. Furthermore, 'include/comprise' or 'including/comprising' used in the specification represents that one or more components, steps, operations, and elements may exist or be added.

FIG. 1 is a plan view illustrating a semiconductor device in accordance with a first embodiment. FIG. 1 shows a memory cell array in a semiconductor device 100.

Figure 2A:
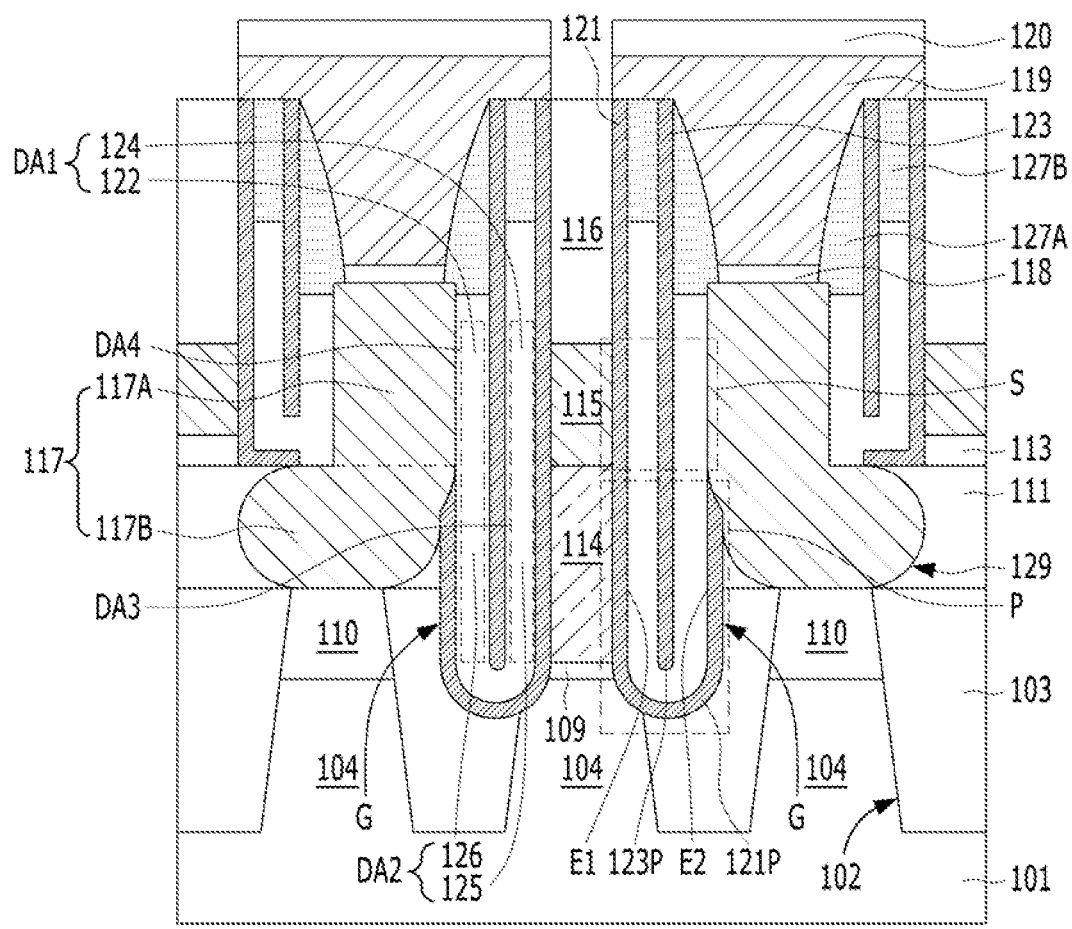
FIG. 2A is a cross-sectional view illustrating the semiconductor device taken along an A-A' line shown in FIG. 1.
Figure 2B:
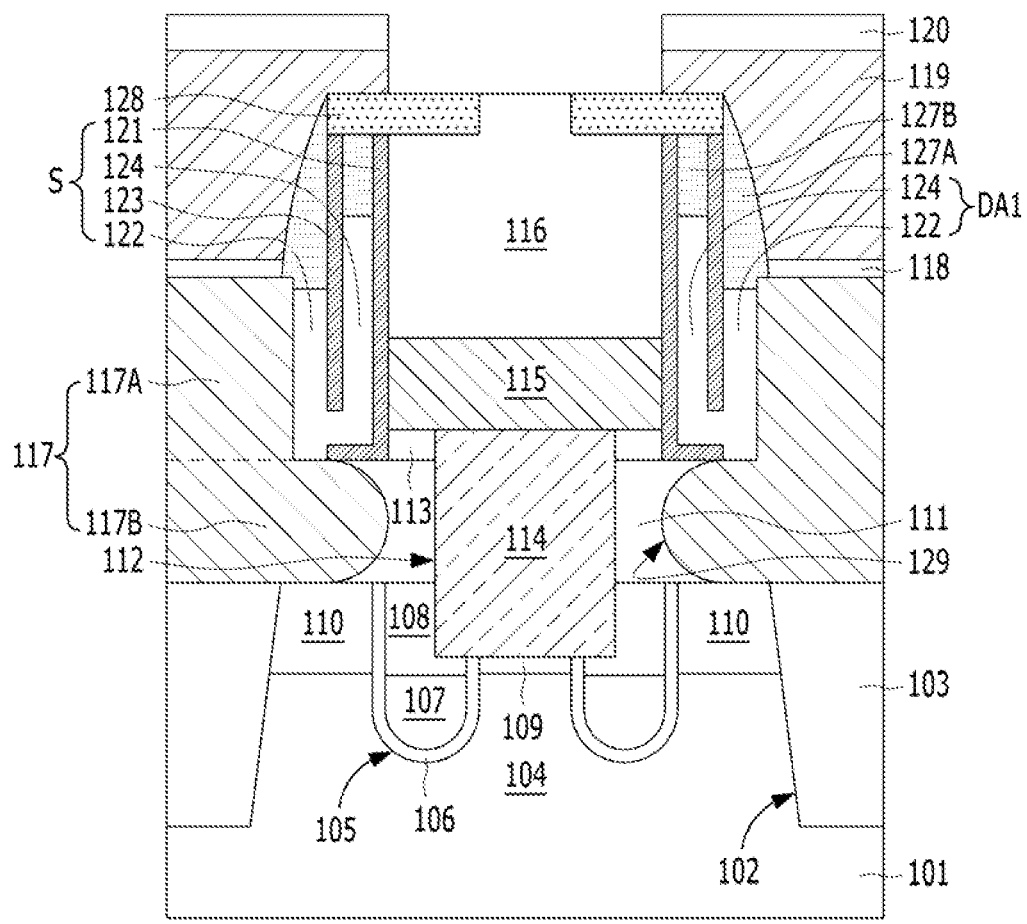
FIG. 2B is a cross-sectional view illustrating the semiconductor device taken along a B-B' line shown in FIG. 1.
Figure 2C:
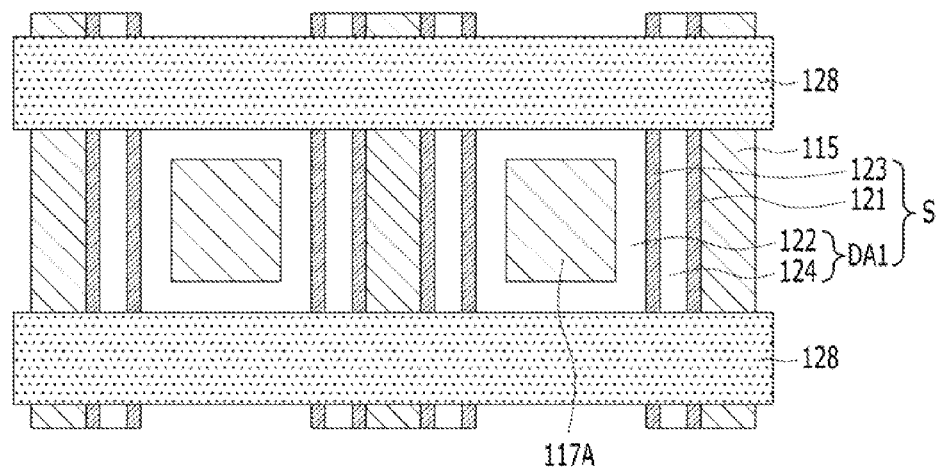
FIG. 2C is a plan view illustrating a first double air gap DA1.
Figure 2D:
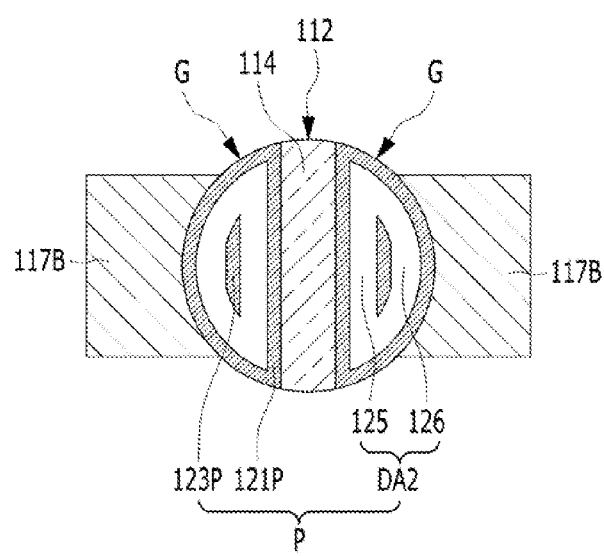
FIG. 2D is a plan view illustrating a second double air gap DA2.
Figure 2E:
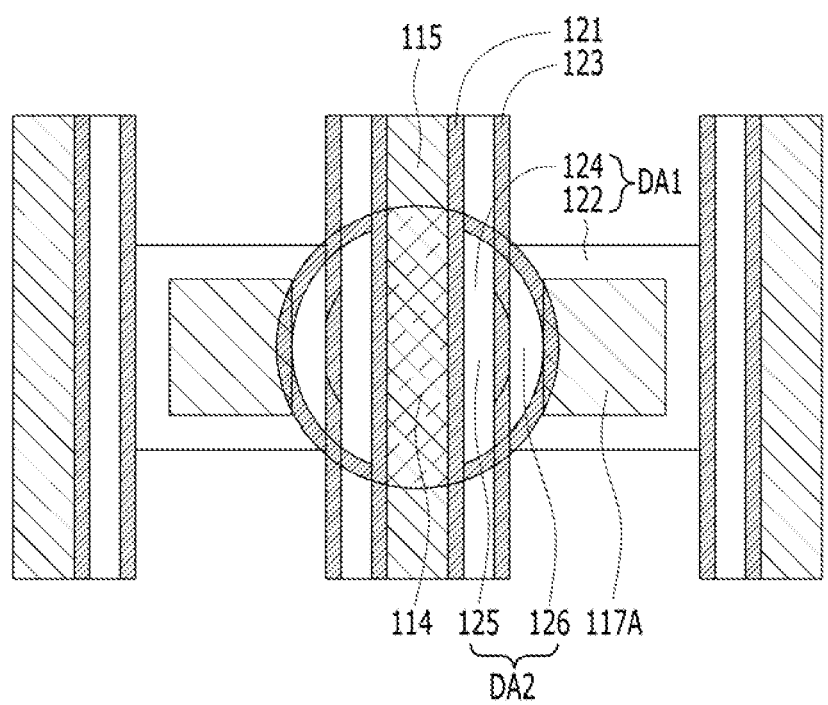
FIG. 2E is a plan view describing the coupling relationship between the first double air gap DA1 and the second double air gap DA2.

FIG. 2A is a cross-sectional view taken along the A-A' line shown in FIG. 1. FIG. 2B is a cross-sectional view taken along the B-B' line shown in FIG. 1. FIG. 2C is a plan view illustrating a first double air gap DA1. FIG. 2D is a plan view illustrating a second double air gap DA2. FIG. 2E is a plan view describing the coupling relationship between the first double air gap DA1 and the second double air gap DA2.

The semiconductor device 100 may include a plurality of buried word lines 107 and a plurality of bit lines 115. The buried word lines 107 may be formed in a substrate 101. The bit lines 115 may be formed over the substrate 101. The buried word lines 107 and the bit lines 115 may be arranged to cross with each other. A first plug 114 may be formed between each of the bit lines 115 and the substrate 101. A stacked structure of a second plug 117, an ohmic contact layer 118, and a third plug 119 may be formed between a memory element 120 and the substrate 101. The second plug 117 may extend to be disposed adjacent to the bit line 115 and the first plug 114 and coupled with the substrate 101. Put differently, the second plug 117 may extend downward from a sidewall of the bit line 115 through over a sidewall of the first plug 114 to the substrate 101. The second plug 117 may include a first part 117A adjacent to the bit line 115 (i.e., disposed over the sidewall of the bit line 115) and a second part 117B adjacent to the first plug 114 (i.e., disposed over the sidewall of the first plug 114). The second plug 117 may be disposed between the neighboring bit lines 115, and neighboring second plugs 117 may be isolated by a plug isolation layer 128. When viewed from above, the bit line 115 and the plug isolation layer 128 may cross with each other.

A spacer structure S including a first double air gap DA1 may be formed between the bit line 115 and the first part 117A of the second plug 117. The first double air gap DA1 may include a first air gap 122 and a second air gap 124. The spacer structure S may include a first spacer 121, a second spacer 123, the first air gap 122, and the second air gap 124.

A dielectric plug P including a second double air gap DA2 may be formed between the first plug 114 and the second part 117B of the second plug 117. The second double air gap DA2 may include a third air gap 125 and a fourth air gap 126. The dielectric plug P may include a lining layer 121P, a pillar 123P, the third air gap 125, and the fourth air gap 126.

The semiconductor device 100 is described in detail below.

An isolation layer 103 is formed in the substrate 101. The isolation layer 103 is formed in an isolation trench 102. A plurality of active regions 104 are defined by the isolation layer 103.

A gate trench 105 is formed to extend across the active region 104 and the isolation layer 103. A gate dielectric layer 106 is formed on a surface of the gate trench 105. The buried word line 107 is formed to fill a portion of the gate trench 105 over the gate dielectric layer 106. A sealing layer 108 is formed over the buried word line 107. The sealing layer 108 may be formed at the same level as an upper surface of the substrate 101.

A first impurity region 109 and a second impurity region 110 may be formed in the active region 104. The first impurity region 109 and the second impurity region 110 may be isolated from each other by the gate trench 105. The first impurity region 109 and the second impurity region 110 may be referred to as a source region and a drain region, respectively. The buried word lines 107, the first impurity region 109, and the second impurity region 110 may be a buried gate-type transistor. The buried gate-type transistor employing, e.g., the buried word lines 107, may be advantageous in avoiding a short-channel effect. The first impurity region 109 and the second impurity region 110 may be doped with an N-type impurity or a P-type impurity. An upper surface of the first impurity region 109 may be formed at a level lower than an upper surface of the second impurity region 110. For example, the first impurity region 109 has a recessed upper surface.

The first plug 114 is formed over the substrate 101. The first plug 114 is coupled with the first impurity region 109.

The first plug 114 is disposed in a first opening 112. The first opening 112 is formed in an inter-layer dielectric layer 111. The inter-layer dielectric layer 111 is formed over the substrate 101. The first opening 112 is a contact hole to expose the first impurity region 109. The first plug 114 may be referred to as a bit line contact plug. A bottom of the first plug 114 may be formed at a level lower than the upper surface of the substrate 101. The first plug 114 may be formed of a polysilicon or a metal material. The first plug 114 may have a smaller width than a width of the first opening 112. Thus, a gap G is formed on both sides of the first plug 114. The gap G does not surround the first plug 114. Rather, the gap G is independently formed on both sides of the first plug 114. Thus, the gap G is shown in FIG. 2A but not shown in FIG. 2B. Consequently, one first plug 114 and a pair of gaps G are disposed inside the first opening 112, and the gaps G are separated by the first plug 114. The gap G may be disposed between the first plug 114 and the second part 117B of the second plug 117.

A bit line structure is formed over the first plug 114. The bit line structure includes the bit lines 115 and a bit line hard mask 116 over the bit lines 115. The bit line structure has a line shape extending in a direction crossing with the buried word lines 107. Each of the bit lines 115 is coupled with the first plug 114. As shown in the A-A' cross-section, the bit lines 115 and the first plug 114 may have the same line width. See FIG. 2A. Thus, the bit lines 115 may extend in one direction while covering the first plug 114. However, when shown from the B-B' cross-section, the bit lines 115 have a width larger than the first plug 114. See FIG. 2B. When shown from the B-B' cross-section, the bit lines 115 may further extend over an etch stop layer 113. The etch stop layer 113 may be formed between the inter-layer dielectric layer 111 and the bit lines 115 and be in a line shape. The etch stop layer 113 may have the same line width as that of the bit lines 115. Each of the bit lines 115 may include a metal material. The bit line hard mask 116 and the etch stop layer 113 may include a dielectric material. Each of the bit line hard mask 116 and the etch stop layer 113 may be formed of a silicon nitride.

The second plug 117 may be formed between the neighboring bit line structures. The second plug 117 is formed in a second opening 129. The second plug 117 may be coupled with the second impurity region 110. The second plug 117 may include the first part 117A and the second part 117B. The first part 117A may be disposed adjacent to the bit lines 115. The second part 117B may be disposed adjacent to the first plug 114. The second part 117B may have a bulb shape. Thus, a contact area with the second impurity region 110 may increase.

A dielectric spacer may be disposed between the bit lines 115 and the second plug 117 and between the first plug 114 and the second plug 117. The dielectric spacer may include the spacer structure S and the dielectric plug P.

The first spacer 121 and the second spacer 123 may extend in parallel to sidewalls of the bit line 115. The second air gap 124 may extend in parallel to the sidewalls of the bit line 115. The second air gap 124 may be a line-type air gap. The second air gap 124 may be formed between the first spacer 121 and the second spacer 123. The first air gap 122 may be formed to surround the first part 117A of the second plug 117. The first air gap 122 may be a surrounding-type air gap. The first double air gap DA1 formed of the first air gap 122 and the second air gap 124 may be formed between the bit lines 115 and the second plug 117. The first air gap 122 and the second air gap 124 may be disposed in a horizontal direction. The first air gap 122 and the second air gap 124 may be coupled with each other. The size of the second air gap 124 may be larger than the size of the first air gap 122.

The dielectric plug P may fill the gap G of the first opening 112. The dielectric plug P may be disposed between the first plug 114 and the second part 117B of the second plug 117. The dielectric plug P includes the lining layer 121P, the pillar 123P, the third air gap 125, and the fourth air gap 126. The lining layer 121P covers a bottom surface and sidewalls of the gap G. The pillar 123P may be disposed at the center of the gap G. The third air gap 125 and the fourth air gap 126 may be disposed on both sides of the pillar 123P, respectively. The second double air gap DA2 formed of the third air gap 125 and the fourth air gap 126 may be formed between the first plug 114 and the second plug 117. The third air gap 125 and the fourth air gap 126 may be disposed in a horizontal direction. The bottom portion of the third air gap 125 may be coupled with the bottom portion of the fourth air gap 126. Thus, the third air gap 125 and the fourth air gap 126 may be in a U shape and surround the bottom portion and sidewalls of the pillar 123P.

The spacer structure S may be coupled with the dielectric plug P. The first air gap 122 may be coupled with the fourth air gap 126, and the second air gap 124 may be coupled with the third air gap 125. Consequently, the first double air gap DA1 may be coupled with the second double air gap DA2.

The first spacer 121 and the lining layer 121P may be integrated. The first spacer 121 may include a first extension part E1 and a second extension part E2 which extend to the inside of the gap G. The first extension part E1 and the second extension part E2 may line the sidewalls and bottom surface of the gap G. The first extension part E1 may continuously extend to the second extension part E2. The first extension part E1 and the second extension part E2 may be referred to as the lining layer 121P. Each of the first spacer 121 and the lining layer 121P may be formed of a dielectric material. Each of the first spacer 121 and the lining layer 121P may include a silicon nitride.

The second spacer 123 and the pillar 123P may be integrated. The bottom portion of the second spacer 123 may be extended to the inside of the gap G and become the pillar 123P. Each of the second spacer 123 and the pillar 123P may be formed of a dielectric material. Each of the second spacer 123 and the pillar 123P may include a silicon nitride.

The first air gap 122 and the fourth air gap 126 may be disposed in a vertical direction, and the second air gap 124 and the third air gap 125 may be disposed in a vertical direction. The first air gap 122 and the fourth air gap 126 may form a fourth double air gap DA4. The second air gap 124 and the third air gap 125 may form a third double air gap DA3. The third double air gap DA3 and the fourth double air gap DA4 may be coupled with each other. The first double air gap DA1 is a double air gap where the first air gap 122 and the second air gap 124 are disposed in a horizontal direction. The second double air gap DA2 is a double air gap where the third air gap 125 and the fourth air gap 126 are disposed in a horizontal direction. The third double air gap DA3 is a double air gap where the second air gap 124 and the third air gap 125 are disposed in a vertical direction. The fourth double air gap DA4 is a double air gap where the first air gap 122 and the fourth air gap 126 are disposed in a vertical direction.

An upper portion of the first double air gap DA1 is capped by a first capping layer 127A and a second capping layer 127B. The first capping layer 127A caps the first air gap 122, and the second capping layer 127B caps the second air gap 124. Each of the first capping layer 127A and the second capping layer 127B may be formed of a dielectric material.

A portion of the plug isolation layer 128 may cover the bit line hard mask 116, the first spacer 121, the second spacer 123, and the second capping layer 127B.

The ohmic contact layer 118 and the third plug 119 may be stacked over the second plug 117. The second plug 117 may include polysilicon, and the third plug 119 may include tungsten. Therefore, the second plug 117 may be a silicon plug, and the third plug 119 may be a metal plug. The second plug 117 and the third plug 119 may be referred to as a Semi-Metal Plug (SMP). The ohmic contact layer 118 is formed between the second plug 117 and the third plug 119. The ohmic contact layer 118 may include metal silicide. Contact resistance may decrease by the ohmic contact layer 118. The third plug 119 has an extension block overlapping with the upper portion of the bit line structure. Consequently, an overlap margin of the memory element 120 may increase.

The memory element 120 may include a capacitor including a storage node. The storage node may be in a pillar shape. Although not illustrated, a dielectric layer and a plate node may be formed over the storage node. In another embodiment, the storage node may be in a cylinder shape. In another embodiment, diverse memory elements may be coupled over the third plug 119. When the memory element 120 includes the storage node, a stacked structure of the second plug 117, the ohmic contact layer 118, and the third plug 119 may be referred to as a storage node contact plug.

In accordance with the first embodiment, the semiconductor device 100 includes the buried word lines 107, the bit lines 115, and the memory element 120. The semiconductor device 100 may include a memory cell array. The substrate 101 and the bit lines 115 may be electrically connected to the first plug 114. The first plug 114 and the bit lines 115 are disposed adjacent to the stacked structure of the second plug 117, the ohmic contact layer 118, and the third plug 119.

As the first double air gap DA1 is formed between the second plug 117 and the bit lines 115, parasitic capacitance between the bit lines 115 and the second plug 117 may decrease.

As the second double air gap DA2 is formed between the first plug 114 and the second plug 117, parasitic capacitance between the first plug 114 and the second plug 117 may decrease.

As the third double air gap DA3 extends from the bit lines 115 to the first plug 114, parasitic capacitance may greatly decrease.

In a comparative example of the embodiment, a single air gap may be formed between the bit lines 115 and the second plug 117. In another comparative example, a single air gap may be formed between the first plug 114 and the second plug 117. In the embodiment, the first double air gap DA1, the second double air gap DA2, and the third double air gap DA3 are included. Since the size of a double air gap is larger than the size of a single air gap, an effect of decreasing parasitic capacitance is great. Consequently, the operation speed of the semiconductor device 100 employing the double air gap may be improved.

Figure 3A:
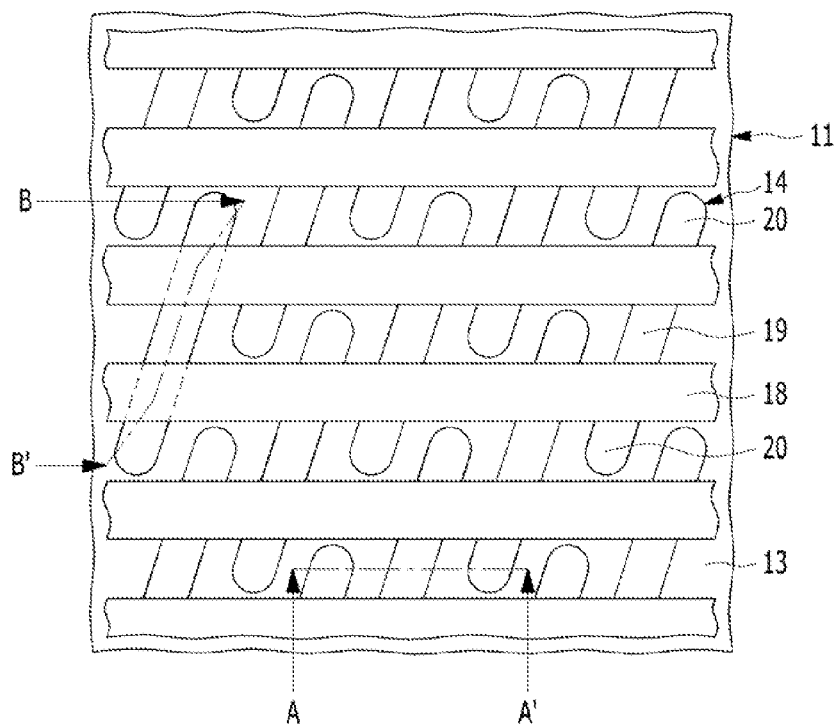
FIGS. 3A to 3P are plan views illustrating a method for fabricating a semiconductor device in accordance with a first embodiment.
Figure 3B:
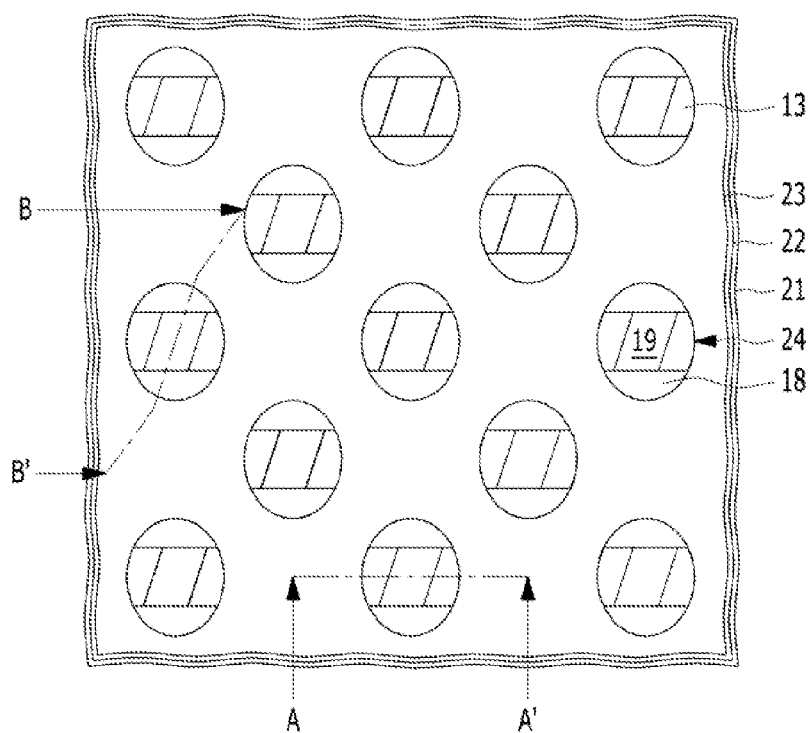
Figure 3C:
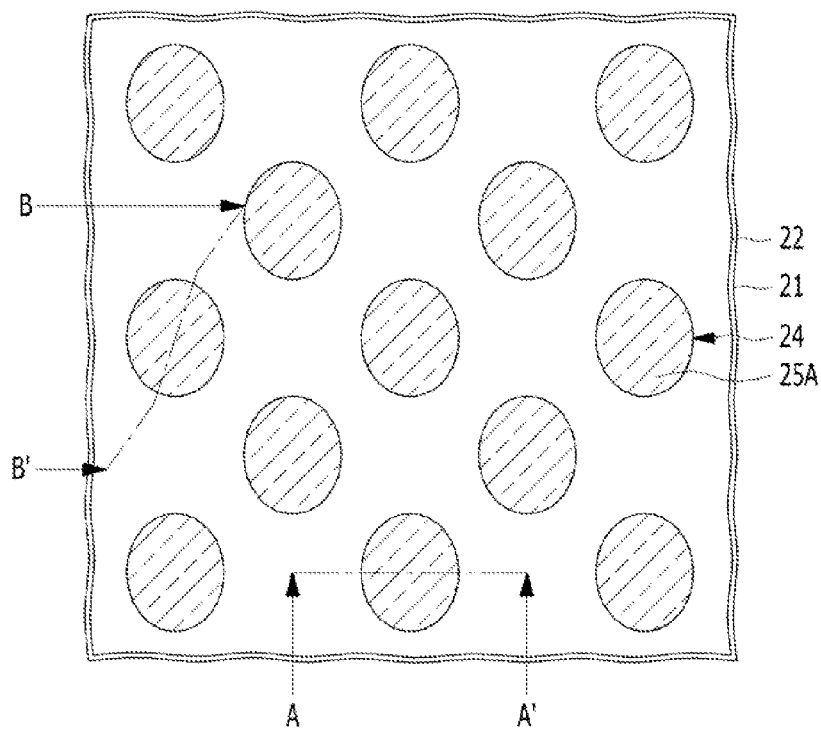
Figure 3D:
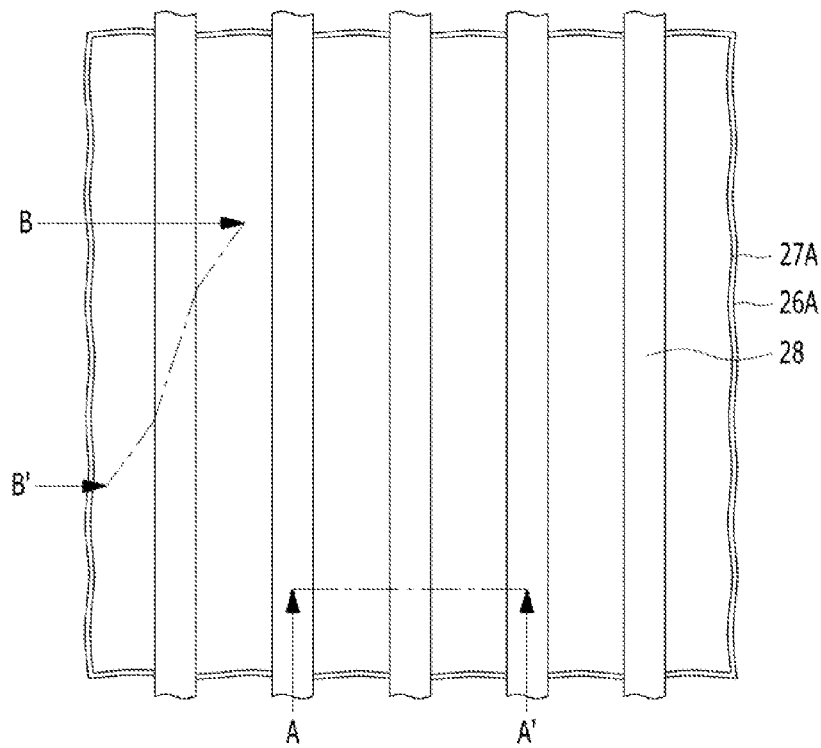
Figure 3E:
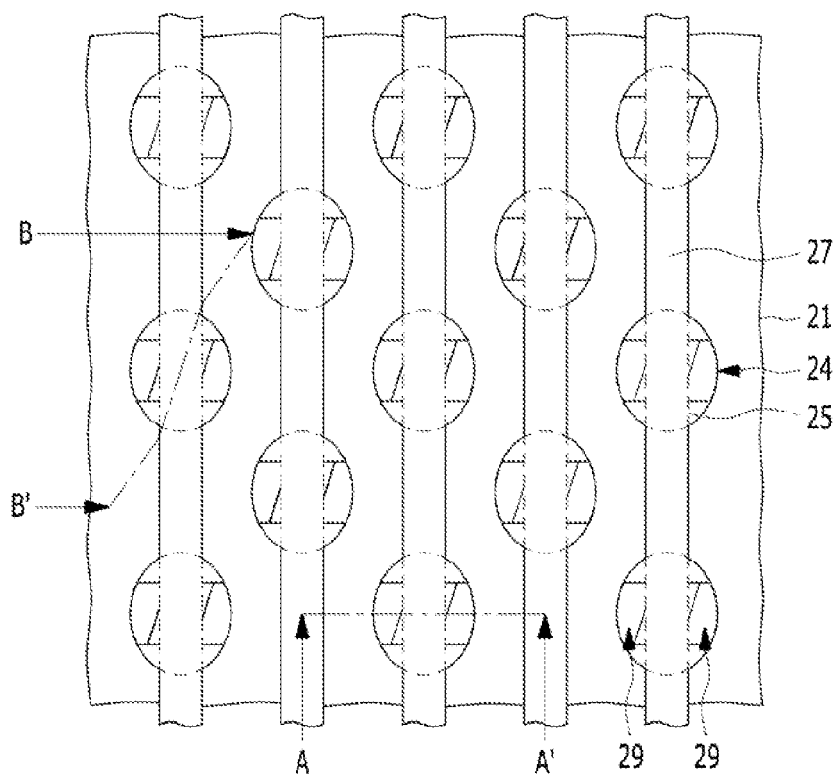
Figure 3F:
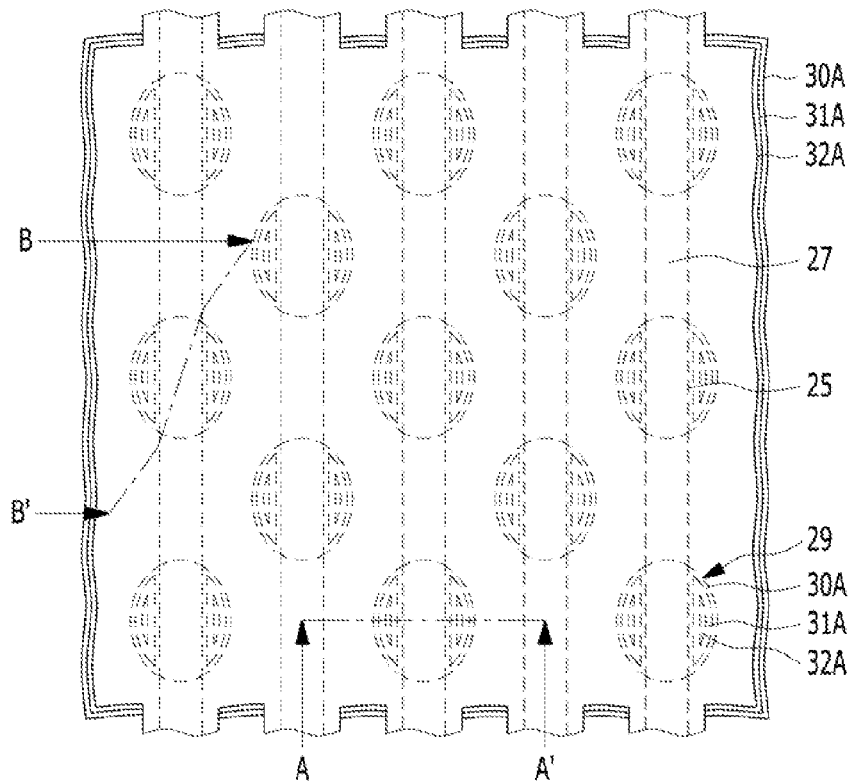
Figure 3G:
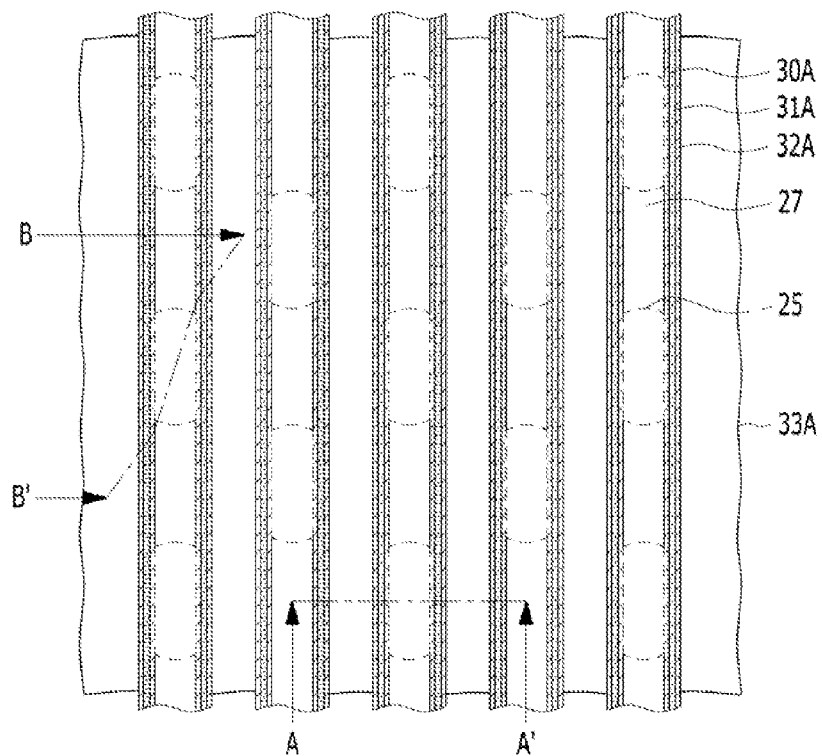
Figure 3H:
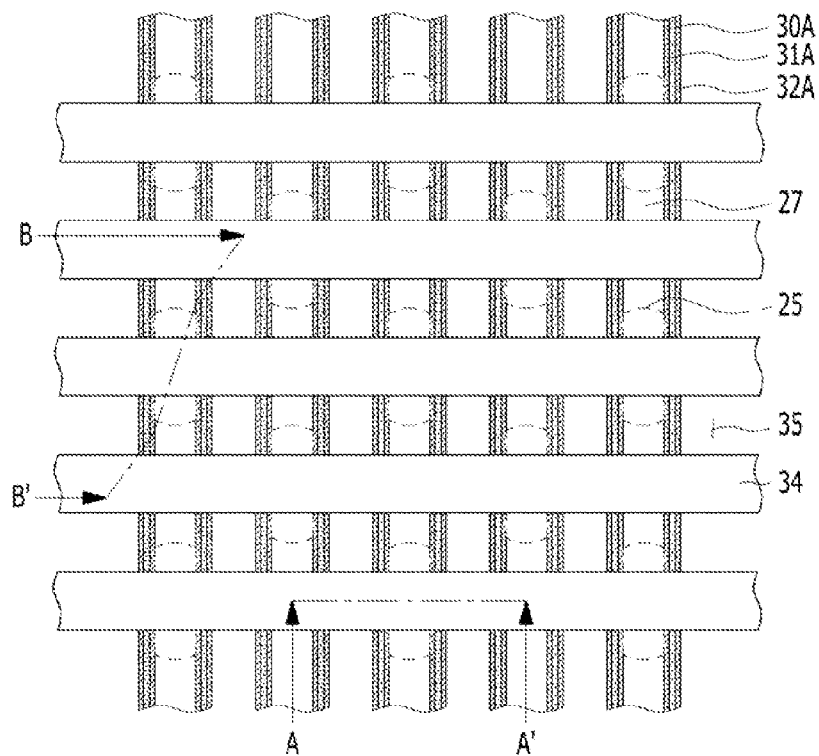
Figure 3I:
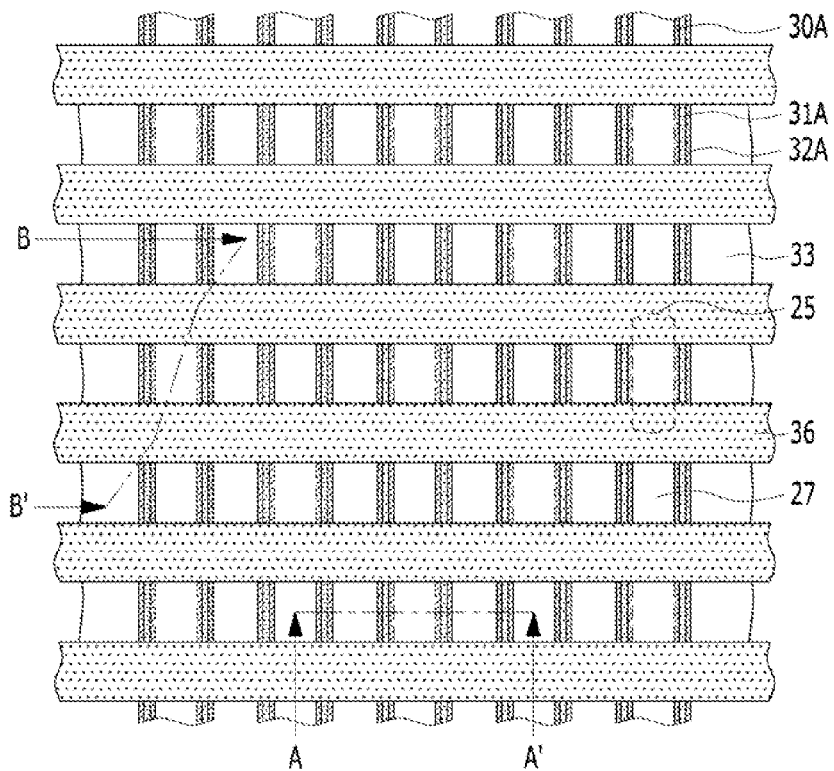
Figure 3J:
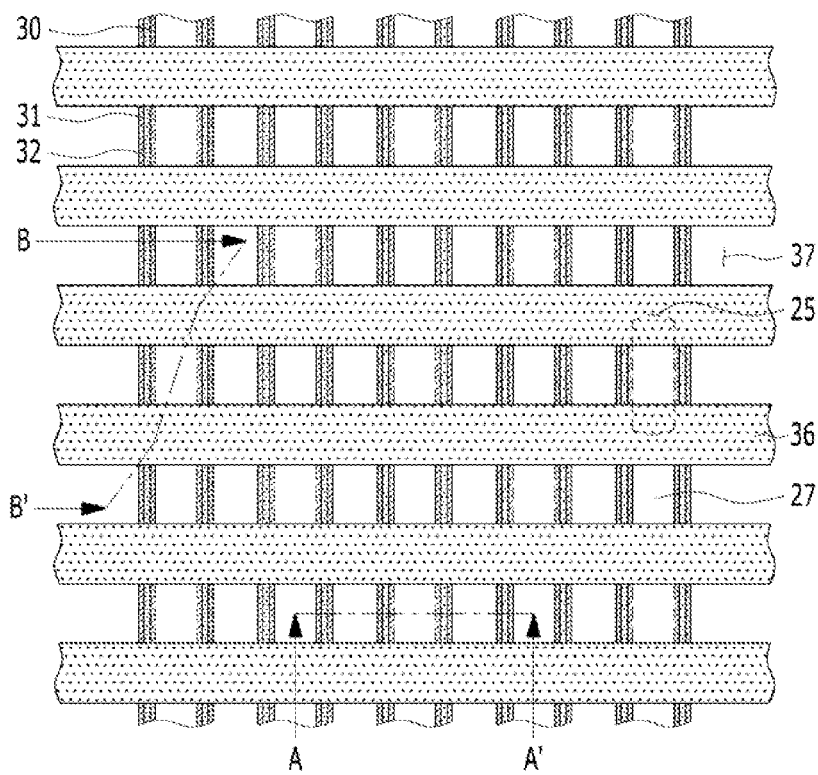
Figure 3K:
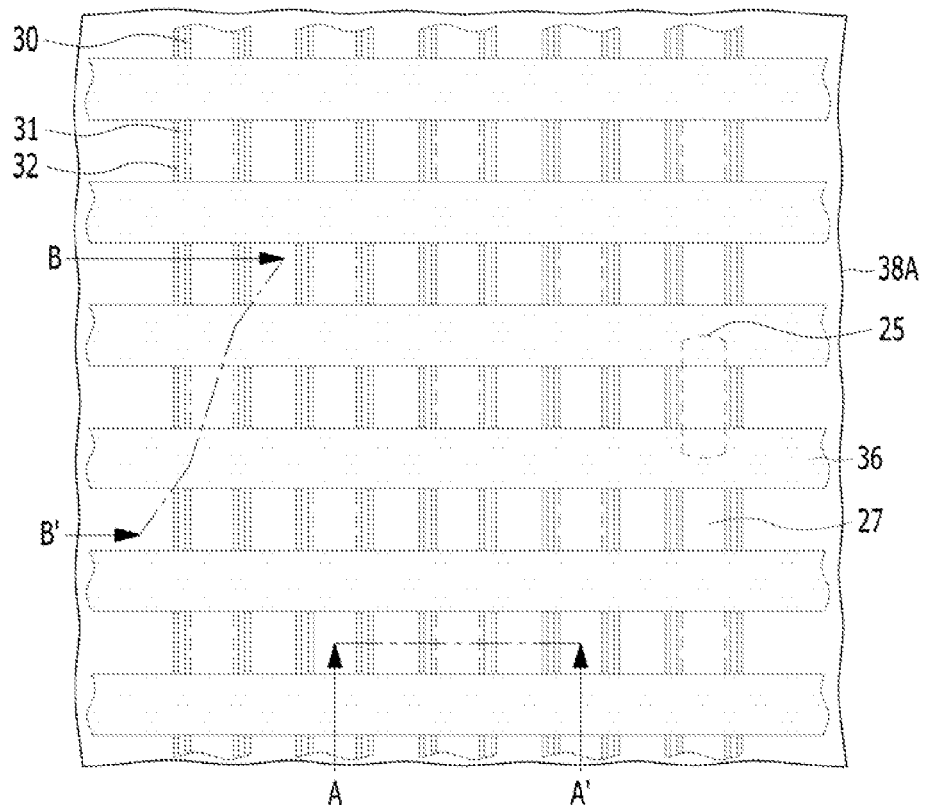
Figure 3L:
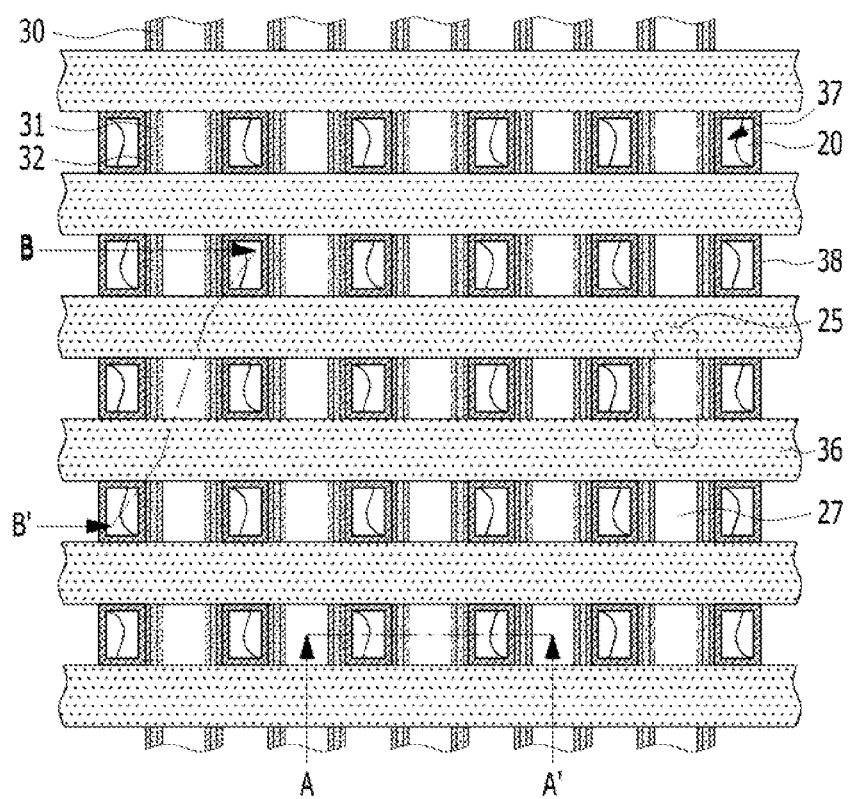
Figure 3M:
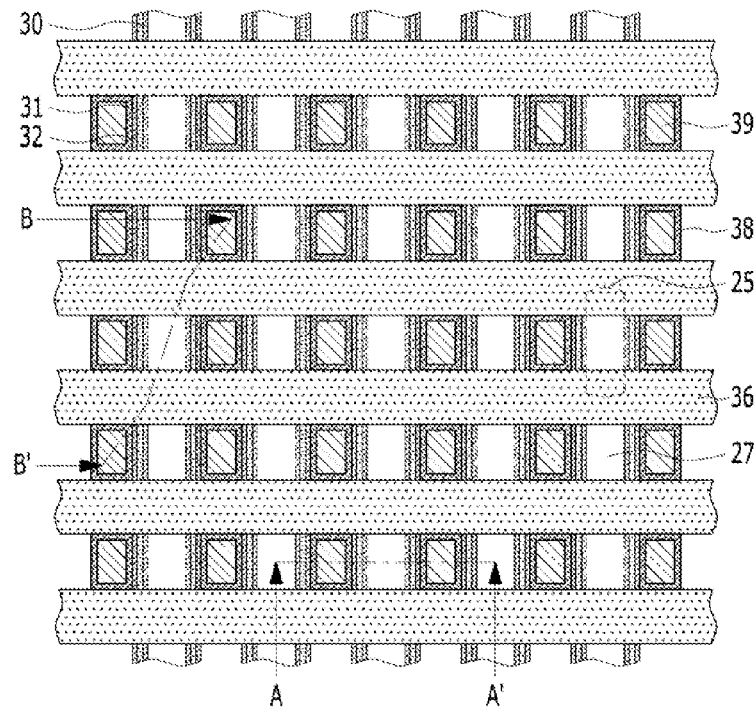
Figure 3N:
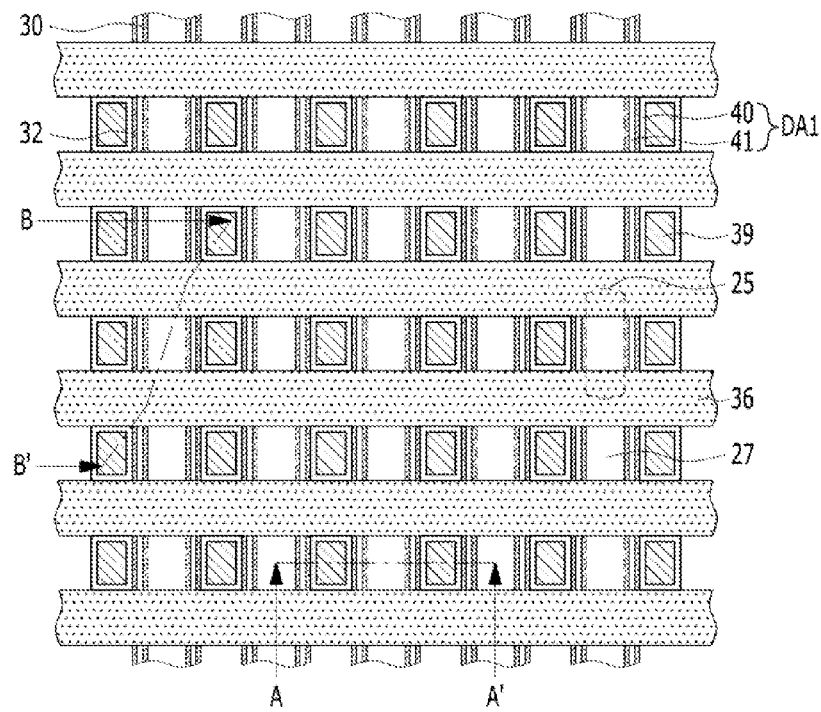
Figure 3O:
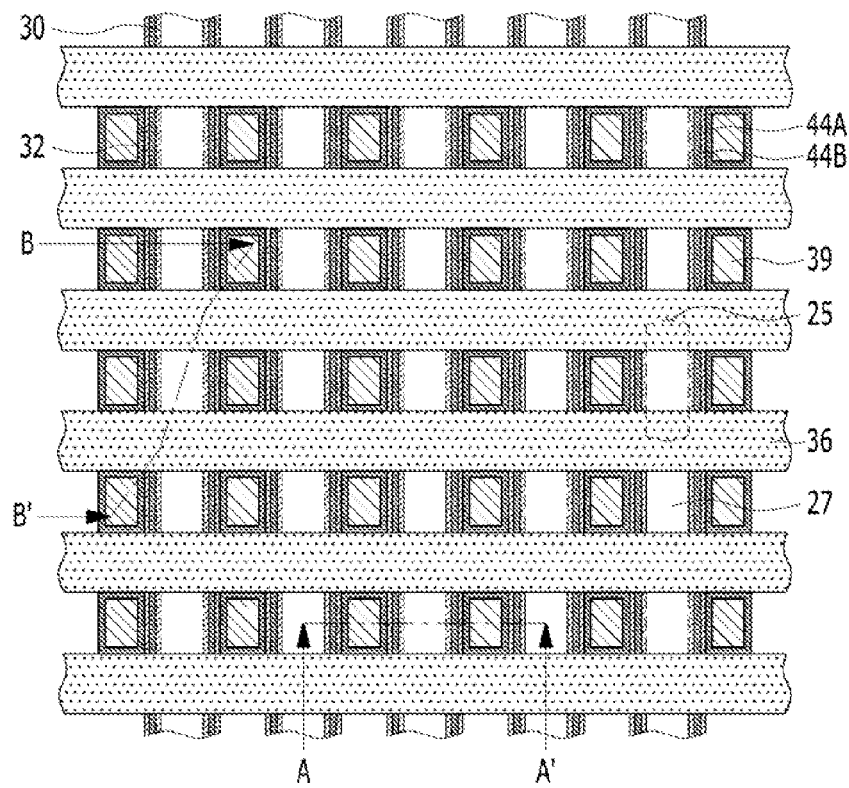
Figure 3P:
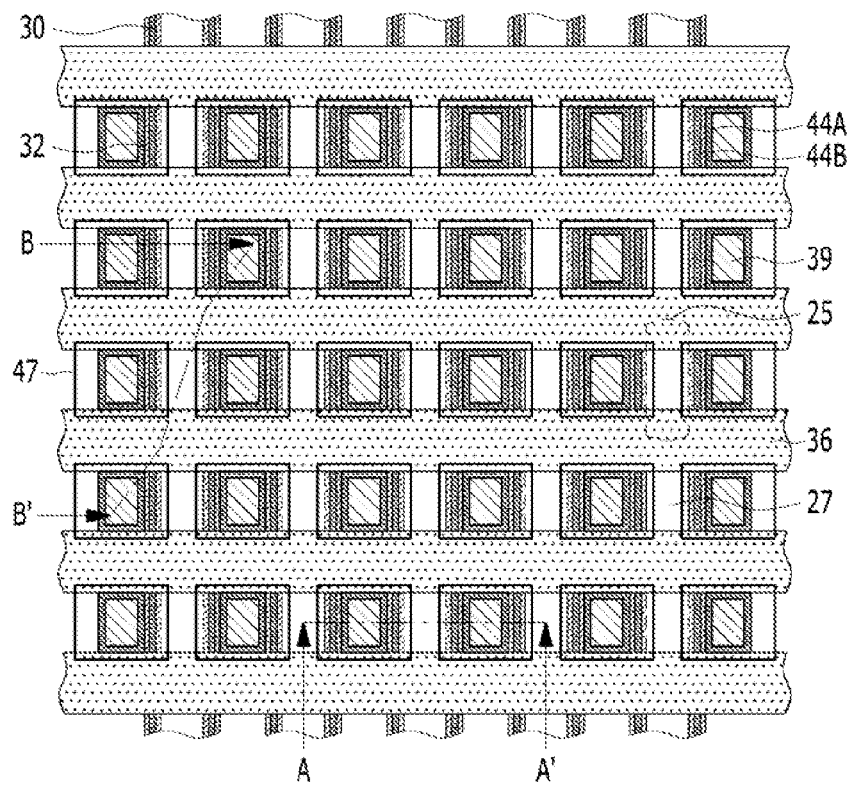
Figure 4A:
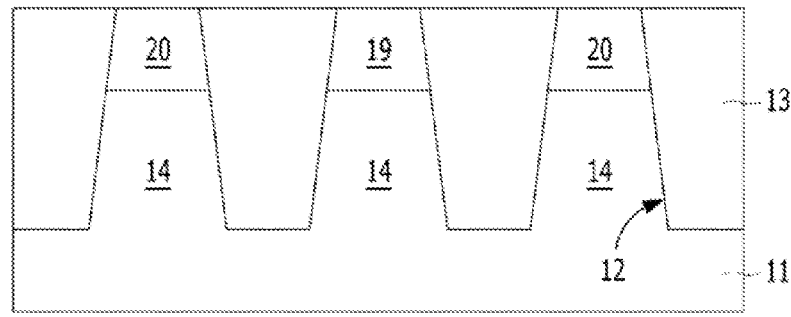
FIGS. 4A to 4P are cross-sectional views taken along an A-A' line shown in FIGS. 3A to 3P, respectively.
Figure 4P:
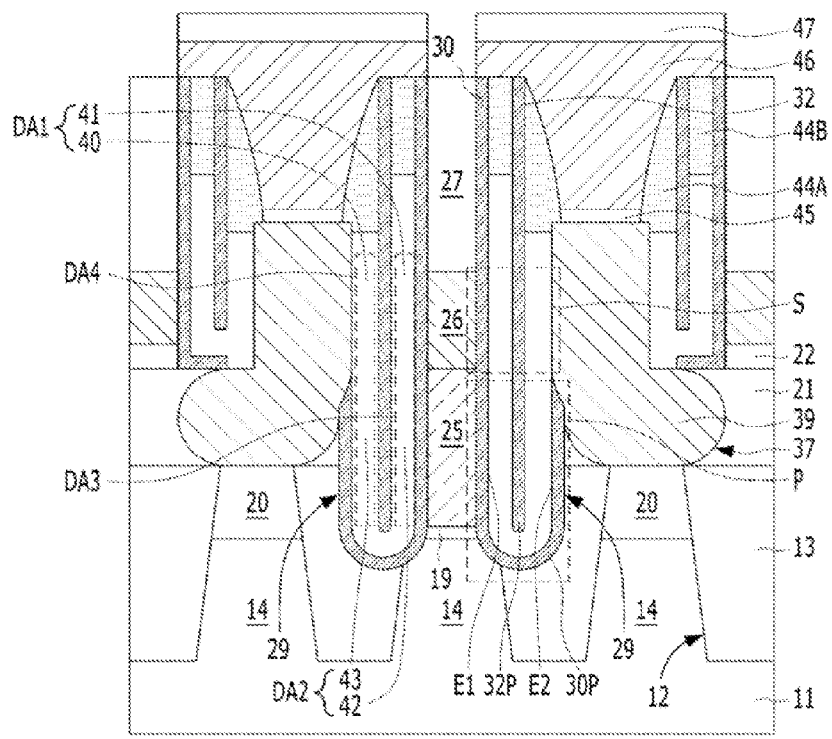
Figure 5A:
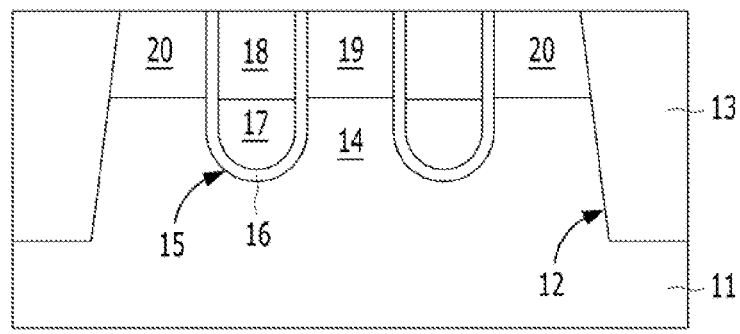
FIGS. 5A to 5P are cross-sectional views taken along a B-B' line shown in FIGS. 3A to 3P, respectively.

FIGS. 3A to 3P are plan views illustrating a method for fabricating a semiconductor device in accordance with the first embodiment. FIGS. 4A to 4P are cross-sectional views taken along an A-A' line shown in FIGS. 3A to 3P. FIGS. 5A to 5P are cross-sectional views taken along a B-B' line shown in FIGS. 3A to 3P.

Referring to FIGS. 3A, 4A and 5A, an isolation layer 13 is formed in a substrate 11. The substrate 11 includes a semiconductor material. The substrate 11 may include a silicon substrate, a silicon-germanium substrate, or a Silicon On Insulator (SOI) substrate. The isolation layer 13 may be formed through a Shallow Trench Isolation (STI) process. The isolation layer 13 is formed in an isolation trench 12. An active region may be defined by the isolation layer 13. A plurality of the active regions 14 may be isolated by the isolation layer 13. The isolation layer 13 may be formed of a silicon nitride, a silicon oxide, or a combination thereof.

A transistor including buried word lines 17 is formed. The buried word lines 17 are buried in the substrate 11. The buried word lines 17 are formed inside a gate trench 15. The gate trench 15 having a predetermined depth is formed in the substrate 11. The gate trench 15 has a shallower depth than the isolation trench 12. The gate trench 15 may be in a line shape and extend in one direction. The gate trench 15 may be formed by etching the active region 14 and the isolation trench 12. The gate trench 15 may extend across the active region 14 and the isolation layer 13. A portion of the gate trench 15 is formed in the active region 14, and the other portion of the gate trench 15 is formed in the isolation layer 13. In another embodiment, the portion of the gate trench 15 formed in the isolation layer 13 may be deeper than the portion of the gate trench 15 formed in the active region 14. The active region 14 may include a fin channel region (not shown).

A gate dielectric layer 16 may be formed on a surface of the gate trench 15. The gate dielectric layer 16 may be formed through a thermal oxidation process. In another embodiment, the gate dielectric layer 16 may be formed through a Chemical Vapor Deposition (CVD) process or an Atomic Layer Deposition (ALD) process. The gate dielectric layer 16 may be formed of a high-k material, an oxide, a nitride, an oxynitride or a combination thereof. The high-k material may be a dielectric material having a higher dielectric constant (high-k) than oxide or nitride. For example, the high-k material may include metal oxide such as hafnium oxide ($HfO_2$), hafnium silicate (HfSiO), or halnium silicate nitride (HfSiON).

The buried word lines 17 are formed over the gate dielectric layer 16. A sealing layer 18 is formed over the buried word lines 17. The buried word lines 17 may be formed to be recessed lower than a surface of the substrate 11. The buried word lines 17 may be formed by filling a metal-containing layer in the gate trench 15 and performing an etch-back process against the metal-containing layer. The metal-containing layer may include, as the major component, a metal such as titanium, tantalum, tungsten, etc. The metal-containing layer may include tantalum nitride (TaN), titanium nitride (TiN), tungsten nitride (WN), tungsten W, or a combination thereof. For example, the buried word lines 17 may be a two-layer structure such as TiN/W where tungsten W is stacked over titanium nitride (TiN). In another embodiment, the buried word lines 17 may include a work function metal layer. The sealing layer 18 fills the gate trench 15 and is placed over the buried word lines 17. The sealing layer 18 may protect the buried word lines 17 through a subsequent process. The sealing layer 18 may include dielectric material. The sealing layer 18 may include silicon nitride, silicon oxide, or a combination thereof.

After the sealing layer 18 is formed, a first impurity region 19 and a second impurity region 20 may be formed in the active region 14. The first impurity region 19 and the second impurity region 20 may be referred to as a source region and a drain region, respectively. A buried gate-type transistor including the buried word lines 17 is formed. The first impurity region 19 and the second impurity region 20 may be formed through a doping process such as an implantation process. The first impurity region 19 and the second impurity region 20 may be doped with the same conductive type impurity, e.g., an N-type impurity.

Figure 4B:
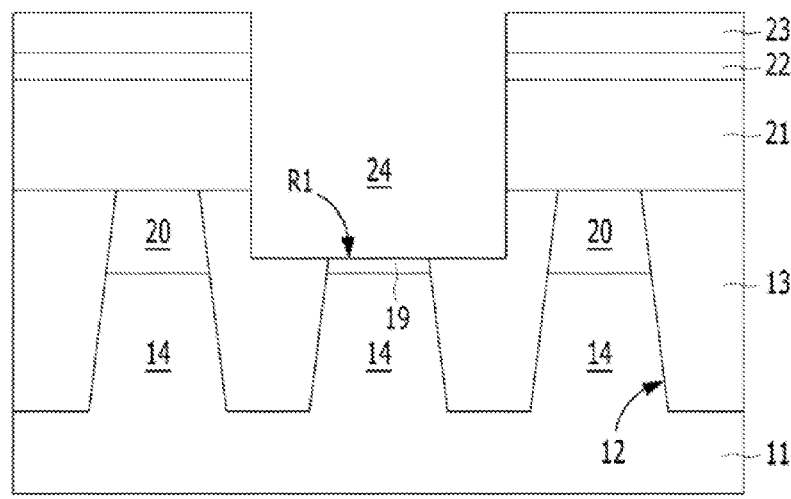
Figure 5B:
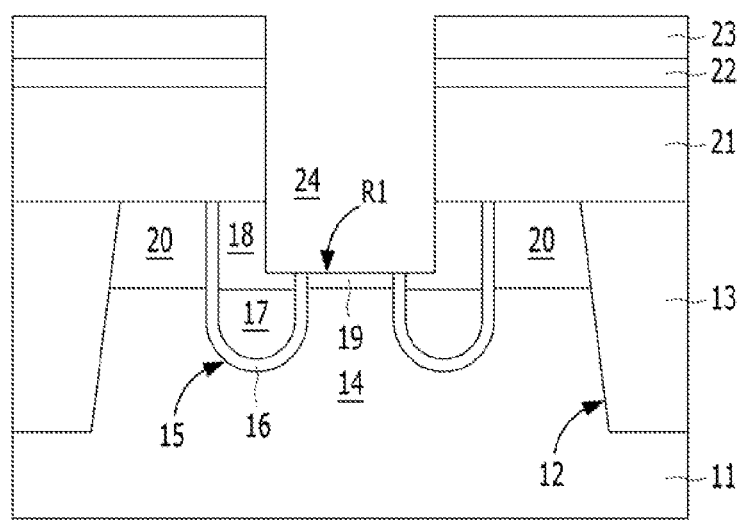

Referring to FIGS. 3B, 4B and 5B, an inter-layer dielectric layer 21 is formed over the substrate 11. An etch stop layer 22 is formed over the inter-layer dielectric layer 21. The inter-layer dielectric layer 21 may include silicon oxide, silicon nitride, or a combination thereof. The etch stop layer 22 may include silicon nitride.

A first opening 24 is formed. Using a first mask pattern 23 as an etch mask, the etch stop layer 22 and the inter-layer dielectric layer 21 are etched to form the first opening 24. The first mask pattern 23 may include a photoresist pattern. When viewed from the top, the first opening 24 may form a hole. The first opening 24 may be referred to as a first contact hole. A portion of the substrate 11 is exposed by the first opening 24. The size of the first opening 24 may vary depending on a predetermined line width (or a given critical dimension). The first opening 24 may be in a circle shape or in an oval shape. The first opening 24 may expose a portion of the active region 14 between the buried word lines 17. For example, the first impurity region 19 is exposed by the first opening 24. The first opening 24 may be formed wider than a width of the first impurity region 19. Thus, the isolation layer 13 and the sealing layer 18 adjacent to the first impurity region 19 may be exposed by the first opening 24.

The first impurity region 19 exposed by the first opening 24 is further etched to a predetermined depth to form a first recess R1. A portion of the isolation layer 13 and a portion of the sealing layer 18 adjacent to the first impurity region 19 and exposed by the first opening 24 may be etched to form the first recess R1. The first recess R1 may be coupled with the first opening 24. A bottom of the first recess R1 may be located at a level lower than the upper portion of the substrate. That is, an upper surface of the first impurity region 19 exposed by the first recess R1 may be lower than the upper portion of the substrate 11. When the first recess R1 is formed, upper edges of the first opening 24 may be rounded and broadened.

Figure 4C:
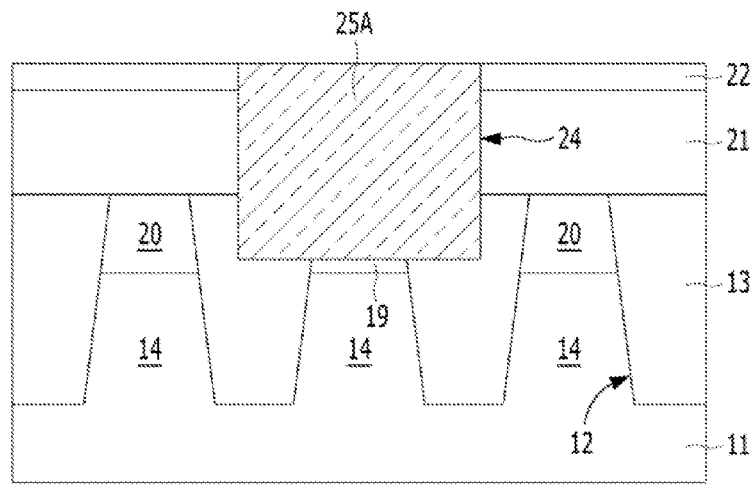
Figure 5C:
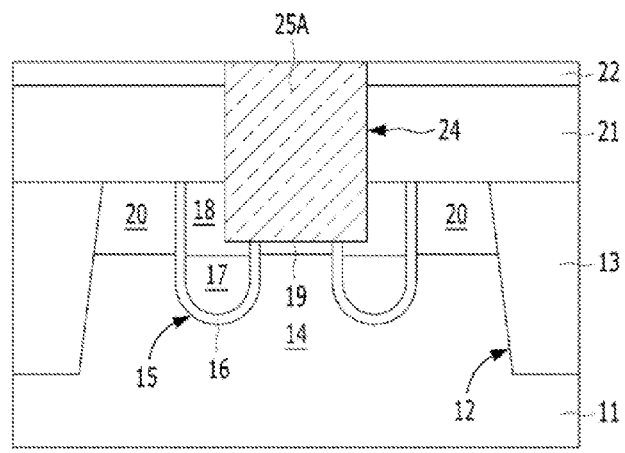

Referring to FIGS. 3C, 4C and 5C, the first mask pattern 23 is removed. Subsequently, a preliminary first plug 25A is formed. A method for forming the preliminary first plug 25A is described below. A first conductive layer (not shown) filling the first opening 24 is formed over the structure including the first opening 24. Subsequently, the first conductive layer is planarized to expose an upper surface of the etch stop layer 22. Thus, the preliminary first plug 25A filling the first opening 24 and the first recess R1 is formed. An upper surface of the preliminary first plug 25A may be at the same level or lower than the upper surface of the etch stop layer 22. Subsequently, the preliminary first plug 25A may be doped with an impurity through a doping process such as an implantation process. In an embodiment, the preliminary first plug 25A may include polysilicon. In another embodiment, the preliminary first plug 25A may include a metal-containing material. The preliminary first plug 25A may contact the first impurity region 19.

Figure 4D:
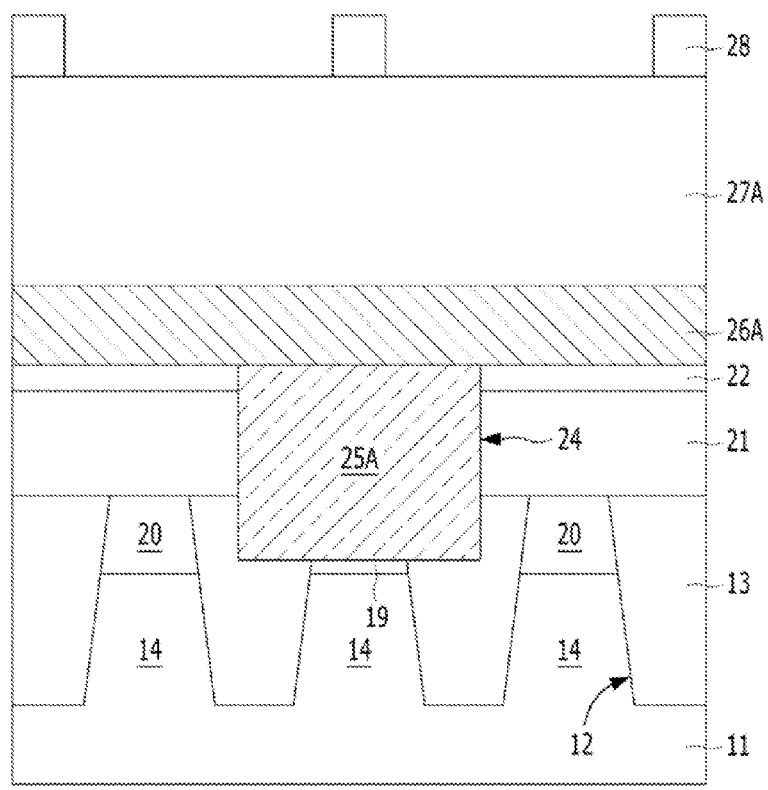
Figure 5D:
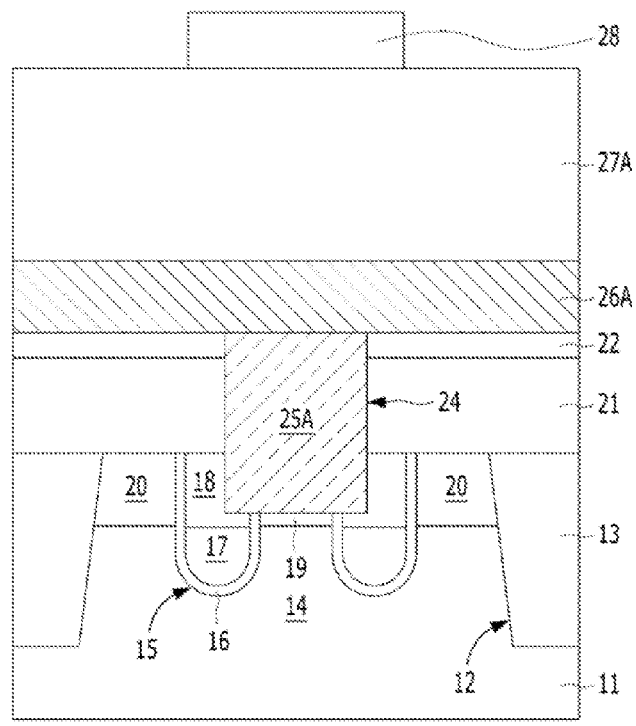

Referring to FIGS. 3D, 4D and 5D, a second conductive layer 26A and a hard mask layer 27A are stacked over the preliminary first plug 25A and the each stop layer 22. The second conductive layer 26A may be formed of a metal-containing material. The second conductive layer 26A may include a metal, a metal nitride, a metal silicide or a combination thereof. In an embodiment, the second conductive layer 26A may include tungsten W or a stacked layer of a titanium nitride and tungsten (TiN/W). The second conductive layer 26A may be formed of a stacked layer of a barrier layer and a metal layer. The barrier layer prevents diffusion between the preliminary first plug 25A and the metal layer. The hard mask layer 27A is formed of a dielectric material. The hard mask layer 27A may include a silicon oxide or a silicon nitride. In an embodiment, the hard mask layer 27A may be formed of a silicon nitride.

Subsequently, a second mask pattern 28 is formed over the hard mask layer 27A. The second mask pattern 28 includes a photoresist pattern. The second mask pattern 28 has a line shape and extends in one direction. The second mask pattern 28 may have a smaller line width than a width of the first opening 24.

Figure 4E:
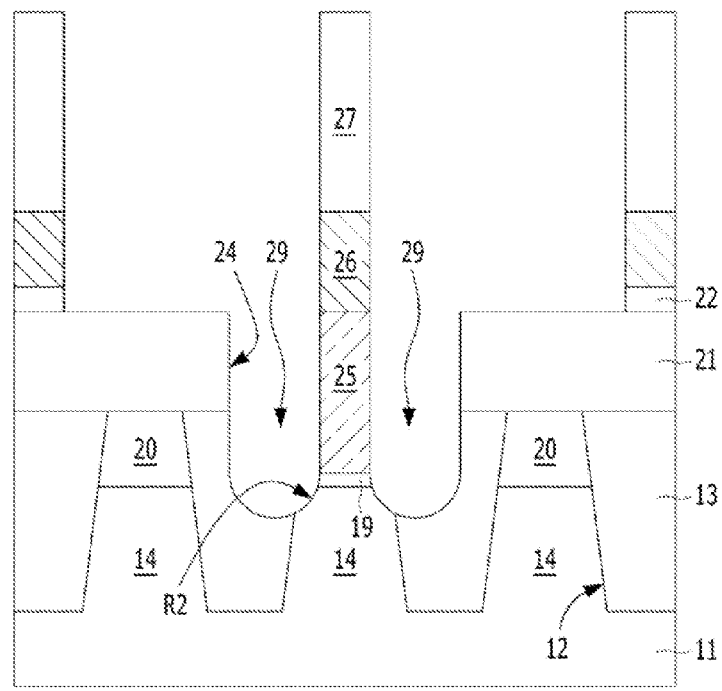
Figure 5E:
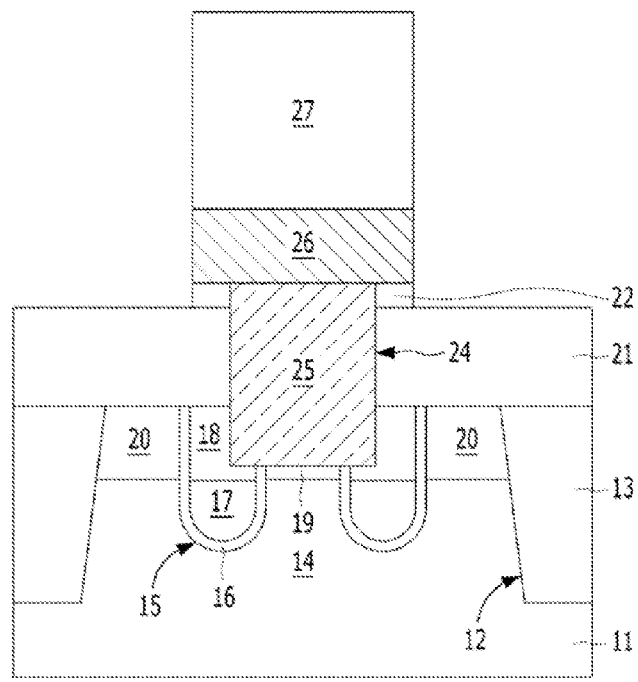

Referring to FIGS. 3E, 4E and 5E, a bit line structure and a first plug 25 are formed.

The hard mask layer 27A and the second conductive layer 26A are etched by using the second mask pattern 28 as an etch mask. Consequently the bit line structure including a bit line 26 and a bit line hard mask 27 is formed. The bit line hard mask 27 may be formed through an etch process of the hard mask layer 27A. An etch process of the second conductive layer 26A for forming the bit line 26 may stop on the etch stop layer 22.

The etch stop layer 22 is etched by using the second mask pattern 28 as an etch mask. The etch stop layer 22 may be etched to have the same line width as the bit line 26.

The preliminary first plug 25A is etched by using the second mask pattern 28 as an etch mask. Consequently, the first plug 25 is formed. The preliminary first plug 25A may be etched to have the same line width as the bit lines 26. The first plug 25 is formed over the first impurity region 19. The first plug 25 couples the first impurity region 19 with the bit lines 26. The first plug 25 is formed inside the first opening 24. The line width of the first plug 25 is smaller than a width of the first opening 24. Thus, a gap 29 is formed on both sides of the first plug 25.

Subsequently, the second mask pattern 28 is removed.

As described above, as the first plug 25 is formed, the gap 29 is formed inside the first opening 24. This is because the first plug 25 is etched and formed narrower in size than the first opening 24. The gap 29 is not formed to surround the first plug 25. Rather the gap 29 is independently formed on both sides of the first plug 25. As a result, one first plug 25 and a pair of gaps 29 are disposed inside the first opening 24, and the gap 29 pair is separated by the first plug 25.

The bit line structure may extend in one direction and cover the first plug 25. For example, the bit line structure may extend in a direction crossing with the buried word lines 17. The bit line 26 is in a line shape and extends over the etch stop layer 22. The bit line 26 is coupled with the first plug 25. The bit lines 26 may be electrically connected to the first impurity region 149 by the first plug 25.

While the first plug 25 is formed, the isolation layer 13 and the sealing layer 18 which are disposed adjacent to the first plug 25 may be excessively etched, forming a second recess R2. The second recess R2 may be deeper than the first recess R1.

Although not illustrated in the drawing, after or when the bit line structure and the first plug 25 are formed, a non-buried gate-type transistor including a planar gate structure may be formed in a peripheral circuit region of the substrate 11. The planar gate structure may include a first electrode, a second electrode, and a gate hard mask layer. The first electrode is formed during the etch process where a first conductive layer is etched to form the preliminary first plug 25A. The second electrode is formed during the etch process where the second conductive layer 26A is etched to form the bit line 26. The gate hard mask layer is formed during the etch process where the hard mask layer 27A is formed.

Although not illustrated in the drawing, a source region and a drain region may be formed in the substrate 11 of the peripheral circuit region after the planar gate structure is formed. As a result, the non-buried gate-type transistor is formed in the peripheral circuit region. The buried word lines 17, the first impurity region 19 and the second impurity region 20 are formed in a cell region of the substrate 11.

Figure 4F:
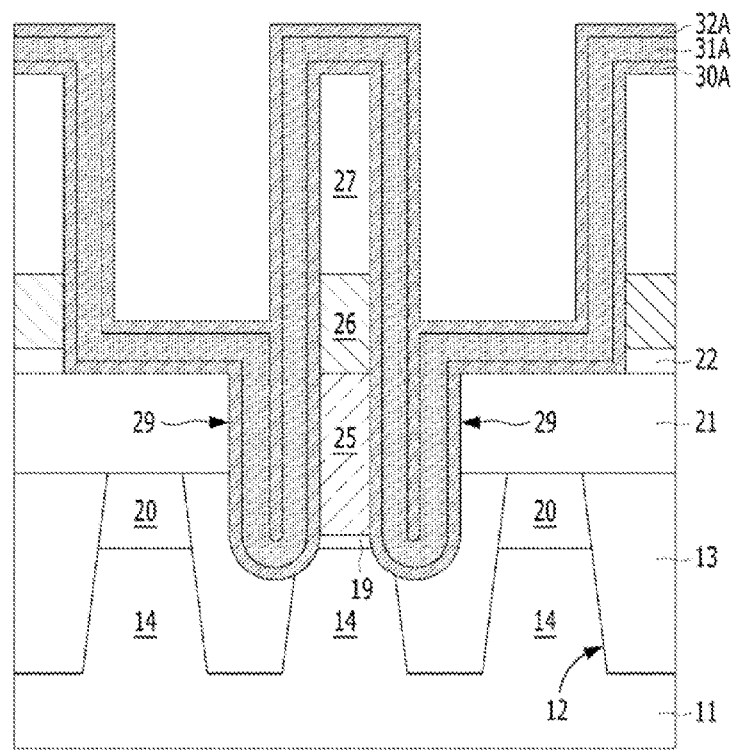
Figure 5F:
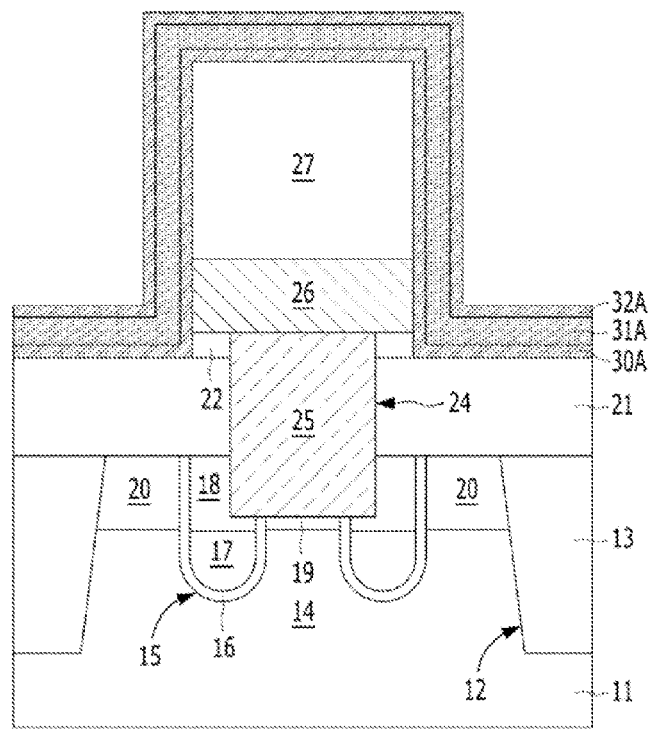

Referring to FIGS. 3F, 4F and 5F, a first spacer layer 30A is formed over the bit line structure. The first spacer layer 30A is formed over the substrate 11 including the bit line structure. The first spacer layer 30A may be formed of a low-k material to reduce parasitic capacitance. The first spacer layer 30A may include a silicon oxide or a silicon nitride. In the embodiment to be described below, the first spacer layer 30A may be formed of a silicon nitride. The first spacer layer 30A does not fill the gap 29 and is conformally (e.g., in a liner pattern) formed. The first spacer layer 30A protects the bit line 26 and the first plug 25 from a subsequent process. The first spacer layer 30A may be formed through an Atomic Layer Deposition (ALD) process or a Chemical Vapor Deposition (CVD) process.

A first sacrificial spacer layer 31A is formed over the first spacer layer 30A. The first sacrificial spacer layer 31A may be formed of a dielectric material. The first sacrificial spacer layer 31A may be formed of a material having an etch selectivity with respect to the first spacer layer 30A. The first sacrificial spacer layer 31A may be formed of a silicon oxide. The first sacrificial spacer layer 31A may be conformally (e.g., in a liner pattern) formed over the first spacer layer 30A. The first sacrificial spacer layer 31A does not fill the gap 29. The first sacrificial spacer layer 31A may be formed through an Atomic Layer Deposition (ALD) process.

A second spacer layer 32A is formed over the first sacrificial spacer layer 31A. The second spacer layer 32A may be formed of a low-k material to reduce parasitic capacitance. Also, the second spacer layer 32A may be formed of a material having an etch selectivity with respect to the first sacrificial spacer layer 31A. The second spacer layer 32A may be formed of a silicon nitride. The second spacer layer 32A may fill the gap 29 and be formed over the first sacrificial spacer layer 31A.

As described above, the gap 29 is filled with the first spacer layer 30A, the first sacrificial spacer layer 31A, and the second spacer layer 32A. The first sacrificial spacer layer 31A may be thicker than the first spacer layer 30A and the second spacer layer 32A. As shown in FIG. 5F, the first spacer layer 30A, the first sacrificial spacer layer 31A, and the second spacer layer 32A may be formed over the inter-layer dielectric layer 21.

Although not illustrated in the drawing, a third spacer layer may be formed over the second spacer layer 32A. The third spacer layer may be formed of a silicon oxide. The third spacer layer may be removed during a subsequent process of removing a sacrificial layer pattern 33. The third spacer layer may remain in the peripheral circuit region (not shown) which is removed in the cell region. The first sacrificial spacer layer 31A, the second spacer layer 32A, and the third spacer layer may be used for a gate spacer of the planar gate structure (not shown) of the peripheral circuit region. The first sacrificial spacer layer 31A, the second spacer layer 32A, and the third spacer layer may be formed in an in-situ process. Thus, the formation process may be simplified. As a comparative example, a titanium nitride TiN, instead of a silicon oxide, may be employed as the first sacrificial spacer layer 31A. Since titanium nitride TiN is a conductive material, titanium nitride TiN has to be removed from a sidewall of the planar gate structure. Thus, an additional mask process and an additional etch process are required. Therefore, the formation process may be simplified since the mask process and the etch process are not necessary in the embodiment.

Figure 4G:
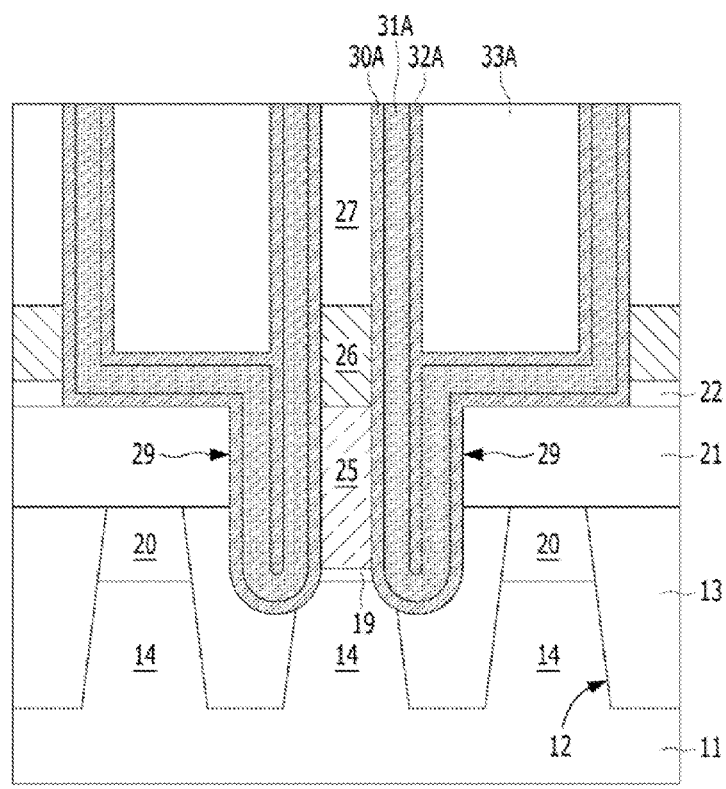
Figure 5G:
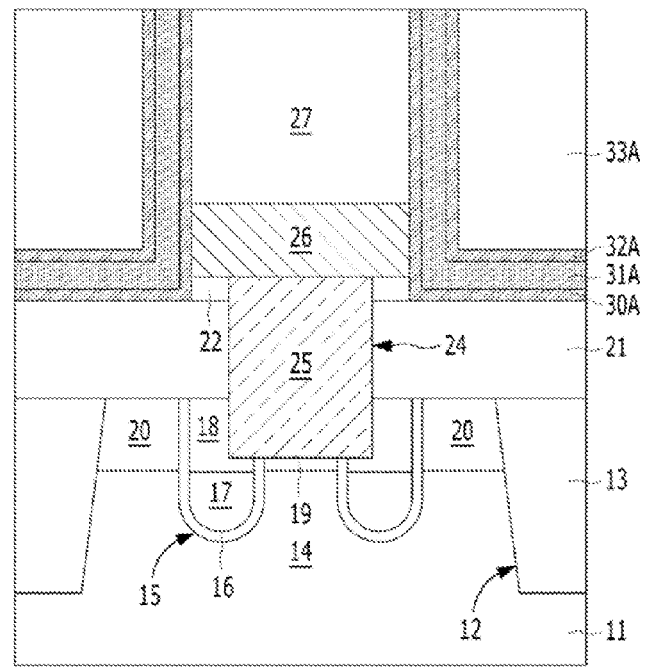

Referring to FIGS. 3G, 4G and 5G, a sacrificial layer 33A is formed. The sacrificial layer 33A fills a space between the bit line structures. The sacrificial layer 33A may be formed of a dielectric material. The sacrificial layer 33A may be formed of silicon oxide. The sacrificial layer 33A may include Spin On Dielectric (SOD) material. Subsequently, the sacrificial layer 33A may be planarized to expose the upper portion of the bit line hard mask 27. Thus, the sacrificial layer 33A of a line shape may be formed between the bit line structures. The sacrificial layer 33A may be extended in parallel to the bit line structure. The first spacer layer 30A, the first sacrificial spacer layer 31A, and the second spacer layer 32A may be planarized to expose a surface of the bit line hard mask 27 during a planarization process of the sacrificial layer 33A. When viewed from the top, the first spacer layer 30A, the first sacrificial spacer layer 31A, and the second spacer layer 32A may have a line shape extending in parallel to sidewalls of the bit lines 26.

Figure 4H:
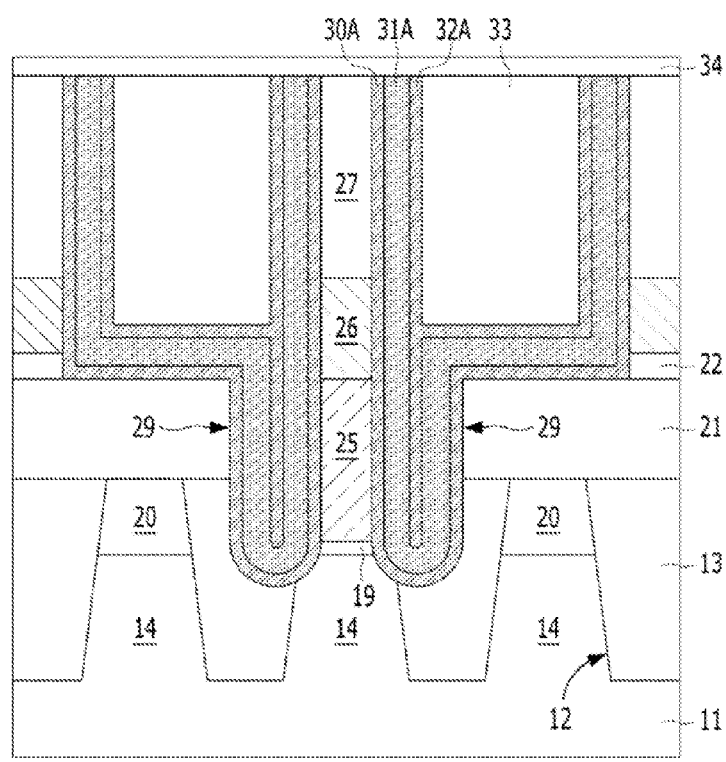
Figure 5H:
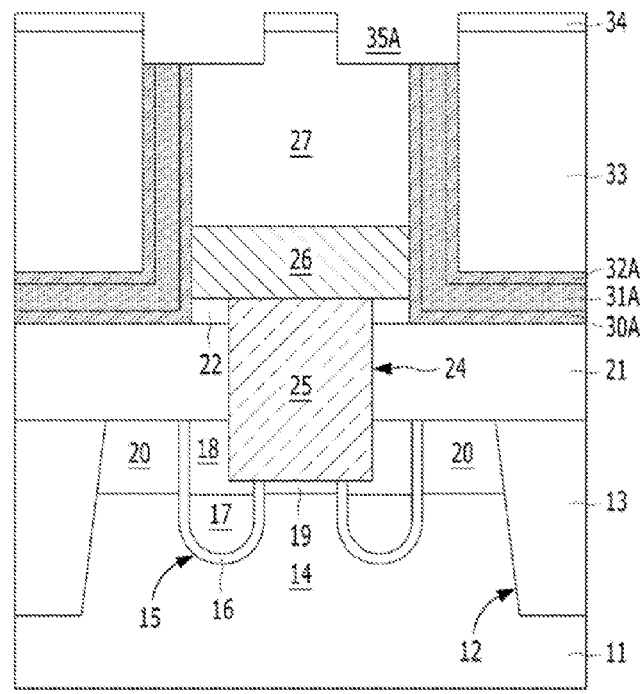

Referring to FIGS. 3H, 4H and 5H, a third mask pattern 34 is formed over the bit line structure and the sacrificial layer 33A. The third mask pattern 34 is patterned in a direction crossing with the bit line structure. The third mask pattern 34 has a line shape. The third mask pattern 34 may include a photoresist pattern. The line width of the third mask pattern 34 may be the same as or larger than the line width of the buried word lines 17. When viewed from the top, the third mask pattern 34 may have a line shape overlapping with the buried word lines 17. Portions of the bit line hard mask 27, the first spacer layer 30A, the first sacrificial spacer layer 31A, the second spacer layer 32A and the sacrificial layer 33A may be exposed by the third mask pattern 34.

A preliminary isolation part 35 is formed. The sacrificial layer 33A is etched by using the third mask pattern 34 as an etch mask. Consequently, the preliminary isolation part 35 may be formed, and a sacrificial layer pattern 33 may remain between neighboring preliminary isolation parts 35.

When the sacrificial layer 33A is etched, the bit line hard mask 27, the first spacer layer 30A, the first sacrificial spacer layer 31A and the second spacer layer 32A may be etched to a predetermined depth. The preliminary isolation part 35 may have a line shape crossing with the bit line structure. A portion 35A of the preliminary isolation part 35 may extend downward to the bit line structure. However, the depth of a portion 35A of the preliminary isolation part 35 may be controlled not to expose the bit lines 26. The preliminary isolation part 35 may overlap with the buried word lines 17. In another embodiment, the preliminary isolation part 35 may have a smaller line width than the buried word lines 17.

Figure 4I:
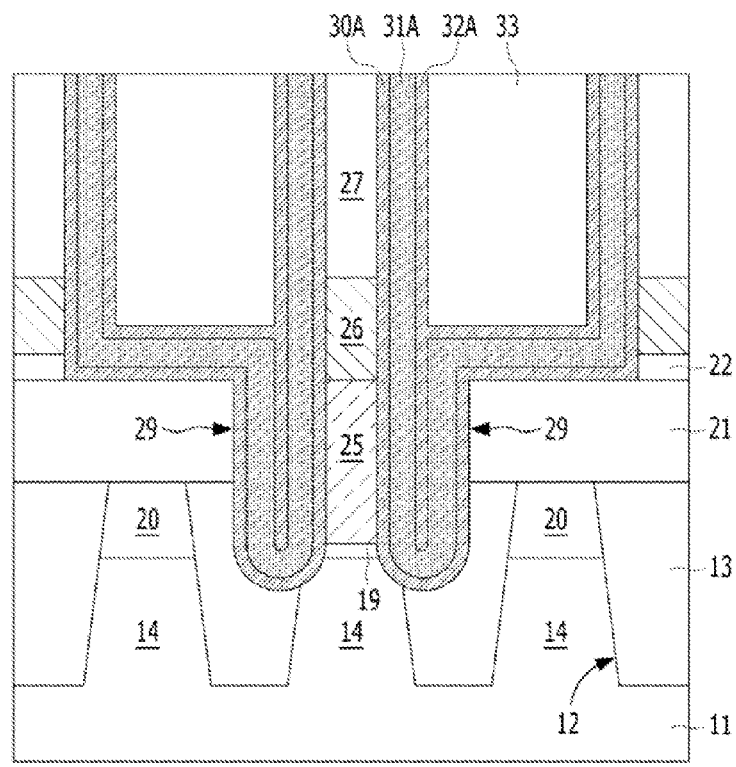
Figure 5I:
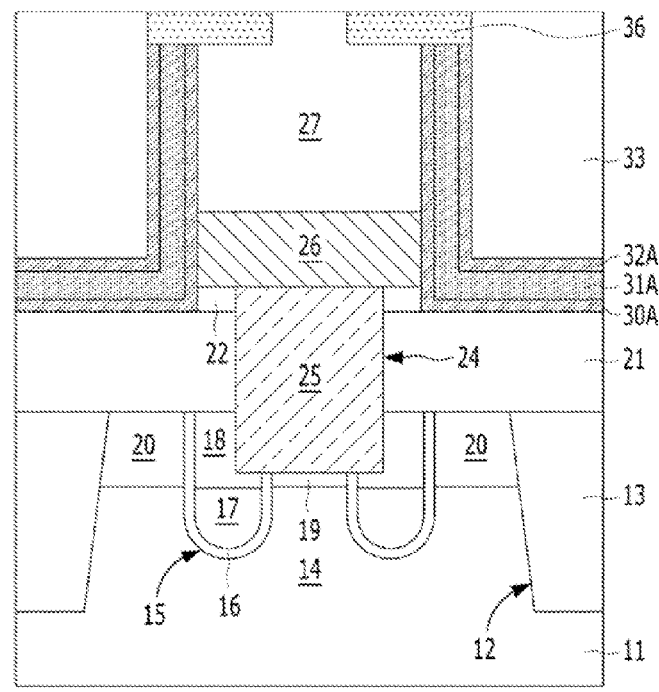

Referring to FIGS. 3I, 4I and 5I, the third mask pattern 34 is removed. A plug isolation layer 36 is formed in the preliminary isolation part 35. The plug isolation layer 36 may be planarized and formed after a silicon nitride is formed to gap-fill the preliminary isolation part 35. The plug isolation layer 36 may have a line shape and extend in a direction crossing with the bit line structure. The sacrificial layer pattern 33 may remain exposed. The plug isolation layer 36 may fill the preliminary isolation part 35 including the portion 35A.

Figure 4J:
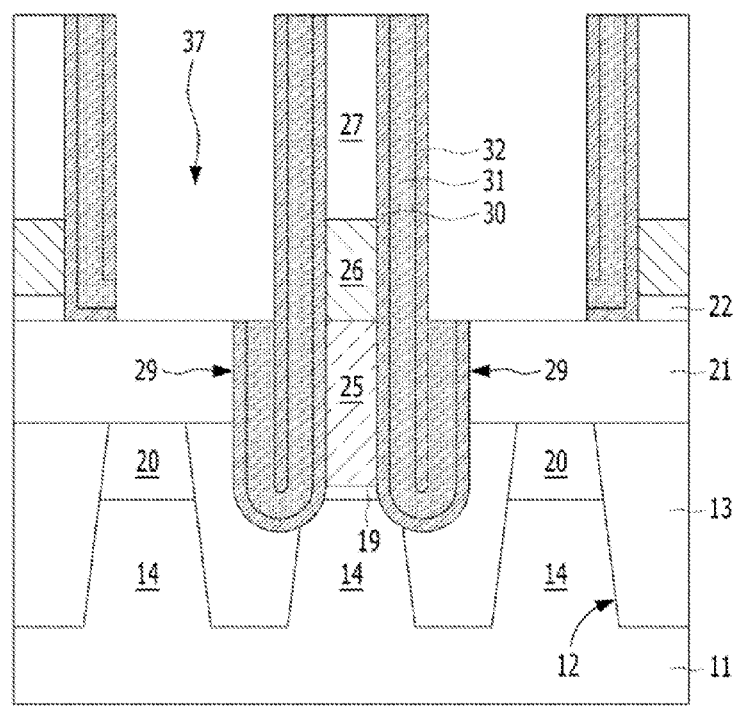
Figure 5J:
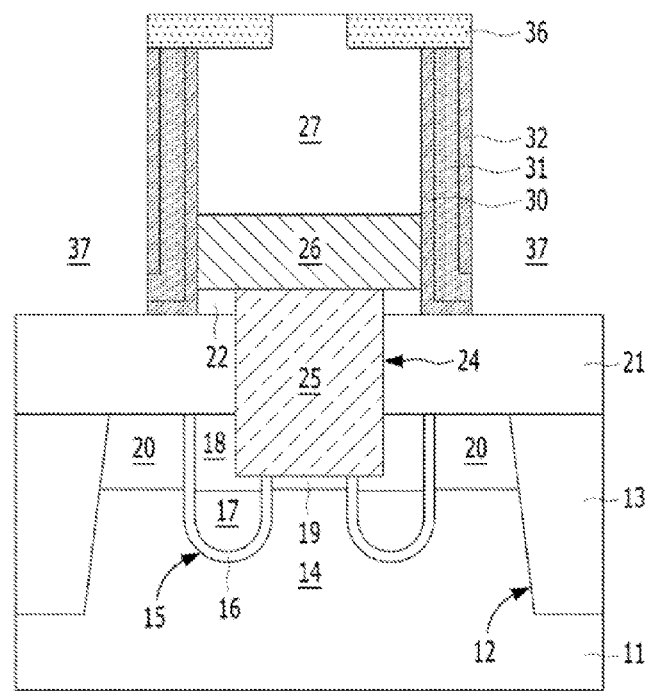

Referring to FIGS. 3J, 4J and 5J, the sacrificial layer pattern 33 is removed. A space created by removing the sacrificial layer pattern 33 becomes a second opening 37. The second opening 37 is formed between the plug isolation layers 36. Neighboring second openings 37 may be spaced apart from each other by the bit line structure and the plug isolation layer 36. A dip-out process may be carried out to remove the sacrificial layer pattern 33. The sacrificial layer pattern 33 may be selectively removed without a loss of the first spacer layer 30A, the first sacrificial spacer layer 31A, and the second spacer layer 32A through the dip-out process. When viewed from above, the second opening 37 may have a quadrangular hole shape. When viewed from the A-A' cross-section, the second opening 37 may be disposed on both sides of the bit line structure. See FIG. 4J. When view from the B-B' cross-section, the neighboring second openings 37 may be spaced apart from each other by the plug isolation layer 36. See FIG. 5J.

Subsequently, a trimming process is performed. A side and a lower portion of the second opening 37 may expand through the trimming process. When the trimming process is carried out, a space where a second plug 39 and a third plug 46 are subsequently formed, i.e., an open area of the second opening 37 may be sufficiently secured. The second spacer layer 32A, the first sacrificial spacer layer 31A, and the first spacer layer 30A which are located over the inter-layer dielectric layer 21 may be removed through the trimming process. Therefore, a first spacer 30, a first sacrificial spacer 31, and a second spacer 32 may remain over sidewalls of the bit lines 26. To be specific, the second spacer 32 is formed by etching the second spacer layer 32A. The first sacrificial spacer layer 31A and the first spacer layer 30A which are formed over the second spacer 32 are etched to form the first sacrificial spacer 31 and the first spacer 30, respectively.

Figure 4K:
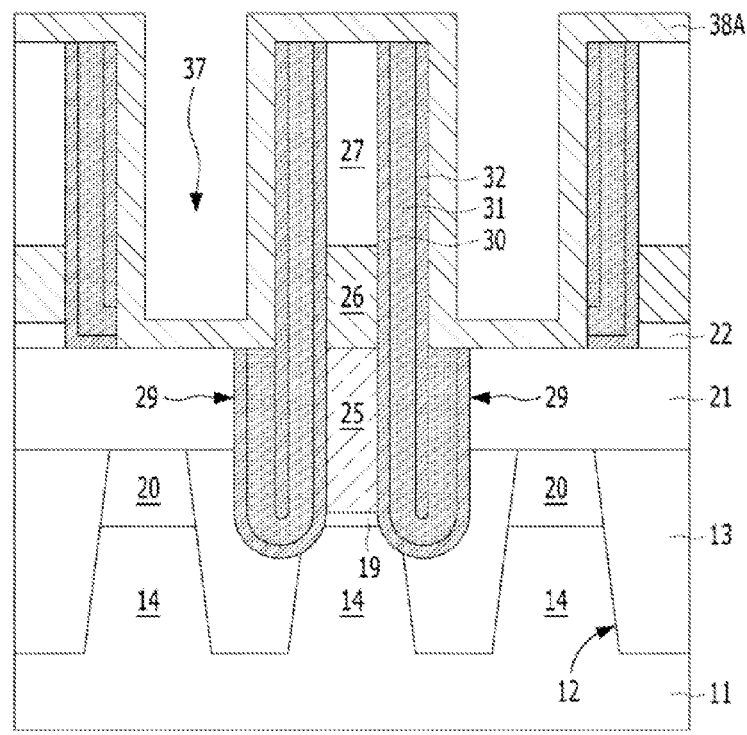
Figure 5K:
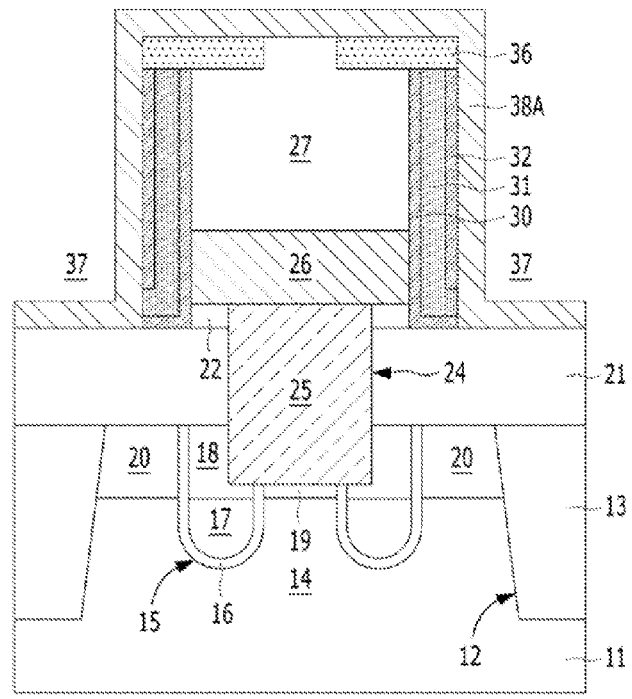

Referring to FIGS. 3K, 4K and 5K, a second sacrificial spacer layer 38A is formed. The second sacrificial spacer layer 38A is conformally (e.g., in a liner pattern) formed over the structure including the second opening 37. The second sacrificial spacer layer 38A may be formed of a material having an etch selectivity with respect to the first spacer 30 and the second spacer 32. The second sacrificial spacer layer 38A may be formed of a metal nitride. In the embodiment described below, the second sacrificial spacer layer 38A may be formed of a titanium nitride TiN. The second sacrificial spacer layer 38A may be formed to have the same thickness as the first sacrificial spacer 31.

Figure 4L:
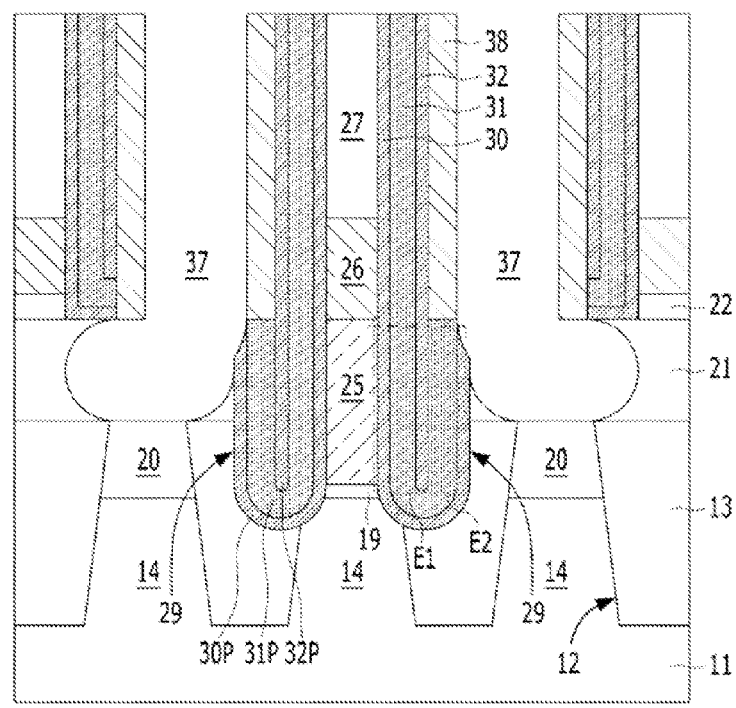
Figure 5L:
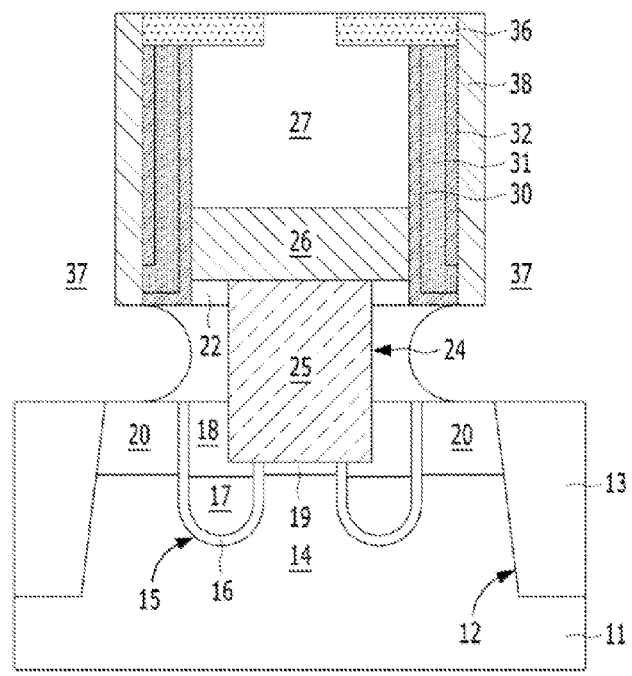

Referring to FIGS. 3L, 4L, and 5L, a second sacrificial spacer 38 is formed. The second sacrificial spacer 38 may be formed through an etch-back process of the second sacrificial spacer layer 38A. The second sacrificial spacer 38 is formed on sidewalls of the second opening 37. When viewed from above, the second sacrificial spacer 38 may be formed over sidewalls of the second opening 37.

Subsequently, a bottom portion of the second opening 37 is expanded. To this end, the inter-layer dielectric layer 21 exposed by the second opening 37 is etched. The inter-layer dielectric layer 21 may be etched through a dry etch process. For example, the inter-layer dielectric layer 21 may be etched through an anisotropic etch process. Therefore, the second impurity region 20 is exposed by the expanded second opening 37. Subsequently, portions of the second impurity region 20 and the isolation layer 13 may be recessed to a predetermined depth. A bottom surface of the second opening 37 may have a V-type profile due to an etch selectivity difference. Also, the bottom portion of the second opening 37 may expand in a lateral direction through the anisotropic etch process and have a bulb shape. The anisotropic etch process may be controlled so that sidewalls of the first plug 25 are not exposed to a bottom portion of the second opening 37.

As the second opening 37 expands, a dielectric spacer may be formed on the sidewalls of the first plug 25 and the bit lines 26. The dielectric spacer may include the first spacer 30, the first sacrificial spacer 31, the second spacer 32 and the second sacrificial spacer 38. The first spacer 30, the first sacrificial spacer 31 and the second spacer 32 have line shapes and extend in parallel to the sidewalls of the bit lines 26. The second sacrificial spacer 38 is formed over sidewalls of the second opening 37. The second sacrificial spacer 38 extends down to a level higher than an upper surface of the first plug 25. A portion of the dielectric spacer may be extended up to the same level as the upper surface of the first plug 25. The first spacer 30, the first sacrificial spacer 31, and the second spacer 32 may be formed on the sidewalls of the first plug 25. The first spacer 30, the first sacrificial spacer 31, and the second spacer 32 may fill the gap 29. The first spacer 30 and the first sacrificial spacer 31 may include a first extension part E1 and a second extension part E2. The first extension part E1 may be disposed on the sidewalls of the first plug 25, and the second extension part E2 may be disposed on the sidewalls of the second opening 37. The second spacer 32 may be disposed in the center of the gap 29. The first extension part E1 may join the second extension part E2. Hereafter, the first extension part E1 and the second extension part E2 of the first spacer 30 is collectively referred to as a lining layer 30P. The first extension part E1 and the second extension part E2 of the first sacrificial spacer 31 is collectively referred to as a sacrificial lining layer 31P. An extension part of the second spacer 32 is referred to as a pillar 32P.

The first spacer 30, the second spacer 32, the lining layer 30P and the pillar 32P may include a silicon nitride. Each of the first sacrificial spacer 31 and the sacrificial lining layer 31P may include silicon oxide. The second sacrificial spacer 38 may include titanium nitride. Thus, the dielectric spacer of Nitride-Oxide-Nitride-TiN (N—O—N—TiN) may be formed on the sidewalls of the bit lines 26. The dielectric spacer of Nitride-Oxide-Nitride-Oxide-Nitride (N—O—N—O—N) may extend on the sidewalls of the first plug 25.

Figure 4M:
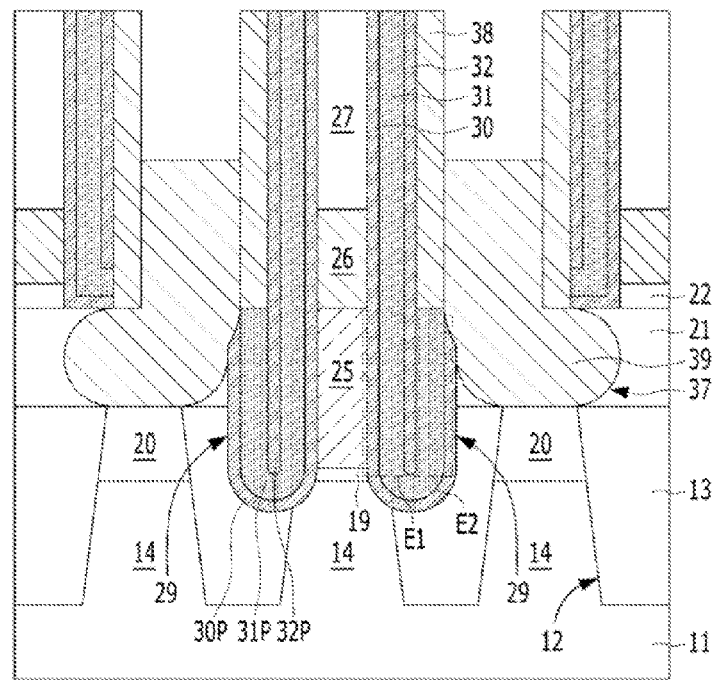
Figure 5M:
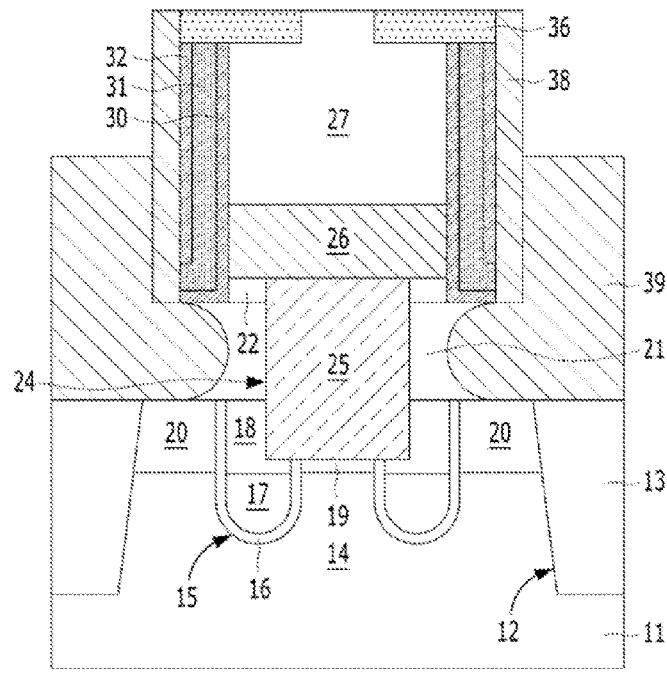

Referring to FIGS. 3M, 4M and 5M, the second plug 39 is formed. The second plug 39 may be recessed in the second opening 37. The second plug 39 may include a silicon-containing layer. The second plug 39 may include a polysilicon layer. The polysilicon layer may be doped with an impurity. The second plug 39 is coupled with the second impurity region 20. A recessed surface of the second plug 39 may be at a level higher than the upper surface of the bit lines 26. After the polysilicon layer is deposited to form the second plug 39, a planarization process and an etch-back process may be sequentially carried out. As the planarization process and the etch-back process are for forming the second plug 39, a void may be minimized since the polysilicon layer is deposited after the second sacrificial spacer 38 is formed. The lining layer 30P and the sacrificial fining layer 31P may be disposed between the first plug 25 and the second plug 39.

As described above, the first plug 25 and the bit lines 26 may be disposed adjacent to the second plug 39, and a dielectric spacer is placed between the first plug 25 and the second plug 39 and between the bit lines 26 and the second plug 39. The dielectric spacer including the first spacer 30, the first sacrificial spacer 31, the second spacer 32 and the second sacrificial spacer 38 may be formed between the bit lines 26 and the second plug 39. The dielectric spacer including the lining layer 30P, the sacrificial lining layer 31P and the pillar 32P may be formed between the first plug 25 and the second plug 39.

Figure 4N:
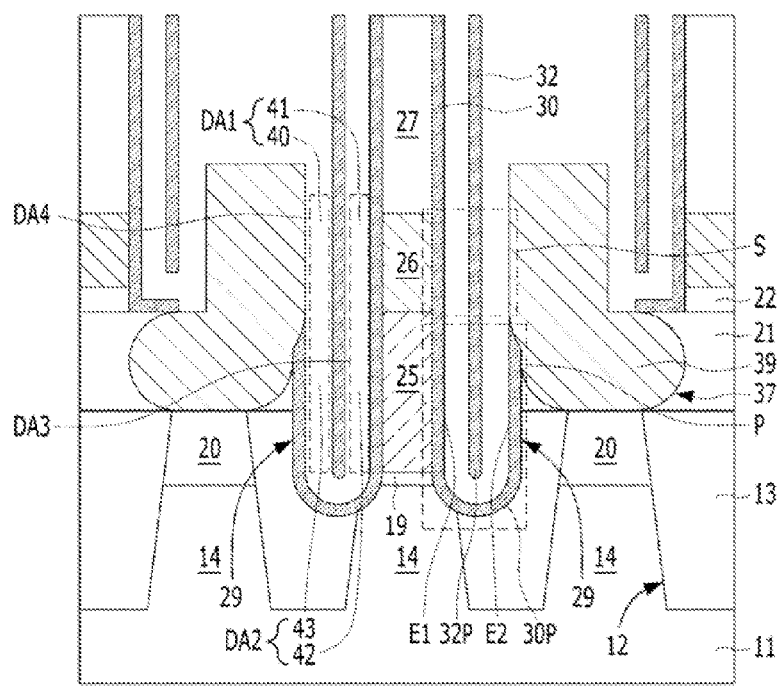
Figure 5N:
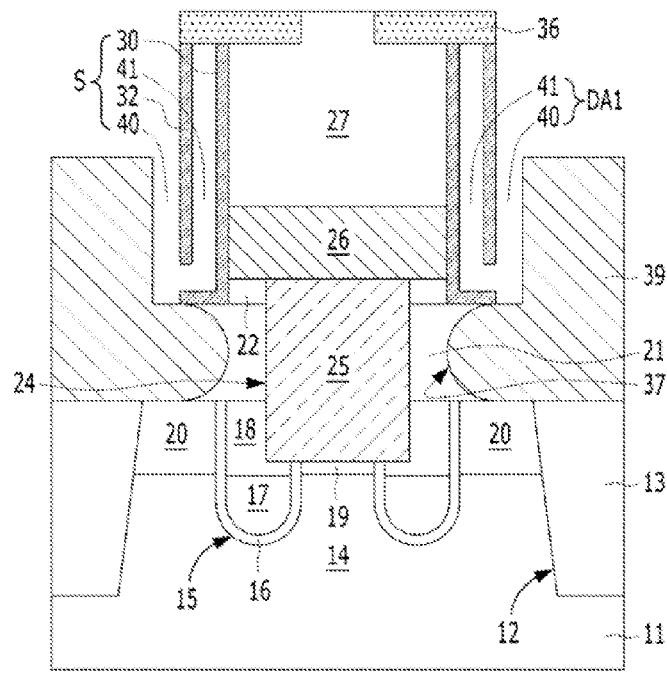

Referring to FIGS. 3N, 4N and 5N, the second sacrificial spacer 38 is removed. Consequently, a first air gap 40 is formed. A wet etch process may be carried out to remove the second sacrificial spacer 38. For example, a mixture of sulfuric add ($H_2SO_4$) and hydrogen peroxide ($H_2O_2$), capable of selectively etching titanium nitride, may be used.

The first sacrificial spacer 31 and the sacrificial lining layer 31P are removed. Consequently, a second air gap 41 is formed. The second air gap 41 may be formed between the bit lines 26 and the second plug 39 and extend to a space between the first plug 25 and the second plug 39. For convenience, the extended part of the second air gap 41, i.e., the second air gap 41, formed between the first plug 25 and the second plug 39 is referred to as a third air gap 42 and a fourth air gap 43. Since the sacrificial lining layer 31P and the first sacrificial spacer 31 are the same material, the second air gap 41, the third air gap 42 and the fourth air gap 43 may be formed in an in-situ process (e.g., in the same chamber without a substantial interruption). As a result, the formation process may be simplified.

A wet etch process may be carried out to remove the first sacrificial spacer 31 and the sacrificial lining layer 31P. For example, a Buffered Oxide Etchant (BOE) capable of selectively etching a silicon oxide may be used. The BOE may include a mixture of ammonium fluoride ($NH_4F$) and hydrogen fluoride (HF).

The first air gap 40 and the second air gap 41 may collectively form a first double air gap DA1. The third air gap 42 and the fourth air gap 43 may collectively form a second double air gap DA2.

The first double air gap DA1 may be disposed between the bit lines 26 and the second plug 39. The first air gap 40 has a ring shape and surrounds the second plug 39, and the second air gap 41 has a line shape. The second air gap 41 extends in parallel to the sidewalls of the bit lines 26. The second air gap 41 is disposed between the first spacer 30 and the second spacer 32. The first air gap 40 is disposed between the second spacer 32 and the second plug 39. The first air gap 40 has a ring shape and surrounds the second plug 39. The first air gap 40 and the second air gap 41 may be coupled with each other. A portion of the second air gap 41 may be capped by the plug isolation layer 36.

The second double air gap DA2 may be disposed in the gap 29 between the first plug 25 and the second plug 39. The third air gap 42 and the fourth air gap 43 may join each other. This is because the third air gap 42 and the fourth air gap 43 are formed as the sacrificial lining layer 31P is removed. The lining layer 30P may include the first extension part E1 and the second extension part E2. The first extension part E1 and the second extension part E2 may lined on the sidewalls and bottom surface of the gap 29. The first extension part E1 may extend to the second extension part E2. The first extension part E1 may be in contact with the first plug 25, and the second extension part E2 may be in contact with the second plug 39. The lining layer 30P is formed on the bottom surface and sidewalls of the gap 29, and the pillar 32P is disposed in the center of the gap 29. The third air gap 42 and the fourth air gap 43 may surround the lower portion and sidewalls of the pillar 32P. The lining layer 30P, the pillar 32P and the second double air gap DA2 disposed inside the gap 29 may be referred to as a dielectric plug P. The first plug 25 and the second plug 39 are conductive plugs, and the dielectric plug P may be disposed between the first plug 25 and the second plug 39. Therefore, the second double air gap DA2 may be referred to as a plug-type air gap.

The second air gap 41 and the third air gap 42 may be coupled with each other. This is because the first sacrificial spacer 31 and the sacrificial lining layer 31P are simultaneously removed. Also, the first air gap 40 and the fourth air gap 43 may be coupled with each other. This is because the sacrificial lining layer 31P and the second sacrificial spacer 38, which are coupled with each other, are removed.

The first air gap 40, the second air gap 41, the third air gap 42 and the fourth air gap 43 may be coupled with each other.

As described above, the first plug 25 and the bit lines 26 may be disposed adjacent to the second plug 39 and a dielectric spacer are provided between them. The first air gap 40, the second air gap 41, the third air gap 42, and the fourth air gap 43 may be included in the dielectric spacer. The dielectric spacer may include the spacer structure S and the dielectric plug P. The dielectric plug P may extend to the spacer structure S.

The spacer structure S may be disposed between the bit lines 26 and the second plug 39. The spacer structure S includes the first spacer 30, the second spacer 32 and the first double air gap DA1. Since the first spacer 30 and the second spacer 32 include a silicon nitride, the spacer structure S may be a Nitride-Air1-Nitride-Air2 (NANA) structure. The first air gap 40 and the second air gap 41 may be included in the spacer structure S. As the first double air gap DA1 of the first air gap 40 and the second air gap 41 is formed, the air gap may have a sufficiently large size. Thus, parasitic capacitance between the bit lines 26 and the second plug 39 may be significantly reduced. As a comparative example, a single air gap formed of the first air gap 40 alone or the second air gap 41 alone may be disposed between the bit lines 26 and the second plug 39. Compared to the comparative example, parasitic capacitance may be more greatly reduced in the embodiment where the first double air gap DA1 is formed.

The dielectric plug P is formed between the first plug 25 and the second plug 39. The dielectric plug P includes the lining layer 30P, the pillar 32P and the second double air gap DA2. Since the lining layer 30P and the pillar 32P include silicon nitride, the dielectric plug P has a Nitride-Air3-Nitride-Air4 (NANA) structure. The third air gap 42 and the fourth air gap 43 may be included in the dielectric plug P.

The first air gap 40 and the fourth air gap 43 may extend in a vertical direction, and the second air gap 41 and the third air gap 42 may extend in a vertical direction. The first air gap 40 and the fourth air gap 43 may form a fourth double air gap DA3. The second air gap 41 and the third air gap 42 may form a third double air gap DA4. The fourth double air gap DA3 and the third double air gap DA4 may be coupled with each other.

As the third double air gap DA4 of the second air gap 41 and the third air gap 42 is formed, parasitic capacitance between the bit lines 26 and the second plug 39 may be further reduced. In a comparative example, the second air gap 41 as a single air gap may be formed between the bit lines 26 and the second plug 39, and the third air gap 42 as a single air gap may be formed between the first plug 25 and the second plug 39. Compared with the comparative example, parasitic capacitance may be more greatly reduced in the embodiment where the fourth double air gap DA3 is formed.

The first embodiment may be referred to as a pre-air gap forming process since the first air gap 40, the second air gap 41, the third air gap 42, and the fourth air gap 43 are formed before the third plug 46 is formed.

Figure 4O:
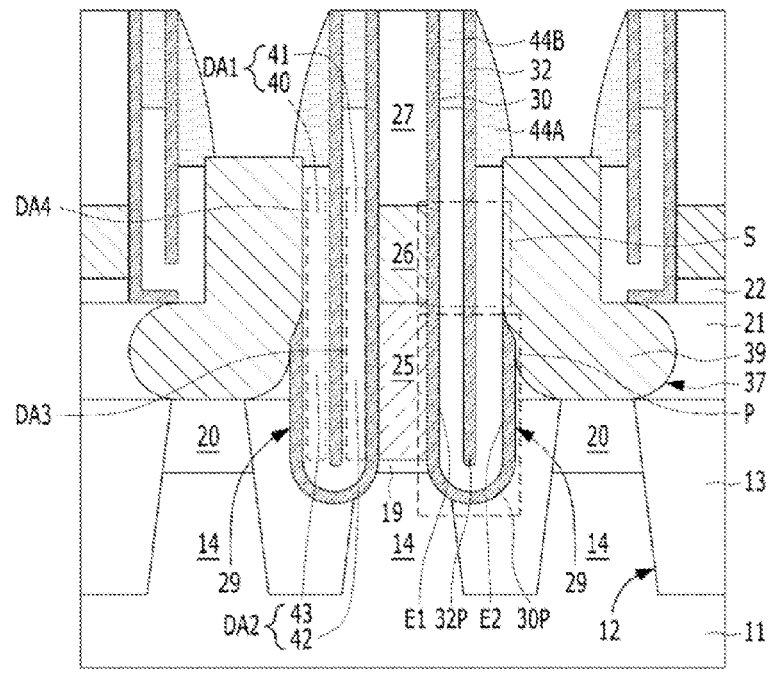
Figure 5O:
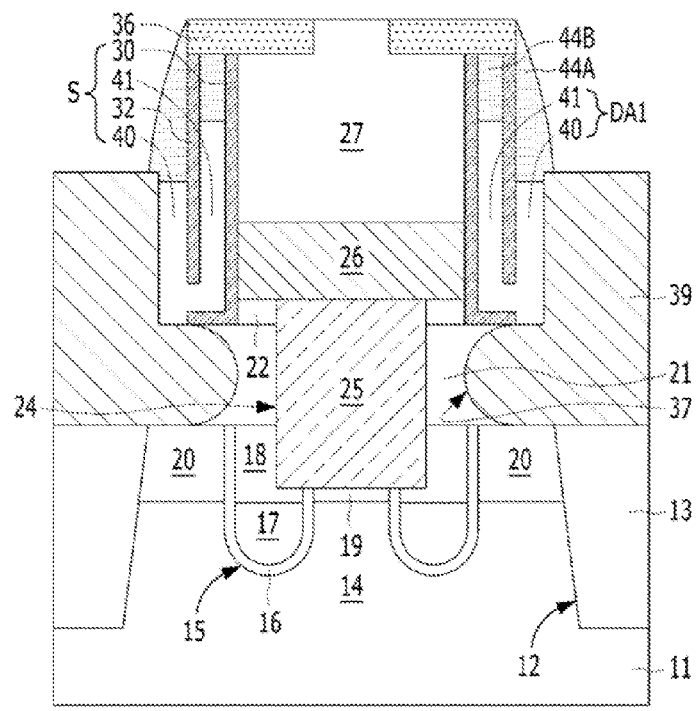
Figure 5P:
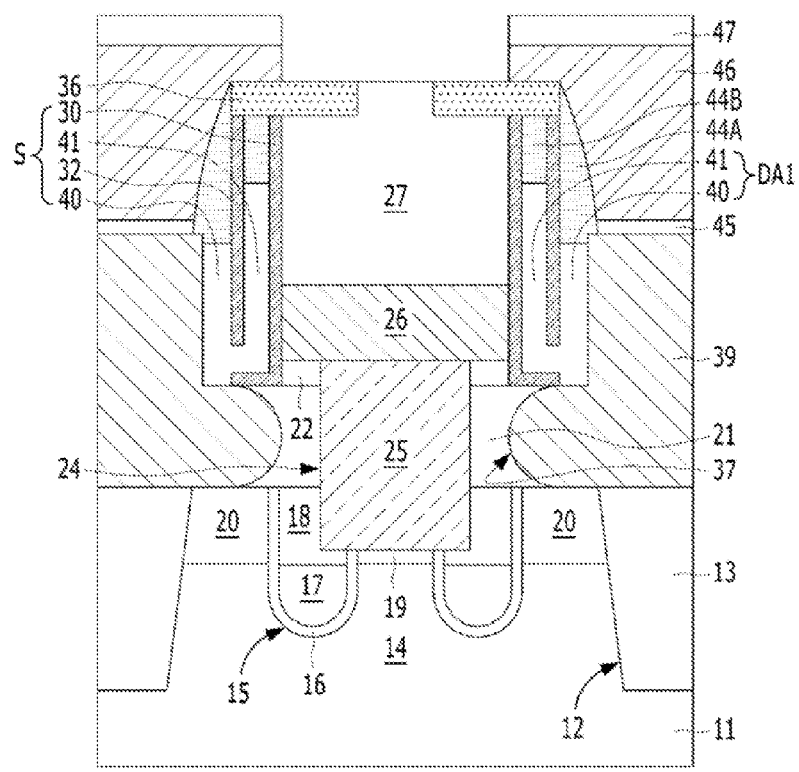

Referring to FIGS. 3O, 4O and 5O, capping layers 44A and 44B are formed. The capping layers 44A and 44B fill a top portion of the first double air gap DA1. The capping layers 44A and 44B may be divided into a first capping layer 44A and a second capping layer 44B. The first capping layer 44A caps the first air gap 40. The second capping layer 44B caps the second air gap 41. The first capping layer 44A and the second capping layer 44B may be formed of a dielectric material. The first capping layer 44A and the second capping layer 44B may be formed of a silicon oxide. The silicon oxide may be formed through an oxidation process, a deposition process or a combination thereof. For example, a second silicon oxide may be formed through a Chemical Vapor Deposition (CVD) process after a first silicon oxide is formed through a plasma oxidation process. In another embodiment, the first capping layer 44A and the second capping layer 44B may include silicon nitride or a mixture of silicon nitride and silicon oxide. Lower portions of the first capping layer 44A and the second capping layer 44B may have enough depth to secure the heights of the first air gap 40 and the second air gap 41. That is, the lower portions of the first air gap 40 and the second air gap 41 are maintained empty. An etch-back process may be performed after silicon oxide is deposited over the structure so that the top portions of the first air gap 40 and the second air gap 41 are filled to form the first capping layer 44A and the second capping layer 44B. The silicon oxide may be deposited using a material having poor step coverage in order to selectively fill the top portions of the first air gap 40 and the second air gap 41 with the silicon oxide and leave the lower portions of the first air gap 40 and the second air gap 41 empty. For example, the silicon oxide may be deposited through a Plasma Enhanced Chemical Vapor Deposition (PECVD) process. Since the widths of the first air gap 40 and the second air gap 41 are quite small, the silicon oxide is not deposited to the bottom (or the lower) portions of the first air gap 40 and the second air gap 41.

The first capping layer 44A and the second capping layer 44B may prevent the first air gap 40 and the second air gap 41 from being attacked or lost through a subsequent process. The size of individual air gaps (i.e., the first air gap 40 or the second air gap 41) may decrease due to the first capping layer 44A and the second capping layer 44B. However, the total size of the double air gap, which is disposed between the bit lines 26 and the second plug 39, can be maintained in a large size because the double air gap is wider compared to a single air gap. In a comparative example which employs a single air gap, the size of the single air gap, which is formed of the first air gap 40 alone or the second air gap 41 alone, is smaller in width compared to the embodiment. Thus, parasitic capacitance may not be effectively prevented.

Referring to FIGS. 3P, 4P and 5P, an ohmic contact layer 45 is formed over the second plug 39. The ohmic contact layer 45 may be formed through a silicide process. The ohmic contact layer 45 may include metal silicide. The ohmic contact layer 45 may include cobalt silicide. In an embodiment, the ohmic contact layer 45 may include $CoSi_2$ (cobalt silicide). When the $CoSi_2$ (cobalt silicide) is formed as the ohmic contact layer 45, contact resistance between the second plug 39 and the third plug 46 may be reduced.

The third plug 46 is formed over the ohmic contact layer 45. A fourth conductive layer (not shown) is formed over the ohmic contact layer 45 and is subject to a gap-fill process and a planarization process to form the third plug 46. The third plug 46 is formed filling the second opening 37 over the ohmic contact layer 45. The third plug 46 may include a metal-containing layer. The third plug 46 may include a tungsten-containing material. The third plug 46 may include a tungsten layer or a tungsten compound.

The third plug 46 may have an extension part partially overlapping with the bit line structure.

A memory element 47 may be formed over the third plug 46.

In accordance with an embodiment, the first double air gap DA1 is formed between the second plug 39 and the bit lines 26. The second double air gap DA2 is formed between the first plug 25 and the second plug 39. In addition, the fourth double air gap DA3 extends from over a sidewall of the bit lines 26 to over a sidewall of the first plug 25. Consequently, parasitic capacitance between the second plug 39 and the bit lines 26 may be reduced, and simultaneously parasitic capacitance between the first plug 25 and the second plug 39 may be reduced. Since parasitic capacitance is reduced, the sensing ability of memory cells may be improved.

FIGS. 6A to 6E are cross-sectional views illustrating a method for fabricating a semiconductor device in accordance with a second embodiment. The method up to the step where a second plug 39 is formed may be the same as the method shown in the first embodiment. However, the method for forming a double air gap is different from the method shown in the first embodiment. The methods for forming up to the second plug 39 are described above with reference to FIGS. 4A to 4M and detailed descriptions of the preceding processes are omitted.

Figure 6A:
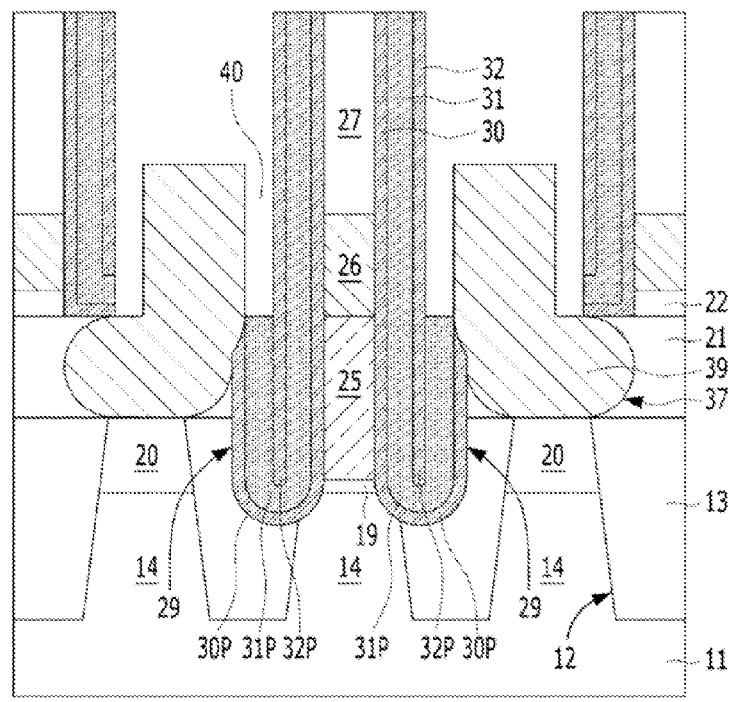
FIGS. 6A to 6E are cross-sectional views illustrating a method for fabricating a semiconductor device in accordance with a second embodiment.

Referring to FIG. 6A, a second sacrificial spacer 38 is removed after the second plug 39 is formed. Consequently, a first air gap 40 is formed. Chemicals capable of selectively eliminating titanium nitride are used to remove the second sacrificial spacer 38. While the second sacrificial spacer 38 is removed, a first sacrificial spacer 31 may not be removed, and will remain. A first air gap 40 may be in a ring shape. The first air gap 40 is disposed between a second spacer 32 and the second plug 39 and surrounds sidewalls of the second plug 39.

Figure 6B:
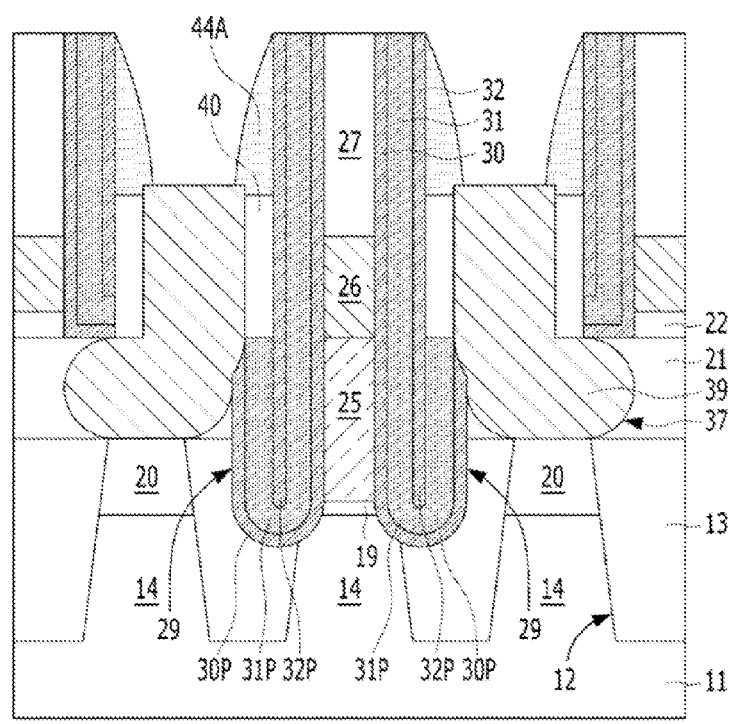

Referring to FIG. 6B, a first capping layer 44A is formed. The first capping layer 44A caps the first air gap 40. The first capping layer 44A may include silicon nitride or a mixture of silicon oxide and silicon nitride. An etch-back process may be carried out after the silicon nitride is deposited over the structure so that a top portion of the first air gap 40 is filled with silicon nitride. The silicon nitride capping the top portion of the first air gap 40 forms the first capping layer 44A. The silicon nitride may be deposited using material with poor step coverage in order to selectively fill the top portion, only, of the first air gap 40. For example, the silicon nitride may be deposited through a Plasma Enhanced Chemical Vapor Deposition (PECVD) process.

Figure 6C:
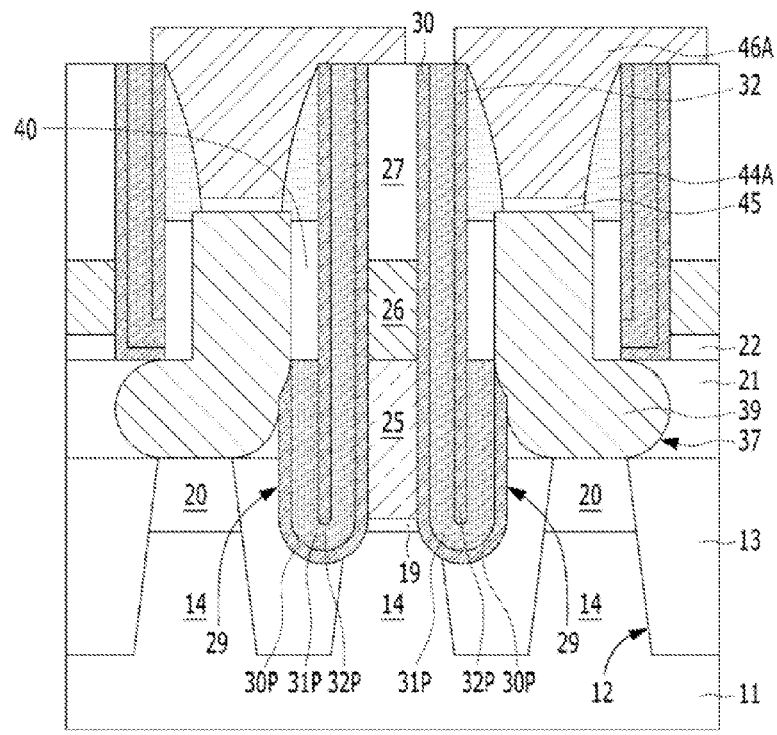

Referring to FIG. 6C, an ohmic contact layer 45 is formed over the second plug 39. The ohmic contact layer 45 may include metal silicide. The ohmic contact layer 45 may be formed through a silicide process. The ohmic contact layer 45 may include cobalt silicide.

A third plug 46A is formed over the ohmic contact layer 45. The third plug 46A may expose an upper portion of the first sacrificial spacer 31, different from the first embodiment. See FIGS. 6F and 6G.

Figure 6D:
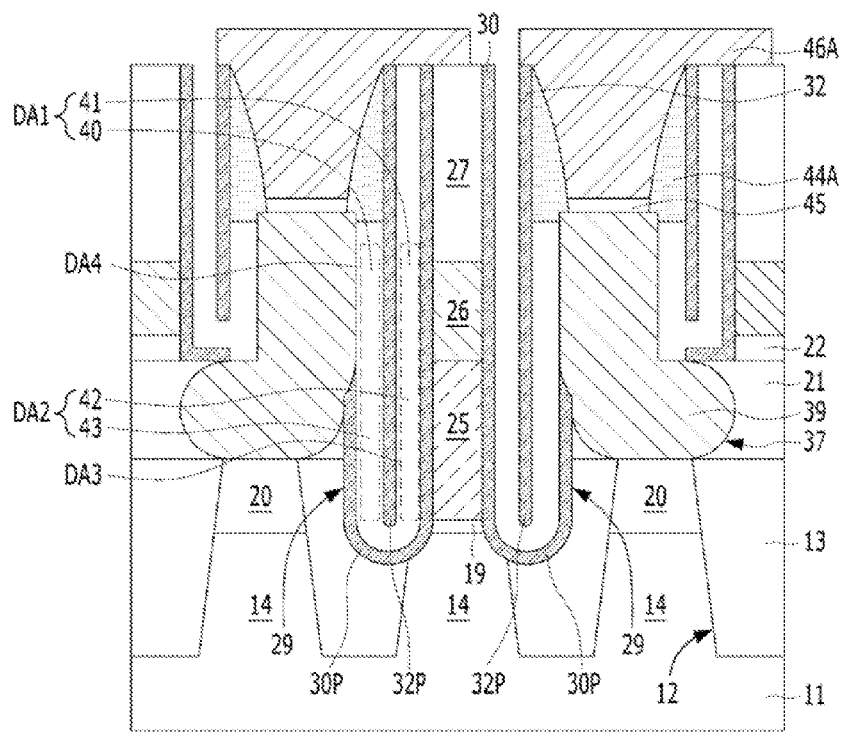

Referring to FIG. 6D, the first sacrificial spacer 31 and a sacrificial lining layer 31P are removed. The first sacrificial spacer 31 and the sacrificial lining layer 31P under the third plug 46A are also removed. Consequently, a second air gap 41, a third air gap 42, and a fourth air gap 43 are formed. The first air gap 40 and the first air gap 41 are a first double air gap DA1. The third air gap 42 and the fourth air gap 43 are a second double air gap DA2. The second air gap 41 and the third air gap 42 are referred to as a third double air gap DA3.

The first air gap 40 and the fourth air gap 43 are referred to as a fourth double air gap DA4.

A wet etch process may be carried out to remove the first sacrificial spacer 31 and the sacrificial lining layer 31P. For example, chemicals capable of selectively etching a silicon oxide are used.

As described above, the second air gap 41, the third air gap 42, and the fourth air gap 43 may be formed in an in-situ process. Therefore, the formation process may be simplified.

Figure 6E:
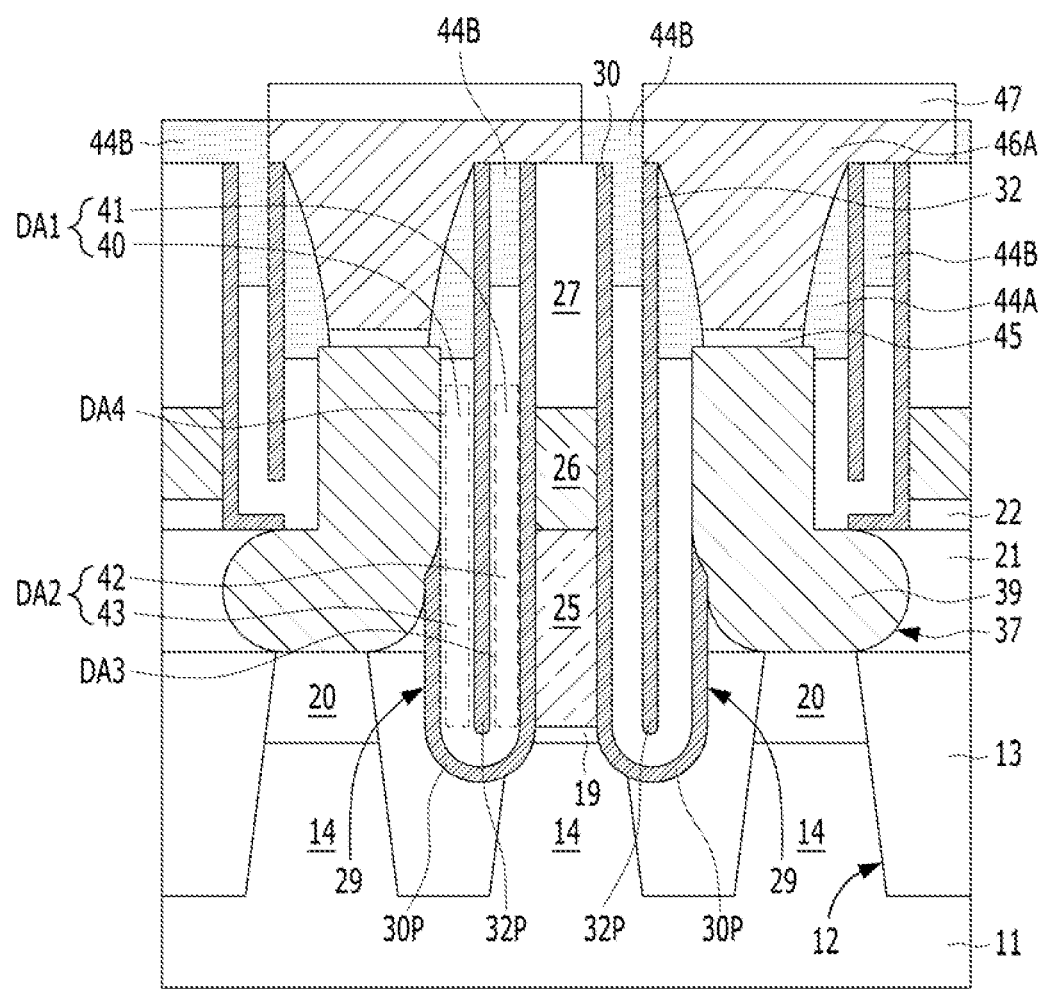

Referring to FIG. 6E, a second capping layer 44B is formed. The second capping layer 44B caps the second air gap 41. As described above, a portion of the second air gap 41 is capped with the third plug 46A, and the remainder of the second air gap 41 is capped with the second capping layer 44B. The second capping layer 44B may include silicon oxide, silicon nitride or a combination thereof. A bottom (or a lower) portion of the second air gap 41 may be deep enough to sufficiently secure an air gap under the second capping layer 44B. Silicon nitride may be deposited over the third plug 46A in order to form the second capping layer 44B. Since a width of the second air gap 41 is quite small, the silicon nitride is not deposited deep down to the bottom portion of the second air gap 41. Different from the first embodiment, the second capping layer 44B may fill the space between the neighboring third plugs 46A, exposing a surface of the third plug 46A.

A memory element 47 is coupled to the third plug 46A. The memory element 47 may be formed over the third plug 46A.

The first air gap 40 is formed through a pre-air gap forming process, and the second air gap 41, the third air gap 42 and the fourth air gap 43 are formed through a post-air gap forming process.

The pre-air gap forming process may indicate a process which is performed before the third plug 46A is formed. The post-air gap forming process may refer to a process which is performed after the third plug 46A is formed.

Figure 6F:
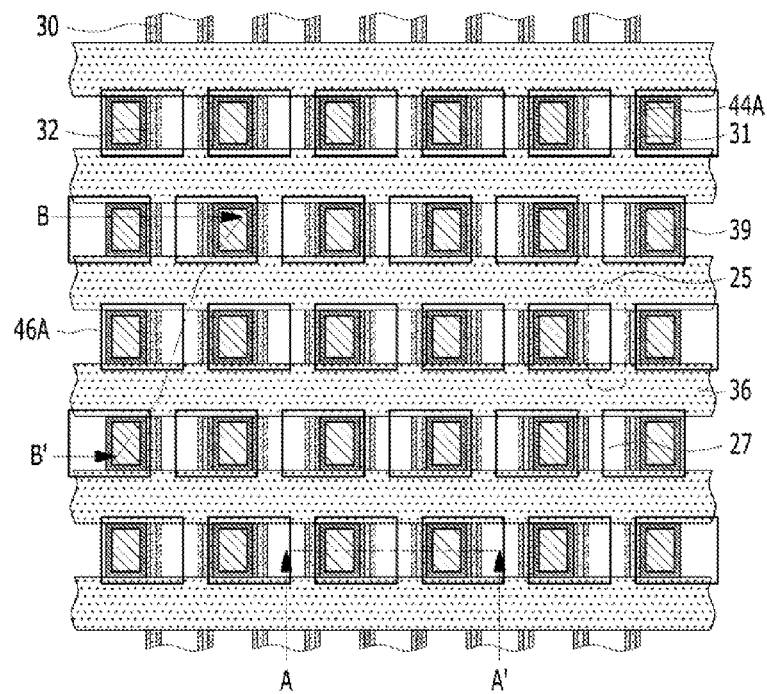
FIGS. 6F and 6G are plan views illustrating a method for forming a second air gap in accordance with an embodiment.
Figure 6G:
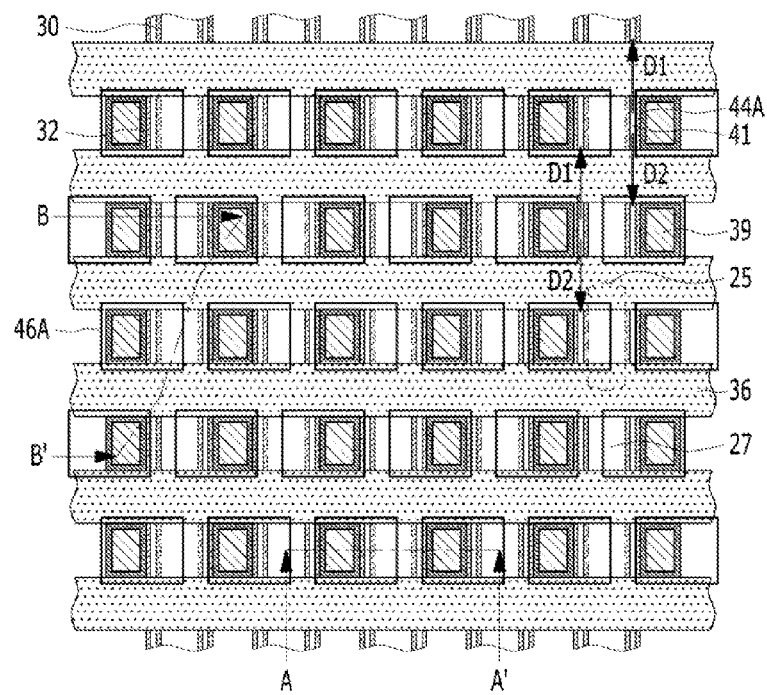

FIGS. 6F and 6G are plan views illustrating a method for forming the second air gap in accordance with the second embodiment.

Referring to FIG. 6F, the third plug 46A partially overlaps the second plug 39 and the bit line structure. Consequently, the first sacrificial spacer 31 is exposed.

Referring to FIG. 6G, the second air gap 41 of a line shape is formed when the first sacrificial spacer 31 is removed. Chemicals flow in a first direction D1 and a second direction D2 so that the first sacrificial spacer 31 located under the third plug 46A may be removed.

FIGS. 7A to 7J are cross-sectional views illustrating a method for fabricating a semiconductor device in accordance with a third embodiment. The method up to the step where a gap 29 is formed may be the same as the method shown in the first embodiment. The method up to the step where the gap 29 is formed are described above with reference to FIGS. 4A to 4E, and a detailed description up to that point will be omitted.

Figure 7A:
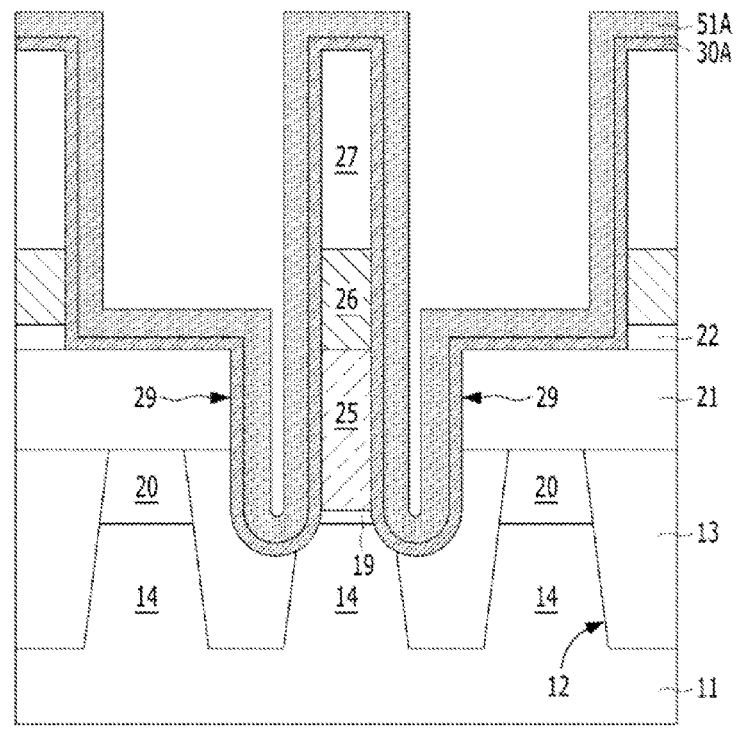
FIGS. 7A to 7J are cross-sectional views illustrating a method for fabricating a semiconductor device in accordance with a third embodiment.

Referring to FIG. 7A, a first spacer layer 30A is formed over the structure including the gap 29. The first spacer layer 30A is formed over a substrate 11 including a bit line structure. The first spacer layer 30A may include a silicon nitride. The first spacer layer 30A does not fill the gap 29 and is conformally formed.

A first sacrificial spacer layer 51A is formed over the first spacer layer 30A. The first sacrificial spacer layer 51A may include a silicon oxide. The first sacrificial spacer layer 51A does not fill the gap 29 and is conformally formed over the first spacer layer 30A.

Figure 7B:
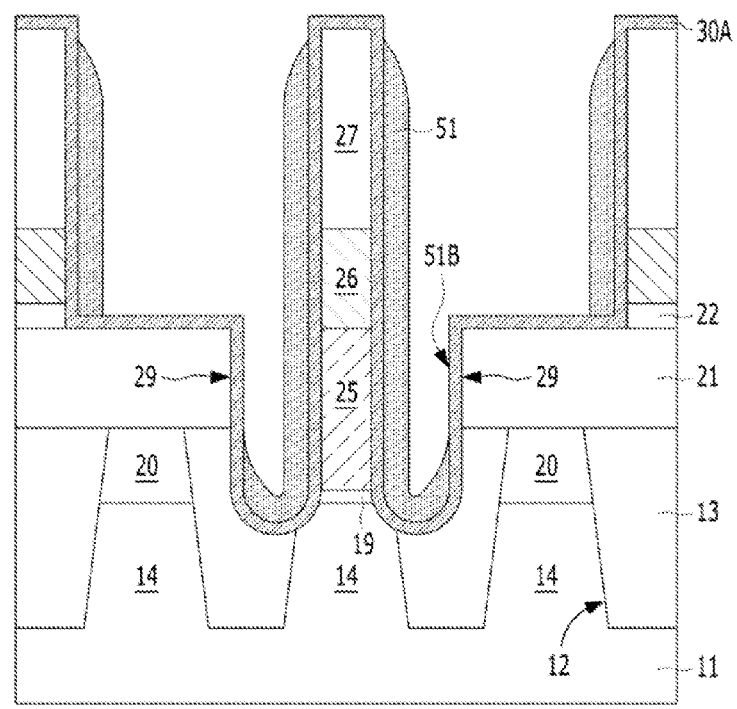

Referring to FIG. 7B, a first sacrificial spacer 51 is formed. The first sacrificial spacer 51 is formed by recessing the first sacrificial spacer layer 51A. The recessing process of the first sacrificial spacer 51 may include an etch-back process. The first sacrificial spacer 51 is formed over the first spacer layer 30A which is formed on sidewalls of a first plug 25. A bottom portion of the first sacrificial spacer 51 may extend inside the gap 29. Put differently, the first sacrificial spacer 51 may extend down into the gap 29. The first sacrificial spacer layer 51A over an inter-layer dielectric layer 21 is removed. The bottom portion of the first sacrificial spacer 51 is at a level lower than a top of the gap 29. The first sacrificial spacer 51 may be disposed on both sidewalls of the bit line structure. As a result, the first sacrificial spacer 51 extends from both sidewalls of the first plug 25 to both sidewalls of the bit line structure. Part of sidewalls of the gap 29 may be exposed without being covered by the first sacrificial spacer 51, which is referred to as a recessed gap 51B.

Figure 7C:
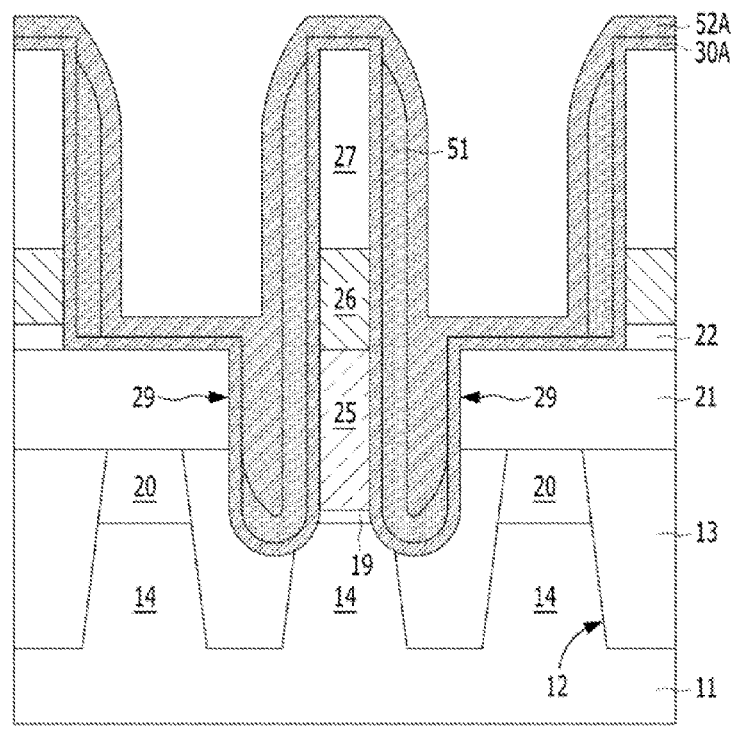

Referring to FIG. 7C, a second spacer layer 52A is formed over the first sacrificial spacer 51 and the first spacer layer 30A. The second spacer layer 52A is formed over the structure including the first sacrificial spacer 51. Particularly, the second spacer layer 52A may fill the recessed gap 51B. The second spacer layer 52A may include silicon nitride.

Subsequently, although not illustrated in the drawing, a process for forming a sacrificial layer, a preliminary isolation part, a sacrificial pattern, and a plug isolation layer may be carried out as described with reference to FIGS. 4G to 4I.

Figure 7D:
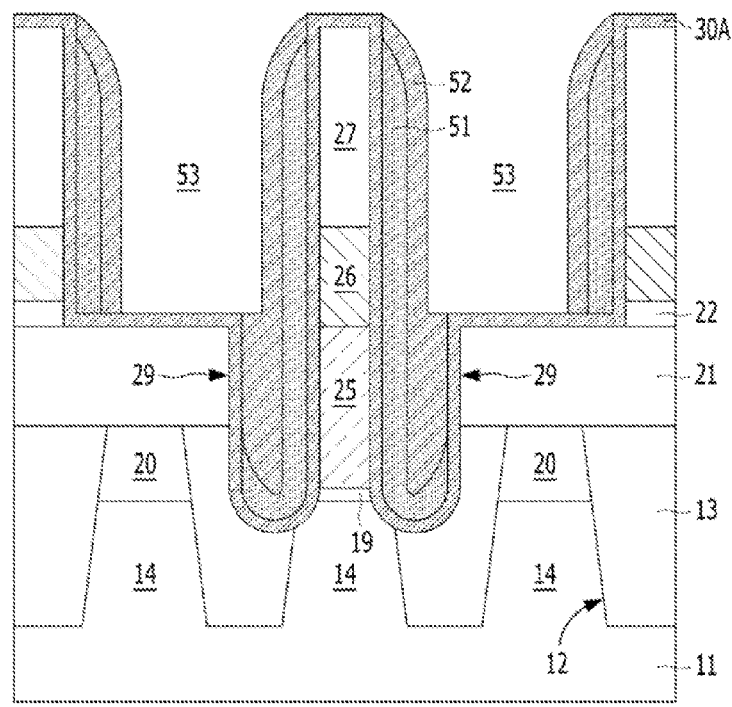

Referring to FIG. 7D, a second opening 53 is formed. The second opening 53 may be formed between the bit line structures. When viewed from the top, the second opening 53 may have a quadrangular hole shape. The second opening 53 may be disposed on both sides of the bit line structure.

While the second opening 53 is formed, the second spacer layer 52A over the first spacer layer 30A may be removed. Consequently, a second spacer 52 may be formed. The second spacer 52 may cover the first sacrificial spacer 51.

Figure 7E:
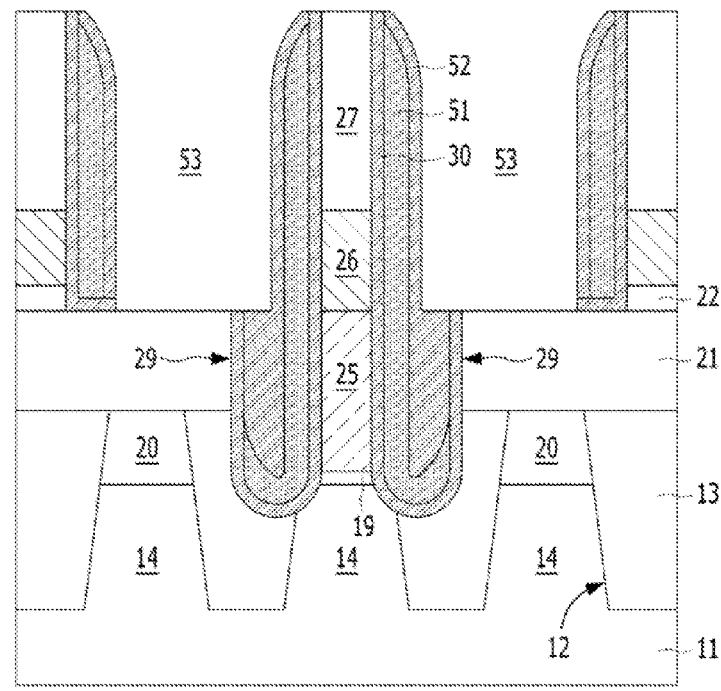

Referring to FIG. 7E, a process for extending sides of the second opening 53 may be carried out. For example, the second spacer 52 may be trimmed. When a trimming process is carried out, an open area of the second opening 53 may be sufficiently secured.

The second spacer layer 52A and the first spacer layer 30A over the inter-layer dielectric layer 21 may be removed through the trimming process. Consequently, a first spacer 30 may be formed.

Figure 7F:
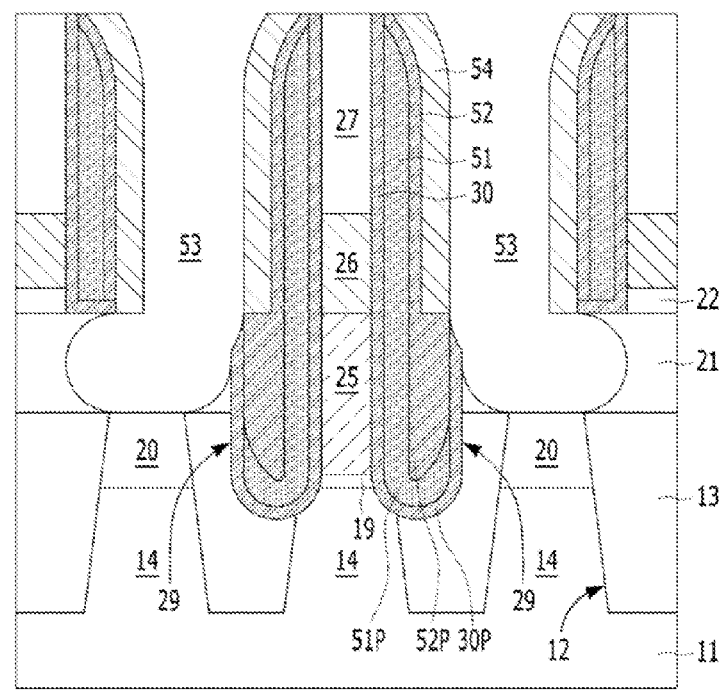

Referring to FIG. 7F, a second sacrificial spacer 54 is formed. The second sacrificial spacer 54 is formed on sidewalls of the second opening 53. When viewed from the top, the second sacrificial spacer 54 is formed to surround the sidewalls of the second opening 53. A method for forming the second sacrificial spacer 54 is described above with reference to FIGS. 4K and 4L.

Subsequently, the bottom portion of the second opening 53 expands vertically and laterally. To this end, the inter-layer dielectric layer 21 is etched using the second sacrificial spacer 54 as an etch mask. The inter-layer dielectric layer 21 may be etched through a dry etch process. For example, the inter-layer dielectric layer 21 may be etched through an isotropic etch process. Consequently, a second impurity region 20 is exposed below the second opening 53. Subsequently, portions of the second impurity region 20 and an isolation layer 13 may be recessed to a predetermined depth. The bottom surface of the second opening 53 may have a V-shape profile due to an etch selectivity difference. Also, the bottom portion of the second opening 53 may have a bulb shape through the isotropic etch process. The isotropic etch process may be controlled so that the sidewalls of the first plug 25 are not exposed by the bottom portion of the second opening 53.

As the second opening 53 expands, a dielectric spacer may be formed on the sidewalls of the first plug 25 and the bit lines 26. The dielectric spacer may include the first spacer 30, the second spacer 52, and the second sacrificial spacer 54. The first spacer 30, the first sacrificial spacer 51, and the second spacer 52 have a line shape and extend in parallel to the sidewalls of the bit lines 26. The second sacrificial spacer 54 has surrounds the sidewalls of the second opening 53. The bottom portion of the second sacrificial spacer 54 is not disposed on the sidewalls of the first plug 25. A portion of the dielectric spacer may extend to a level where the sidewalls of the first plug 25 are located. The first spacer 30, the first sacrificial spacer 51, and the second spacer 52 may be formed on the sidewalls of the first plug 25. The first spacer 30, the first sacrificial spacer 51, and the second spacer 52 may extend to fill the gap 29. An extended part of the first spacer 30 is referred to as a lining layer 30P. An extended part of the first sacrificial spacer 51 is referred to as a sacrificial lining layer 51P. An extended part of the second spacer 52 is referred to as a pillar 52P. The sacrificial lining layer 51P may be sandwiched by the pillar 52P. In the third embodiment, different from what is shown in the first and second embodiments, ends of the sacrificial lining layer 51P may be enclosed by the pillar 52P and the lining layer 30P. In other words, the bottom portion of the pillar 52P covers the end of one side of the sacrificial lining layer 51P. Since the pillar 52P contacts the lining layer 30P, structural stability may increase. In other words, the second spacer 52 and the pillar 52P may be prevented from being lifted in a subsequent process.

The first spacer 30, the second spacer 52, the lining layer 30P and the pillar 52P may include silicon nitride. The first sacrificial spacer 51 and the sacrificial lining layer 51P may include silicon oxide. The second sacrificial spacer 54 may include titanium nitride. Therefore, a dielectric spacer of Nitride-Oxide-Nitride-TiN (N—O—N—TiN) may be formed on the sidewalls of the bit lines 26. A dielectric spacer of Nitride-Oxide-Nitride-Nitride (N—O—N—N) may be formed on the sidewalls of the first plug 25.

Figure 7G:
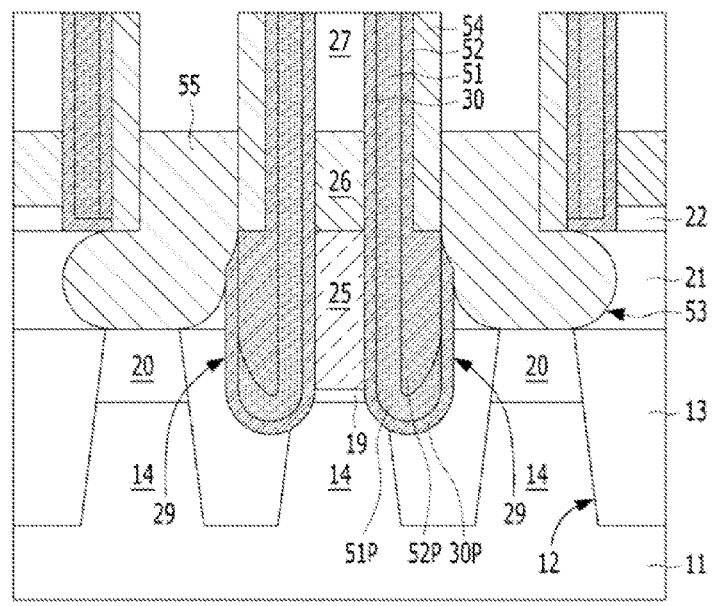

Referring to FIG. 7G, a second plug 55 is formed. The second plug 55 is recessed and formed inside the second opening 53. In order to form the second plug 55, a planarization process and an etch-back process may be sequentially carried out after a polysilicon layer is deposited. During the planarization process, a bit line hard mask 27 and peripheral materials may be planarized. Consequently, the top portion of the first sacrificial spacer 51 may be exposed.

Figure 7H:
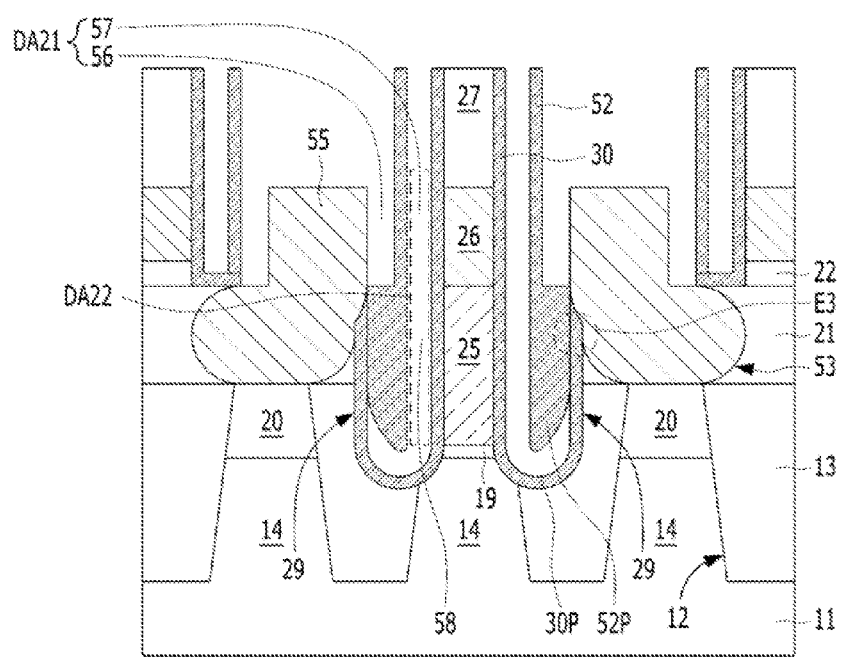

Referring to FIG. 7H, the second sacrificial spacer 54 is removed. Subsequently, a first air gap 56 is formed. A wet etch process may be carried out to remove the second sacrificial spacer 54. For example, a mixture of sulfuric acid ($H_2SO_4$) and hydrogen peroxide ($H_2O_2$) capable of selectively eliminating a titanium nitride may be used.

The first sacrificial spacer 51 and the sacrificial lining layer 51P are removed. Consequently, a second air gap 57 is formed. The second air gap 57 may be formed between the bit lines 26 and the second plug 55 and extended to between the first plug 25 and the second plug 55. For the sake of convenience, the extended part of the second air gap 57, i.e., the second air gap 57 formed between the first plug 25 and the second plug 55 is referred to as a third air gap 58. Since the sacrificial lining layer 51P and the first sacrificial spacer 51 are formed of the same material, the second air gap 57 and the third air gap 58 may be formed in-situ. As a result, the formation process may be simplified.

A wet etch process may be carried out to remove the first sacrificial spacer 51 and the sacrificial lining layer 51P. For example, a Buffered Oxide Etchant (BOE) capable of selectively eliminating a silicon oxide may be used. The BOE may include a mixture of ammonium fluoride ($NH_4F$) and hydrogen fluoride (HF).

The first air gap 56 and the second air gap 57 may form a first double air gap DA21. The third air gap 58 may be a single air gap.

The first double air gap DA21 may be disposed between the bit lines 26 and the second plug 55. The first air gap 56 has a ring shape surrounding the second plug 55, and the second air gap 57 has a line shape. The second air gap 57 is extended in parallel to the sidewalls of the bit lines 26. The second air gap 57 is disposed between the first spacer 30 and the second spacer 52. The first air gap 56 is disposed between the second spacer 52 and the second plug 55. The first air gap 56 surrounds sidewalls of the second plug 55. The first air gap 56 and the second air gap 57 may be separated from each other by the second spacer 52.

The third air gap 58, which is the single air gap, is disposed inside the gap 29 and between the first plug 25 and the second plug 55. The lining layer 30P may be formed on the bottom surface and sidewalls of the gap 29. The pillar 52P may partially fill the center of the gap 29 and some regions of the gap 29 disposed adjacent to the second plug 55. As shown by the reference numeral E3, the pillar 52P and the lining layer 30P may contact each other without a gap; Therefore, structural stability of the pillar 52P increases. A third air gap 58 is disposed between the first plug 25 and the pillar 52P. The third air gap 58 may extend from the second air gap 57.

As described above, the first plug 25 and the bit lines 26 may be disposed adjacent to the second plug 55 with a dielectric spacer between them. The first air gap 56, the second air gap 57 and the third air gap 58 may be included in the dielectric spacer. The dielectric spacer may include a spacer structure and a dielectric plug. The dielectric plug may be continuous from the spacer structure. The spacer structure may be disposed between the bit lines 26 and the second plug 55. The spacer structure includes the first spacer 30, the second spacer 52, and the first double air gap DA21. Since the first spacer 30 and the second spacer 52 include a silicon nitride, the spacer structure may be of a Nitride-Air1-Nitride-Air2 (NANA) structure. The first air gap 56 and the second air gap 57 may be included in the spacer structure. As the first double air gap DA21 of the first air gap 56 and the second air gap 57 is formed, the air gap may be formed to have a sufficiently large size. Thus, parasitic capacitance between the bit lines 26 and the second plug 55 may be significantly reduced.

The dielectric plug is formed between the first plug 25 and the second plug 55. The dielectric plug includes the lining layer 30P, the pillar 52P and the third air gap 58. Since the lining layer 30P and the pillar 52P include silicon nitride, the dielectric plug has a Nitride-Air3-Nitride-Nitride (NANN) structure. The third air gap 58 may be included in the dielectric plug.

The second air gap 57 and the third air gap 58 may be disposed in a vertical direction. For example, the third air gap 58 extends from the second air gap 57. The second air gap 57 and the third air gap 58 may form a second double air gap DA22. The first double air gap DA21 and the second double air gap DA22 may be coupled with each other.

As the second double air gap DA22 is formed, parasitic capacitance between the bit lines 26 and the second plug 55 may be greatly reduced.

Since the first air gap 56, the second air gap 57 and the third air gap 58 are formed before a third plug 61 is formed, the third embodiment may be referred to as a pre-air gap forming process.

Figure 7I:
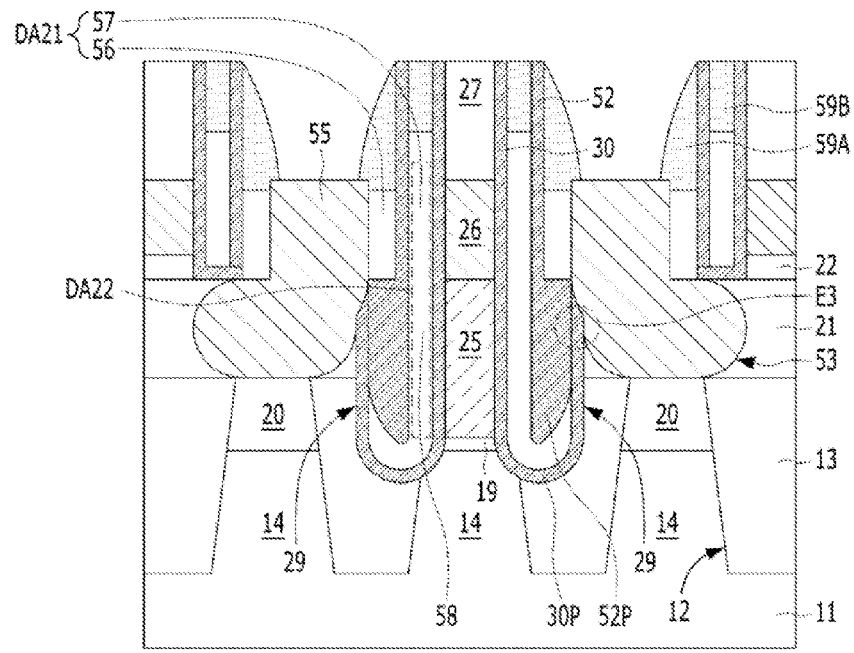

Referring to FIG. 7I, capping layers 59A and 59B are formed. The capping layers 59A and 59B fill the top portion of the first double air gap DA21. The first capping layer 59A caps the first air gap 56. The second capping layer 59B caps the second air gap 57. The first capping layer 59A and the second capping layer 59B may be formed of dielectric material. For example, the first capping layer 59A and the second capping layer 59B may be formed of silicon oxide. The silicon oxide may be formed through an oxidation process, a deposition process, or a combination thereof. For example, after first silicon oxide is formed through a plasma oxidation process, second silicon oxide may be formed through a Chemical Vapor Deposition (CVD) process. In another embodiment, the first capping layer 59A and the second capping layer 59B may include silicon nitride or a mixture of silicon oxide and silicon nitride. The first capping layer 59A and the second capping layer 59B may have such thicknesses that the first air gap 56 and the second air gap 57 can maintain sufficient lengths.

The first capping layer 59A and the second capping layer 59B may prevent the first air gap 56 and the second air gap 57 from being lost through a subsequent process. The size of individual air gaps (i.e., the first air gap 56 or the second air gap 57) may decrease due to the first capping layer 59A and the second capping layer 59B. However, the total size of the air gap disposed between the bit lines 26 and the second plug 55 can be formed large because a width of the first double air gap DA21, which includes the first air gap 56 and the second air gap 57, is increased compared to a single air gap.

Figure 7J:
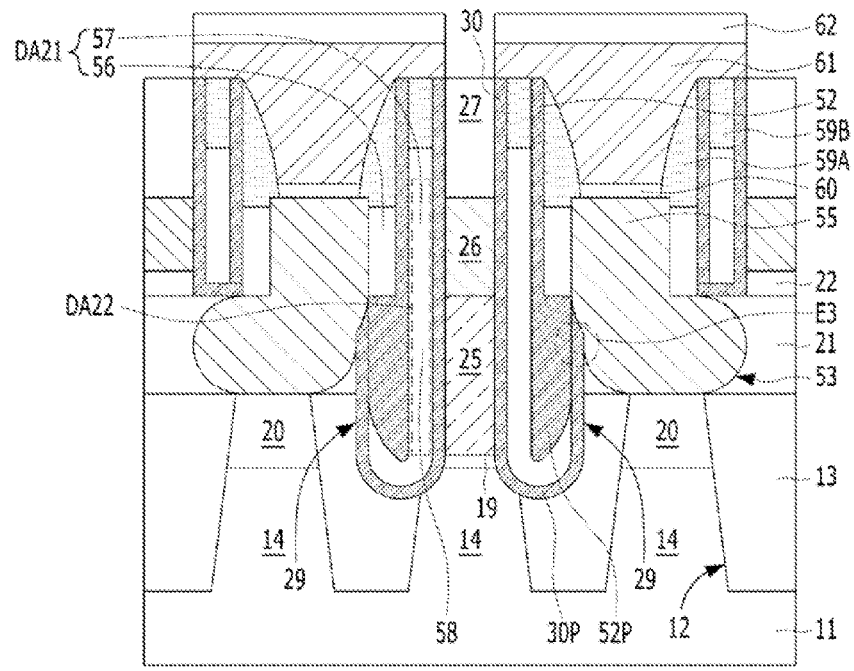

Referring to FIG. 7J, an ohmic contact layer 60 is formed over the second plug 55. The ohmic contact layer 60 may be formed through a silicide process. The ohmic contact layer 60 may include metal silicide. The ohmic contact layer 60 may include cobalt silicide. In an embodiment, the ohmic contact layer 60 may include $CoSi_2$ (cobalt silicide).

The third plug 61 is formed over the ohmic contact layer 60. The third plug 61 is formed by filling the second opening 53 and is formed over the ohmic contact layer 60. The third plug 61 may include a metal-containing layer. The third plug 61 may include tungsten-containing material. The third plug 61 may include a tungsten layer or a tungsten compound.

The third plug 61 may have an extension part which extends over the bit line structure.

A memory element 62 may be formed over the third plug 61.

Figure 7K:
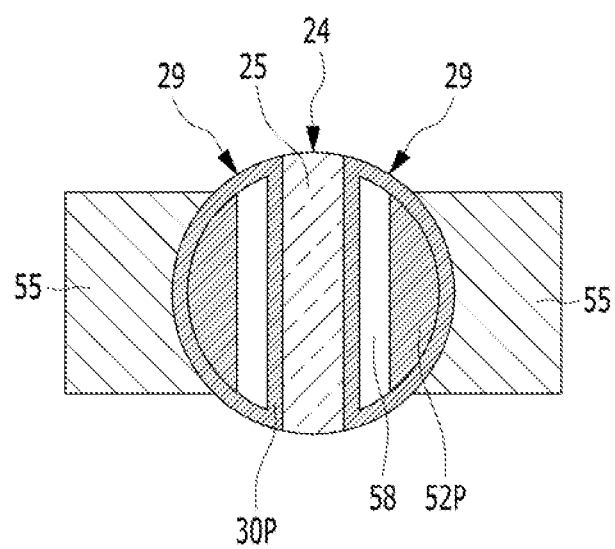
FIG. 7K is a plan view illustrating a single air gap in accordance with an embodiment.

FIG. 7K is a plan view illustrating the single air gap in accordance with the third embodiment.

Referring to FIG. 7K, the first plug 25 may have a smaller line width than a width (or a diameter) of a first opening 24. The gap 29 is formed on both sides of the first plug 25. The gap 29 is not formed to surround the first plug 25 but is formed on both sides of the first plug 25. One first plug 25 and a pair of gaps 29 are disposed in the first opening 24, and the gaps 29 are separated from each other by the first plug 25. The gap 29 may be disposed between the first plug 25 and the second plug 55.

The lining layer 30P, the third air gap 58, and the pillar 52P may collectively form a dielectric plug. The lining layer 30P covers the bottom surface and sidewalls of the gap 29. The pillar 52P may fill a portion of the gap 29. For example, the pillar 52P may fill the center of the gap 29 and extend to a sidewall of the gap 29 disposed adjacent to the second plug 55. The pillar 52P and the lining layer 30P may be coupled with each other without a gap like the third air gap 58, which is formed between the pillar 52P and the second plug 55. As a result, the third air gap 58 is disposed between the first plug 25 and the pillar 52P.

FIGS. 8A to 8E are plan views illustrating a method for fabricating a semiconductor device in accordance with a fourth embodiment. The processes up to the step where the second plug 55 is formed may be the same as the method shown in the third embodiment. However, a method for forming a double air gap is different from the method shown in the third embodiment. The processes up to the step where the second plug 55 is formed are described above with reference to FIGS. 4A to 4M and 7A to 7G.

Figure 8A:
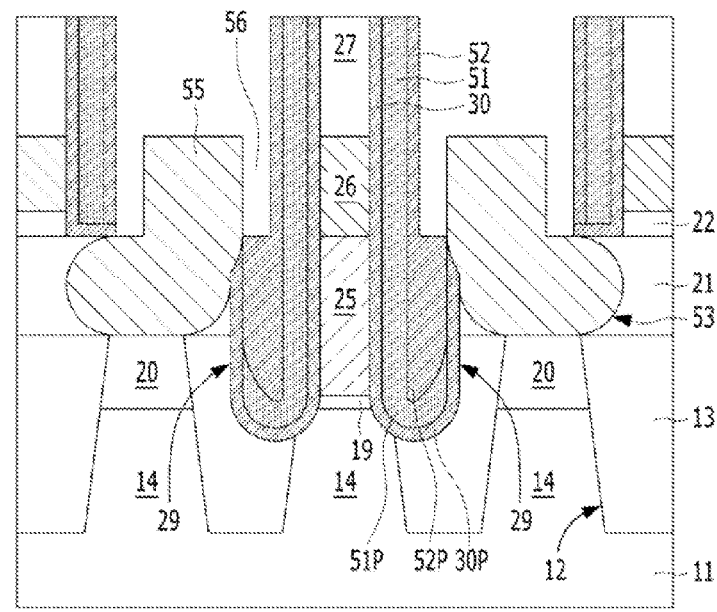
FIGS. 8A to 8E are plan views illustrating a method for fabricating a semiconductor device in accordance with a fourth embodiment.

Referring to FIG. 8A, a second sacrificial spacer 54 is removed after a second plug 55 is formed. Consequently, a first air gap 56 is formed. Chemicals capable of selectively eliminating a titanium nitride are used in order to remove the second sacrificial spacer 54. While the second sacrificial spacer 54 is formed, a first sacrificial spacer 51 may remain. The first air gap 56 has a ring shape surrounding the second plug 55. The first air gap 56 is disposed between a second spacer 52 and the second plug 55. The first air gap 56 is formed to surround sidewalls of the second plug 55.

Figure 8B:
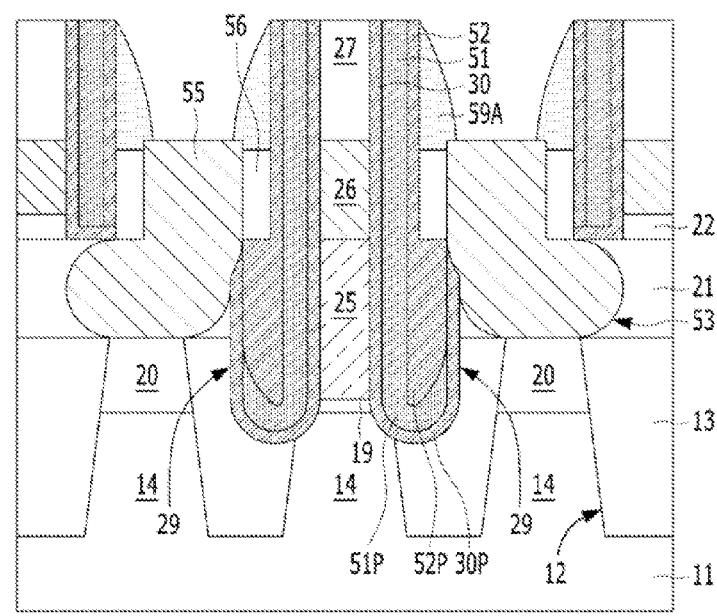

Referring to FIG. 8B, a first capping layer 59A is formed. The first capping layer 59A caps the first air gap 56 between the second spacer 52 and the second plug 55.

Figure 8C:
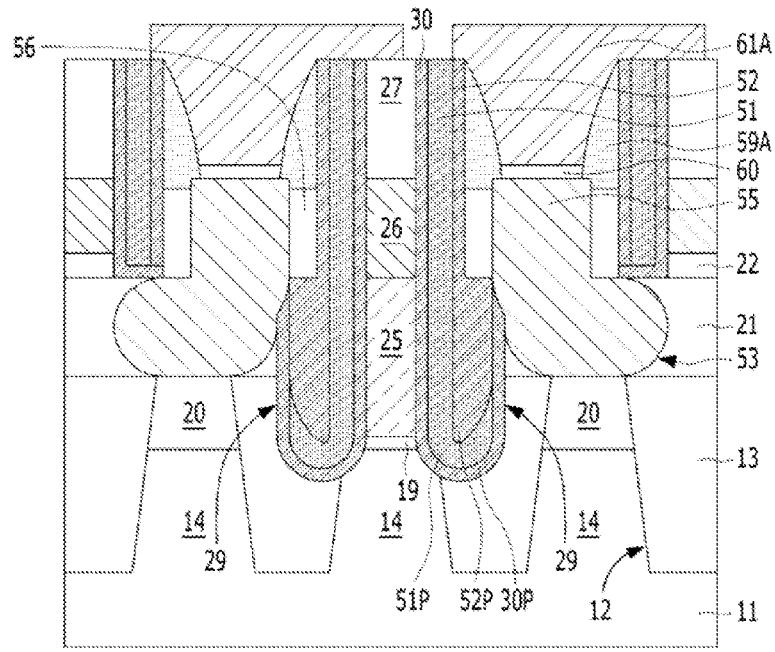

Referring to FIG. 8C, an ohmic contact layer 60 is formed over the second plug 55. A third plug 61A is formed over the ohmic contact layer 60. The third plug 61A may have an extension part partially overlapping with a bit line structure. Put differently, the extension part extends over the bit line structure. Similar to the second embodiment, the third plug 61A may have a shape exposing an upper portion of the first sacrificial spacer 51 over a first sidewall of the bit line 26 while covering the first sacrificial spacer 51 over a second sidewall of the bit line 26. See FIGS. 6F and 6G.

Figure 8D:
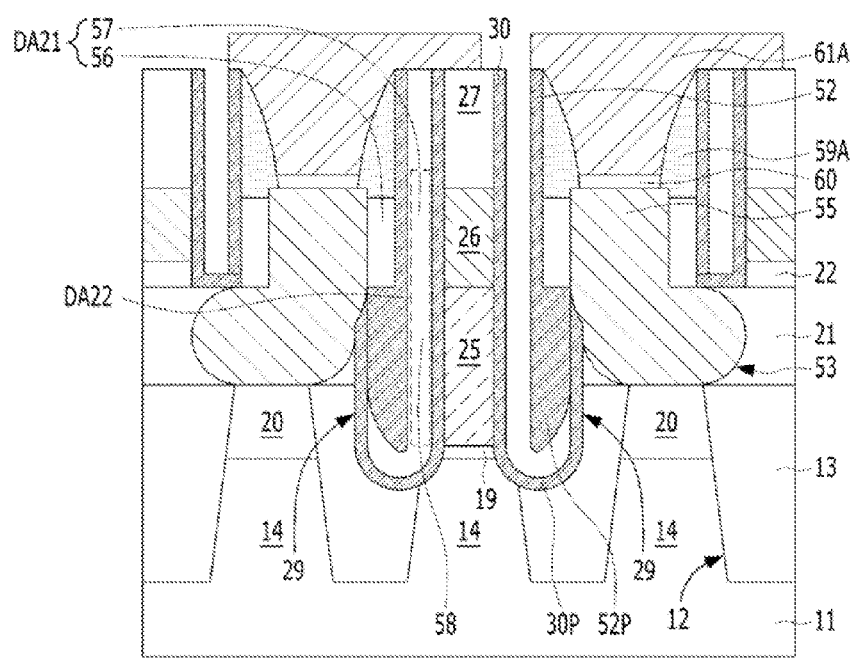

Referring to FIG. 8D, the first sacrificial spacer 51 is removed. A second air gap 57 and a third air gap 58 are formed. The first air gap 56 and the second air gap 57 collectively form a double air gap DA21. A third air gap 58 is a single air gap and extends from the second air gap 57.

As described above, the second air gap 57 and the third air gap 58 may be formed in-situ. Therefore, the formation process may be simplified.

The double air gap DA21 may be disposed between bit lines 26 and the second plug 55. The second air gap 57 has a line shape, and the first air gap 56 has a ring shape. The second air gap 57 extends in parallel to the bit lines 26. The second air gap 57 is disposed between a first spacer 30 and the second spacer 52. The first air gap 56 is disposed between the second spacer 52 and the second plug 55. The first air gap 56 is formed to surround sidewalls of the second plug 55.

The third air gap 58 is disposed inside a gap 29. The second air gap 57 and the third air gap 58 are coupled with each other. For example, the third air gap 58 extends from the second air gap 57.

Figure 8E:
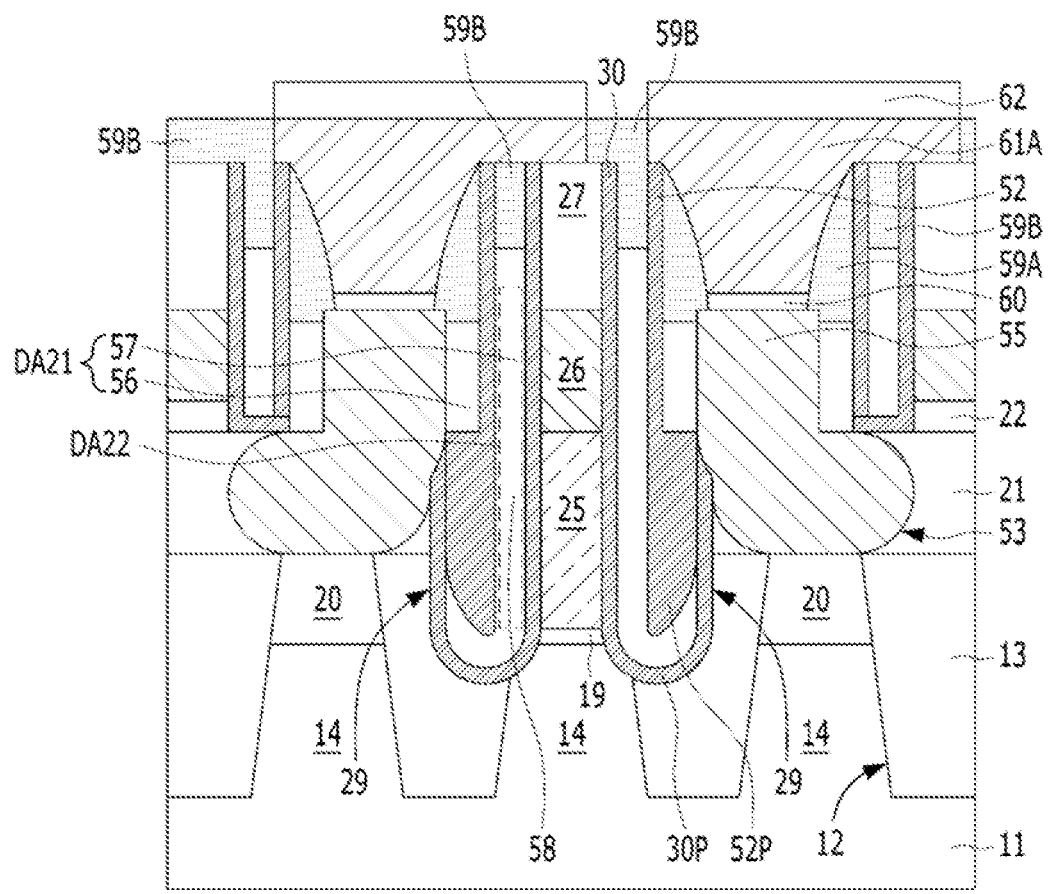

Referring to FIG. 8E, a second capping layer 59B is formed. The second capping layer 59B caps the first air gap 56. Different from what is shown in the third embodiment, the second capping layer 59B may fill the space between the neighboring third plugs 61A, exposing a surface of the third plug 61A.

A memory element 62 is formed over the third plug 61A.

As described above, in the fourth embodiment, the first air gap 56 is formed by removing the second sacrificial spacer 54, and the second air gap 57 and the third air gap 58 are formed by removing the first sacrificial spacer 51 after the third plug 61A is formed. The process for forming the first air gap 56 is referred to as a pre-air gap forming process, and the process for forming the second air gap 57 and the third air gap 58 is referred to as a post-air gap forming process.

The semiconductor device in accordance with an embodiment may be applied to a Dynamic Random Access Memory (DRAM) and a memory device such as a Static Random Access Memory (SRAM), a flash memory, a Ferroelectric Random Access Memory (FeRAM), a Magnetic Random Access Memory (MRAM) and a Phase Change Random Access Memory (PRAM).

For example, an embodiment may be applied to an electronic device including a semiconductor device having a structure where a plurality of conductive structures is disposed adjacent to each other. The semiconductor device may include a first conductive structure, a second conductive structure over the first conductive structure, a third conductive structure including the upper portion adjacent to the second conductive structure and the lower portion adjacent to the first conductive structure, a first double air gap disposed between the upper portion of the third conductive structure and the second conductive structure, and a second double air gap disposed between the lower portion of the third conductive structure and the first conductive structure.

In accordance with an embodiment, the size of air gaps may be large enough to insulate the bit line and the second plug by employing a double air gap between the bit line and the second plug.

In accordance with an embodiment, parasitic capacitance may decrease due to double air gaps that are parallel to each other and disposed between the bit line and the second plug. The double air gaps are disposed in a vertical direction.

Consequently, the operation speed of the semiconductor device may improve as parasitic capacitance decreases.

What is claimed is:

1. A semiconductor device, comprising:
    a first plug;
    a bit line coupled to the first plug, provided over the first plug, and extending in one direction;
    a first spacer over sidewalls of the bit line;
    a second plug including a first part adjacent to the bit line and a second part adjacent to the first plug;
    a second spacer disposed between the first spacer and the first part of the second plug, wherein the second spacer extends in parallel to the bit line;
    a pillar coupled with the second spacer;
    a first air gap and a second air gap which are disposed between the first part of the second plug and the bit line;
    a third air gap and a fourth air gap which are disposed between the second part of the second plug and the first plug; and
    a capping layer capping the first air gap and second air gap,
    wherein the first air gap and the second air gap are coupled to each other,
    wherein the second spacer is disposed between the first air gap and the second air gap, and
    wherein the pillar is disposed between the third air gap and the fourth air gap.

2. The semiconductor device of claim 1,
    wherein the third air gap is vertically coupled with the second air gap, and the fourth air gap is vertically coupled with the first air gap,
    wherein the first air gap, the second air gap, the third air gap and the fourth air gap are coupled to each other.

3. The semiconductor device of claim 1, wherein each of the first and the second spacers includes silicon nitride.

4. The semiconductor device of claim 1, wherein the first air gap is directly contacted with a sidewall of the first part of the second plug.

5. A semiconductor device, comprising:
    a substrate including a first region and a second region;
    a first plug which is coupled to the first region;
    a bit line provided over the first plug and coupled to the first plug;
    a first spacer over sidewalls of the bit line;
    a second plug including a first part adjacent to the bit line and a second part adjacent to the first plug, wherein the second plug is coupled with the second region;
    a second spacer disposed between the first spacer and the second part of the second plug, wherein the second spacer extends in parallel to the bit line;
    a first air gap and a second air gap which are disposed between the first part of the second plug and the bit line;
    a third air gap and a fourth air gap which are disposed between the second part of the second plug and the first plug;
    a pillar coupled with the second spacer;
    a lining layer coupled with the first spacer;
    a capping layer capping upper portions of the first and second air gaps;
    a third plug provided over the second plug; and
    a memory element provided over the third plug,
    wherein the first air gap, the second air gap, the third air gap and the fourth air gap are coupled to each other,
    wherein the second spacer is disposed between the first air gap and the second air gap, and
    wherein the pillar is disposed between the third air gap and the fourth air gap.

6. The semiconductor device of claim 5,
    wherein the first air gap is in a ring shape and surrounds the first part of the second plug, and
    wherein the second air gap is in a line shape and extends in parallel to the bit line.

7. The semiconductor device of claim 5, wherein the third air gap extends from the second air gap to form a continuum.

8. The semiconductor device of claim 5,
    wherein the third air gap is vertically coupled with the second air gap, and the fourth air gap is vertically coupled with the first air gap.

9. The semiconductor device of claim 5, wherein each of the first and the second spacers includes silicon nitride.

10. The semiconductor device of claim 5, further comprising:
    an inter-layer dielectric layer having a first opening exposing the first region of the substrate,
    wherein the first plug is disposed in the first opening and spaced apart from a sidewall of the first opening by a gap.

11. The semiconductor device of claim 10,
    wherein the lining layer covers the sidewall and a bottom surface of the gap;
    wherein the pillar is spaced apart from the lining layer and extends from between the first and the second air gaps to the center of the gap,
    wherein the first spacer extends in parallel to the bit line, and
    wherein the second spacer extends in parallel to the first spacer.

12. The semiconductor device of claim 5, wherein each of the lining layer, the pillar, the first spacer, and the second spacer includes silicon nitride.

13. The semiconductor device of claim 10, further comprising:
- a plug isolation layer provided over the inter-layer dielectric layer, and
- a second opening passing through the plug isolation layer and the inter-layer dielectric layer and having a second opening,
- wherein the second opening exposes the second region, and
- wherein the second plug is disposed in the second opening.

14. The semiconductor device of claim 5, further comprising:
- a buried word line buried in the substrate and extending in a direction crossing the bit line; and
- a first impurity region and a second impurity region formed in the substrate and adjacent to first and second sides of the buried word line, respectively,
- wherein the first impurity region is formed in the first region, and the second impurity region is formed in the second region.

15. The semiconductor device of claim 5, wherein the capping layer includes silicon oxide.

16. The semiconductor device of claim 5, wherein each of the first region and the second region has a recessed surface.

17. The semiconductor device of claim 5, wherein the first air gap is directly contacted with a sidewall of the first part of the second plug.

* * * * *